(12) United States Patent
Bose et al.

(10) Patent No.: US 11,349,482 B2
(45) Date of Patent: May 31, 2022

(54) INTEGRATED CIRCUIT FOR LOW-VOLTAGE THERMOELECTRIC ENERGY HARVESTING WITH SELF-START

(71) Applicant: Oregon State University, Corvallis, OR (US)

(72) Inventors: Soumya Bose, Corvallis, OR (US); Matthew Johnston, Corvallis, OR (US); Tejasvi Anand, Corvallis, OR (US)

(73) Assignee: Oregon State University, Corvallis, OR (US)

( * ) Notice: Subject to any disclaimer, the term of this patent is extended or adjusted under 35 U.S.C. 154(b) by 87 days.

(21) Appl. No.: 16/840,147

(22) Filed: Apr. 3, 2020

(65) Prior Publication Data

US 2020/0321862 A1 Oct. 8, 2020

Related U.S. Application Data

(60) Provisional application No. 62/830,168, filed on Apr. 5, 2019.

(51) Int. Cl.
*H02M 1/36* (2007.01)
*H03K 19/20* (2006.01)
(Continued)

(52) U.S. Cl.
CPC ............ *H03K 19/20* (2013.01); *H02M 1/36* (2013.01); *H02M 3/155* (2013.01); *H03K 3/0315* (2013.01)

(58) Field of Classification Search
CPC . H02M 3/155–1588; H02M 3/07–078; H02M 1/36
See application file for complete search history.

(56) References Cited

U.S. PATENT DOCUMENTS 6,028,755 A * 2/2000 Saeki ............... H02H 7/1213
361/91.1
9,391,626 B2 7/2016 Chern et al.
(Continued)

OTHER PUBLICATIONS http://idtechex.com/research/reports/thermoelectric-energy-harvesting-2018-2028-applications-markets-players-000582.asp [downloaded on Apr. 2, 2020].
(Continued)

*Primary Examiner* — Peter M Novak
(74) *Attorney, Agent, or Firm* — Mughal IP P.C.

(57) ABSTRACT

The integrated circuit (IC) described herein lowers the start-up voltage to, for example, 50 mV, compatible for starting a DC-DC converter from a thermoelectric generator (TEG), even with a small temperature gradient. The IC further improves end-to-end efficiency of the energy harvester by improving power efficiency of the DC-DC converter while ensuring maximum power transfer from the TEG at low voltages. The IC uses a low voltage integrated charge pump that can boost sub-100 mV input voltage. A startup clock is generated by a ring-oscillator that begins operation with low supply (e.g., 50 mV or less), and which allows for one inductor to be used for DC-DC converter and for startup of the converter. The IC can be configured between the TEG and any downstream sensor or communication circuits to provide an acceptable (e.g., greater than 1 V) voltage for powering the downstream circuits from a low-voltage (e.g., less than 200 mV) TEG energy source.

19 Claims, 36 Drawing Sheets

(51) Int. Cl.
  *H02M 3/155* (2006.01)
  *H03K 3/03* (2006.01)

(56) References Cited

U.S. PATENT DOCUMENTS

| | | | |
|---|---|---|---|
| 2012/0032658 A1* | 2/2012 | Casey | H02M 3/1582 323/271 |
| 2014/0211893 A1* | 7/2014 | Rasouli | H04L 7/0045 375/354 |
| 2017/0194948 A1 | 7/2017 | Luo et al. | |

OTHER PUBLICATIONS http://www.analog.com/en/technical-articles/frequently-asked-questions-thermoelectric-energy-harvesting-with-the-ltc3108-ltc3109.html [downloaded on Apr. 2, 2020].
http://www.europeanthermodynamics.com/news/adaptive2 Apr. 27, 2017 [downloaded on Apr. 2, 2020].
http://www.matrixindustries.com/en/energy-harvesting [downloaded on Apr. 2, 2020].
https://in.element14.com/enocean/ect-310/module-dc-dc-conv-for-stm30-312/dp/2134182 [downloaded on Apr. 2, 2020].
https://www.analog.com/en/products/ltc3588-1.html#product-overview [downloaded on Apr. 2, 2020].
https://www.tegmart.com/energy-harvesting/ [downloaded on Apr. 2, 2020].
https://www.tegnology.dk/p/about [downloaded on Apr. 2, 2020].
Marlow thermoelectric generator (TEG) module—TG12-2.5-01 LS. Marlow Industries, Inc. [Online]. Available: https://cdn2.hubspot.net/hubfs/547732/Data Sheets/TG12-2.5.pdf.
Bandyopadhyay, S. et al., "Platform architecture for solar, thermal, and vibration energy combining with mppt and single inductor", IEEE Journal of Solid-State Circuits, vol. 47, No. 9, pp. 2199-2215, Sep. 2012.
Blanco, A.A. et al., "On-chip starter circuit for switched-inductor DC-DC harvester systems", 2013 IEEE Interna-tional Symposium on Circuits and Systems (ISCAS), May 2013, pp. 2723-2726.
Bose, S. et al., "A 3.5mV Input, 82% Peak Efficiency Boost Converter with Loss-Optimized MPPT and 50mV Integrated Cold-Start for Thermoelectric Energy Harvesting", 2019 IEEE Custom Integrated Circuits Conference (CICC), Austin, TX, USA, 2019, pp. 1-4.
Bose, S. et al., "A Stacked-Inverter Ring Oscillator for 50 mV Fully-Integrated Cold-Start of Energy Harvesters", 2018 IEEE International Symposium on Circuits and Systems (ISCAS), Florence, 2018, pp. 1-5.
Bose, S. et al., "Fully-integrated 57 mV cold start of a thermoelectric energy harvester using a cross-coupled complementary charge pump", 2018 IEEE Custom Integrated Circuits Conference (CICC), San Diego, CA, 2018, pp. 1-4.
Bose, S. et al., "Integrated Cold Start of a Boost Converter at 57 mV Using Cross-Coupled Complementary Charge Pumps and Ultra-Low-Voltage Ring Oscillator", in IEEE Journal of Solid-State Circuits, vol. 54, No. 10, pp. 2867-2878, Oct. 2019.
Cao, P. et al., "A bipolar-input thermoelectric energy-harvesting interface with boost/flyback hybrid converter and on-chip cold starter", IEEE Journal of Solid-State Circuits, pp. 1-13, 2019.
Carlson, E.J. et al., "A 20 mV input boost converter with efficient digital control for thermoelectric energy harvesting", IEEE Journal of Solid-State Circuits, vol. 45, No. 4, pp. 741-750, Apr. 2010.
Chen, P. et al., "Startup techniques for 95 mV step-up converter by capacitor pass-on scheme and Vth-tuned oscillator with fixed charge programming", IEEE Journal of Solid-State Circuits, vol. 47, No. 5, pp. 1252-1260, May 2012.
Chen, P.H. et al., "0.18-V input charge pump with forward body biasing in startup circuit using 65nm CMOS", IEEE Custom Integrated Circuits Conference 2010, Sep. 2010, pp. 1-4.
Chen, P.H. et al., "A 95mv-startup step-up con-verter with Vth-tuned oscillator by fixed-charge programming and capacitor pass-on scheme", 2011 IEEE International Solid-State Circuits Conference (ISSCC), Feb. 2011, pp. 216-218.
Das, A. et al., "An output feedback-based start-up technique with automatic disabling for battery-less energy harvesters", 2015 IEEE International Symposium on Circuits and Systems (IS-CAS), May 2015, pp. 233-236.
De Sousa, F.R. et al., "A 20 mv colpitts oscillator powered by a thermoelectric generator", 2012 IEEE International Symposium on Circuits and Systems, 2012, pp. 2035-2038.
Dickson, J.F., "On-chip high-voltage generation in MNOS integrated circuits using an improved voltage multiplier technique", IEEE Journal of Solid-State Circuits, vol. 11, No. 3, pp. 374-378, Jun. 1976.
Goeppert, J. et al., "Fully integrated startup at 70 mV of boost converters for thermoelectric energy harvesting", IEEE Journal of Solid-State Circuits, vol. 51, No. 7, pp. 1716-1726, Jul. 2016.
Im, J. et al., "A 40 mV transformer-reuse self- startup boost converter with MPPT control for thermoelectric energy harvesting", IEEE Journal of Solid-State Circuits, vol. 47, No. 12, pp. 3055-3067, Dec. 2012.
Kadirvel, K. et al., "A 330nA energy-harvesting charger with battery management for solar and thermoelectric energy harvesting", in Proc. IEEE Int. Solid-State Circuits Conf., Feb. 2012, pp. 106-108.
Kim, G. et al., "A low-voltage, low—power CMOS delay element", IEEE Journal of Solid-State Circuits, vol. 31, No. 7, pp. 966-971, Jul. 1996.
Lee, I. et al., "A subthreshold voltage reference with scalable output voltage for low-power iot systems", IEEE Journal of Solid-State Circuits, vol. 52, No. 5, pp. 1443-1449, May 2017.
Leonov, V. et al., "Thermoelectric converters of human warmth for self-powered wireless sensor nodes", IEEE Sensors J., vol. 7, No. 5, pp. 650-657, May 2007.
Leonov, V., "Thermoelectric energy harvesting of human body heat for wearable sensors", IEEE Sensors Journal, vol. 13, No. 6, pp. 2284-2291, Jun. 2013.
Lim, B. et al., "A colpitts oscillator-based self-starting boost converter for thermoelectric energy harvesting with 40-mV startup voltage and 75% maximum efficiency", IEEE Journal of Solid-State Circuits, pp. 1-10, 2018.
Liu, X. et al., "A highly efficient reconfigurable charge pump energy harvester with wide harvesting range and two-dimensional mppt for internet of things", IEEE Journal of Solid-State Circuits, vol. 51, No. 5, pp. 1302-1312, May 2016.
Lotze, N. et al., "A 62 mV 0.13µm CMOS standard-cell- based design technique using schmitt-trigger logic", IEEE J. Solid-State Circuits, vol. 47, No. 1, pp. 47-60, Jan. 2012.
Luo, Z. et al., "A sub-10 mv power converter with fully integrated self-start, mppt, and zcs control for thermoelectric energy harvesting", IEEE Transactions on Circuits and Systems I: Regular Papers, vol. 65, No. 5, pp. 1744-1757, May 2018.
Meindl, J.D. et al., "The fundamental limit on binary switching energy for terascale integration (TSI)", IEEE J. Solid-State Circuits, vol. 35, No. 10, pp. 1515-1516, Oct. 2000.
Melek, L.A.P. et al., "Analysis and Design of the Classical CMOS Schmitt Trigger in Subthreshold Operation", IEEE Transactions on Circuits and Systems I: Regular Papers, vol. 64, No. 4, pp. 869-878, Apr. 20.
O'Callaghan, J., "Thermoelectric Energy Harvesting", http://www.sensorsmag.com/components/thermoelectric-energy-harvesting Jun. 1, 2011 [downloaded on Apr. 2, 2020].
Ramadass, Y.K. et al., "A batteryless thermoelectric energy-harvesting interface circuit with 35 mV startup voltage", IEEE J. Solid-State Circuits, vol. 46, No. 1, pp. 333-341, Jan. 2011.
Roy, K. et al., "Leakage current mechanisms and leakage reduction techniques in deep-submicrometer CMOS circuits", Proc. IEEE, vol. 91, No. 2, pp. 305-327, Feb. 2003.
Rozgic, D. et al., "A 0.78mw/cm2 autonomous thermoelec-tric energy-harvester for biomedical sensors", 2015 Symposium on VLSI Circuits (VLSI Circuits), Jun. 2015, pp. C278-C279.
Seeman, M. et al., "Analysis and Optimization of Switched-Capacitor DC-DC Converters", IEEE Transactions on Power Electronics, vol. 23, No. 2, Mar. 2008, 11 pgs.

(56) References Cited

OTHER PUBLICATIONS

Seok, M. et al. "A portable 2-transistor picowatt temperature-compensated voltage reference operating at 0.5 V", IEEE Journal of Solid-State Circuits, vol. 47, No. 10, pp. 2534-2545, Oct. 2012.

Shrivastava, A. et al., "A 10 mV-input boost converter with inductor peak current control and zero detection for thermoelectric and solar energy harvesting with 220 mV cold-start and 14.5 dBm, 915 MHz RF kick-start", IEEE Journal of Solid-State Circuits, vol. 50, No. 8, pp. 1820-1832, Aug. 2015.

Snyder, G.J. et al., "Complex thermoelectric materials", Nature Mater., vol. 7, pp. 101-110, Feb. 2008. doi: 10.1038/nmat2090.

Tang, H.Y. et al., "A fully electrical startup batteryless boost converter with 50mv input voltage for thermoelectric energy harvesting", 2012 Symposium on VLSI Circuits (VLSIC), Jun. 2012, pp. 196-197.

Teh, Y. et al., "Design of transformer-based boost converter for high internal resistance energy harvesting sources with 21 mV self-startup voltage and 74% power efficiency", IEEE Journal of Solid-State Circuits, vol. 49, No. 11, pp. 2694-2704, Nov. 2014.

Warneke et al., "An autonomous 16 mm/sup 3/ solar-powered node for distributed wireless sensor networks", in Sensors, 2002 IEEE, vol. 2, Jun. 2002, pp. 1510-1515 vol. 2.

Weng, P. et al., "50 mV-input batteryless boost converter for thermal energy harvesting", IEEE Journal of Solid-State Circuits, vol. 48, No. 4, pp. 1031-1041, Apr. 2013.

Zhai et al., "The limit of dynamic voltage scaling and insomniac dynamic voltage scaling", IEEE Trans. Very Large Scale Integr. (VLSI) Syst., vol. 13, No. 11, pp. 1239-1252, Nov. 2005.

Zhou, X. et al., "Improved light—load efficiency for synchronous rectifier voltage regulator module", IEEE Transactions on Power Electronics, vol. 15, No. 5, pp. 826-834, Sep. 2000.

Final Office Action dated Mar. 16, 2021 for U.S. Appl. No. 16/840,170.

Notice of Allowance dated May 26, 2021 for U.S. Appl. No. 16/840,170.

Non-Final Office Action dated Dec. 11, 2020 for U.S. Appl. No. 16/840,170.

Restriction Requirement dated Nov. 2, 2020 for U.S. Appl. No. 16/840,170.

\* cited by examiner

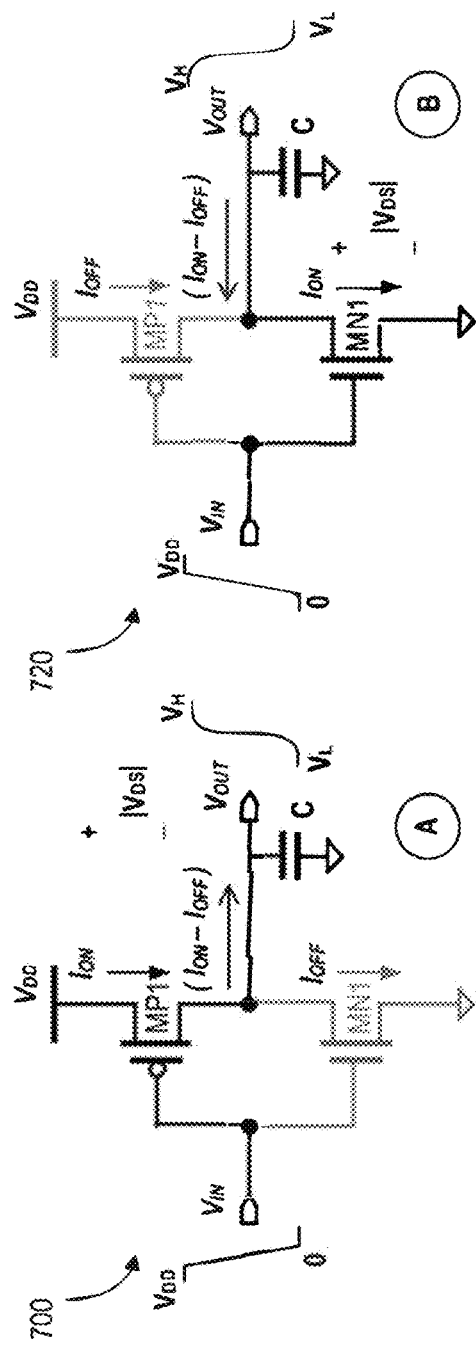
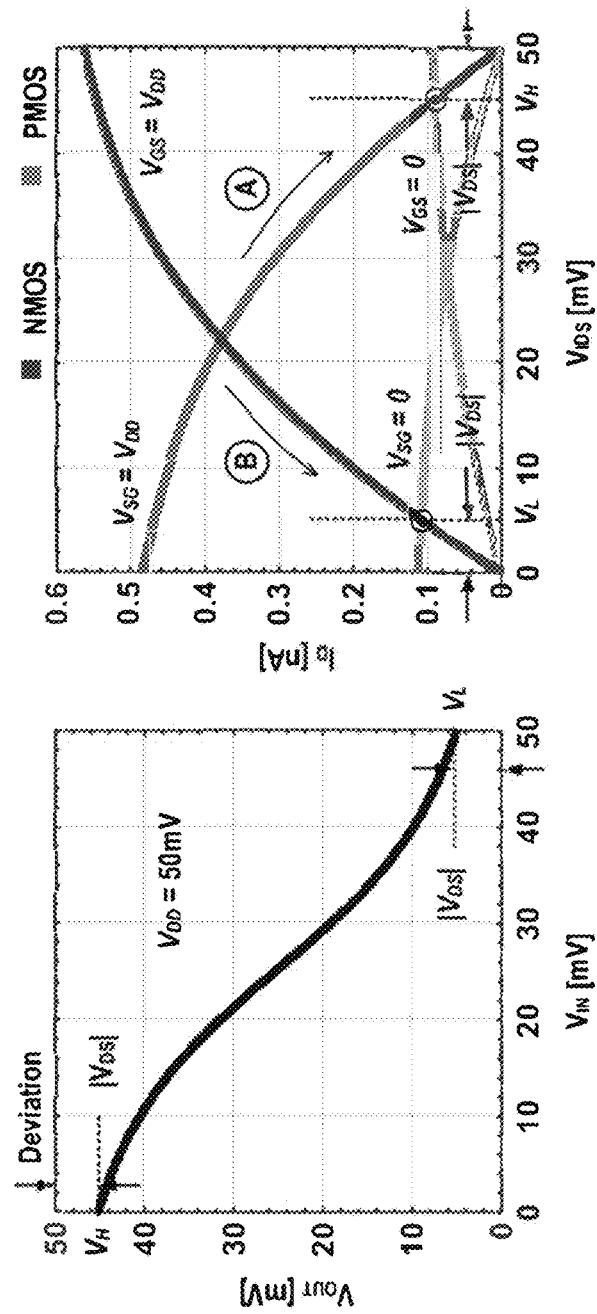
Fig. 7A
Fig. 7B

INTEGRATED CIRCUIT FOR LOW-VOLTAGE THERMOELECTRIC ENERGY HARVESTING WITH SELF-START

CLAIM FOR PRIORITY

This application claims priority to U.S. Provisional Patent Application No. 62/830,168 filed on Apr. 5, 2019, titled "INTEGRATED CIRCUIT FOR LOW-VOLTAGE THERMOELECTRIC ENERGY HARVESTING WITH SELF-START," and which is incorporated by reference in its entirety.

GOVERNMENT INTEREST STATEMENT

This invention was made with government support under Grant No. R21 DE027170, awarded by the National Institutes of Health. The government has certain rights in the invention.

BACKGROUND

Energy harvested from body heat using thermoelectric generators (TEG), harnessing the small temperature difference between human skin and the environment can be used to power wearable electronics, such as wireless sensors for body-area networks. However, owing to the small temperature gradient between the skin surface and ambient air (e.g., approximately 1-2° C.) and a low Seebeck coefficient, centimeter-scale TEGs can generate only tens of millivolts of open circuit voltage (VTG).

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 7A-B illustrate two operating conditions of an inverter with low output voltage rail at low power supply, respectively.

DETAILED DESCRIPTION

Figure 1:
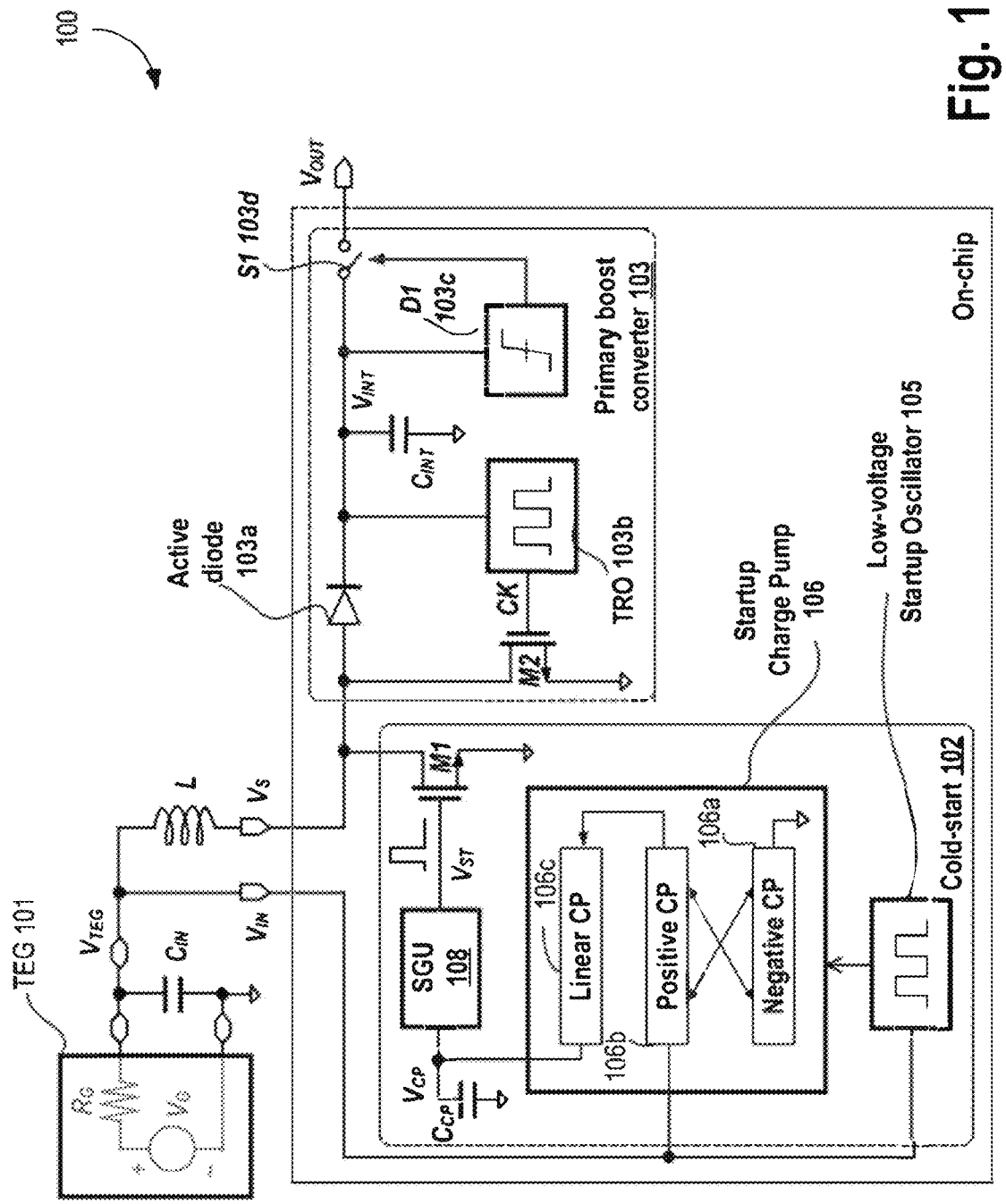
FIG. 1 illustrates a high-level architecture for cold start of a thermoelectric energy harvester, in accordance with some embodiments.

Thermoelectric energy harvesting is an intuitive approach for powering wearable devices, where the temperature difference between human skin and the ambient environment provides a constant source of energy. This small temperature gradient, however, generates only tens of millivolts using a thermoelectric generator. A DC-DC boost converter is used to step up the source voltage to an output voltage level sufficient for powering integrated circuits. For example, a low-voltage DC-DC converter is needed to boost this voltage to at least 1 V for efficient operation of the load electronics. In addition, for autonomous operation and for battery-less devices, the DC-DC converter must self-start at low TEG voltage which typically requires additional sources of energy or the use of additional off-chip components.

This presents two challenges. First, for self-contained, battery-less applications, the converter must self-start using only the low voltage from the TEG. Second, impedance matching at the input of the converter for maximum power transfer from the TEG further lowers the input voltage of the converter. This demands high end-to-end efficiency to sustain operation of the converter with low input voltage.

The integrated circuit (IC) described herein lowers the start-up voltage to, for example, 50 mV, compatible for starting a DC-DC converter from a TEG, even with a small temperature gradient. The IC further improves end-to-end efficiency of the energy harvester by improving power efficiency of the DC-DC converter while ensuring maximum power transfer from the TEG at low voltages. The circuit can be configured between the TEG and any downstream sensor or communication circuits to provide an acceptable (e.g., greater than 1 V) voltage for powering the downstream circuits from a low-voltage (e.g., less than 200 mV) TEG energy source.

In some embodiments, a strobe-based one-shot start-up mechanism is disclosed that reduces power burden on start-up voltage multiplier and achieves integrated cold-start of the primary DC-DC boost converter at an input voltage of 50 mV. The start-up mechanism helps in realizing a fully autonomous thermoelectric energy harvester to harvest thermal energy from human body to enable battery-less wearable devices. Some embodiments of the described architecture can be implemented in a 180 nm silicon CMOS integrated circuit (IC) process and achieve cold-start of the primary converter within 252 millisecond (ms) with 50 mV input start-up voltage. This demonstrates integrated cold-start of a DC-DC converter at the lowest input voltage reported to date for integrated solutions without additional off-chip components. The start-up time may be further lowered for higher start-up voltages. Start-up voltage and start-up time are inversely correlated (i.e., lower start-up voltage results in higher start-up time and vice versa). For example, a start-up time of 150 ms with 50 mV start-up voltage can be achieved in some preferred embodiments. Other embodiments of the invention may be implemented in other CMOS fabrication processes, including but not limited to 130 nm, 65 nm, or other processes that are known in the art.

In some embodiments, the strobe-based kick start mechanism is implemented using low-voltage integrated ring oscillator and low-voltage on-chip charge pump. The strobe based one-shot startup mechanism reduces power burden of the charge pump and achieves a low-voltage fast cold-start of the primary converter. Other low-voltage start-up solutions require additional off-chip components and/or are comparatively slow to start. Some embodiments also include a unique on-chip start-up voltage multiplier to operate at very low input voltages (e.g., tens of millivolts). The voltage multiplier uses complementary charge pumps to achieve high gate boosting of charge transfer switches and thereby enhanced charge transfer between successive stages. This enables the voltage multiplier to achieve high pumping efficiency in boosting sub-100 mV input voltage.

In some embodiments, the voltage-multiplier implemented in a 180 nm CMOS process comprises dual phased charge-pump stages (e.g., 21 stages) with cross-coupled complementary stages for the first set of stages (e.g., for the first 6 stages) and can boost input a sub-100 mV input to an output voltage in a range of 800 mV to 1.8 V. A pumping efficiency of, for example, 93% is achieved at an input voltage of 65 mV. The charge pump of some embodiments is the lowest input voltage charge pump reported to date. In some embodiments, pumping efficiency of the low-voltage charge pump is enhanced by improving charge transfer between successive stages through high gate boosting of charge transfer switches using complementary charge pumps. In some embodiments, cross-coupled gate boosting using complementary charge pumps is achieved with high gate boosting (e.g., greater than 6 Vdd).

In some embodiments, a low-voltage integrated ring oscillator with stacked-inverter delay elements generates a start-up clock for the operation of the charge pumps. The dynamic leakage suppression technique using stacked-inverter delay element enables operation of the ring-oscillator at a supply voltage as low as, for example, 40 mV, which is the lowest operating voltage of an integrated ring oscillator reported to date.

Some embodiments also include an efficient DC-DC boost converter for low input voltages (e.g., 3.5 mV-100 mV). The DC-DC boost converter can be implemented in any suitable process technology node such as 180 nm CMOS process. The DC-DC converter enables efficient thermoelectric energy harvesting from human body heat using thermoelectric generator at small temperature gradient. Unlike conventional boost converters, which achieve efficient boosting at higher input voltages, the converter of various embodiments achieves high efficiency (e.g., above 75% efficiency with input voltages greater or equal to 15 mV). For example, the DC-DC converter has near flat efficiency across 15 mV to 100 mV using a minimum input voltage of 3.5 mV and peak efficiency of 82% with input voltage of 50 mV.

In some embodiments, the IC pushes the minimum input operating voltage for a DC-DC converter lower than the state-of-the-art (e.g., as low as 3.5 mV measured), making it suitable for harvesting energy from low-voltage sources like TEGs with human body heat. The optimized efficiency of the converter, while ensuring maximum power point tracking (MPPT), achieves higher end-to-end efficiency of the harvester, due to the adaptive on-time and frequency switching. Efficient low-voltage power converter (which is operable with minimum temperature gradient of 0.2° C.) along with integrated cold-start at 50 mV (corresponding to 1.4° C. temperature gradient) makes the harvester suitable for autonomous thermal energy harvesting from human body heat. Other technical effects will be evident from the various embodiments and figures.

The embodiments of the disclosure will be understood more fully from the detailed description given below and from the accompanying drawings of various embodiments of the disclosure, which, however, should not be taken to limit the disclosure to the specific embodiments, but are for explanation and understanding only.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one light, current signal, voltage signal, optical, electromagnetic signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

It is pointed out that those elements of the figures having the same reference numbers (or names) as the elements of any other figure can operate or function in any manner similar to that described, but are not limited to such.

FIG. 1 illustrates high-level architecture 100 for cold start of a thermoelectric energy harvester, in accordance with some embodiments. Cold start architecture 100 is illustrated as part of a larger thermoelectric energy harvester in FIG. 1. Architecture 100 comprises a single-inductor L coupled to TEG 101, input capacitor $C_{IN}$, cold start circuitry 102, and primary boost converter 103. In some embodiment, cold start circuitry 102 comprises low-voltage startup oscillator 105, startup charge pump (CP) 106, capacitor $C_{VP}$, strobe generation unit (SGU) 108, and switch transistor $M_1$ coupled as shown. In some embodiments, converter 103 comprises active diode 103a, oscillator 103b, integrating capacitor $C_{INT}$, voltage detector circuit 103c (with hysteresis), and switch $S_1$ 103d. The input voltage $V_{TEG}$ from TEG 101 (modeled as resistor $R_G$ and voltage source $V_G$) is split as $V_{IN}$ and $V_S$ (via inductor L). Input supply $V_{IN}$ is used by oscillator 105 to generate a clock for CP 106. Input voltage $V_S$ is the input supply for converter 103. The output supply of converter 103 is $V_{OUT}$.

Architecture 100 comprises a single-inductor boost converter 103 to harvest energy efficiently from a TEG over a wide range of $V_{TG}$ (e.g., 10 mV to 200 mV). In some embodiments, architecture 100 optimizes conduction and control circuit losses in the converter by adapting the on-time and frequency of the switching clock to achieve high converter efficiency while ensuring maximum power point tracking (MPPT) across the input voltage range. This improves the end-to-end power efficiency. The boost converter 103 achieves an efficiency of 77% at matched $V_{IN}$ of 20 mV, resulting in 24% improvement known schemes, for example. A peak efficiency of 82% is measured when $V_{IN}$ is 50 mV. Owing to the improved efficiency at low input voltages, converter 103 of some embodiments can sustain operation with $V_{IN}$ as low as 3.5 mV, which improves upon prior art by 65% and is the smallest input voltage reported to date. Architecture 100 also includes an integrated start-up mechanism 102, which is capable of starting the converter with $V_{TG}$ as low as 50 mV. Ultra-low voltage operation, improved efficiency across TEG output range, and integrated low-voltage cold-start of architecture 100 together address the key challenges presented by energy harvesting from body heat.

In some embodiments, architecture 100 uses an integrated cold-start circuit architecture 102 that applies an ultra-low-voltage ring oscillator 105, a cross-coupled complementary charge pump 106 for enhanced drivability and a low-power strobe generator 108 to start up a downstream inductive boost converter 103. In one example, a fast start-up at an input voltage of 57 mV is achieved, which is the lowest fully-integrated cold start voltage reported to date. This approach enables autonomous cold start of thermoelectric energy harvesters from normal body temperature while minimizing the start-up energy, or 'joules to start'.

Instead of charging a large storage capacitor (e.g., greater than 1 nF), a smaller capacitor ($C_{CP}$), e.g., 120 pF, is charged by cross-coupled complementary charge pump 106 with improved drivability. The charge pump clock is generated by the integrated ring oscillator 105 which includes stacked-inverter delay elements that enable clock generation from a low voltage input. The boosted voltage output of the charge pump is used to generate a strobe pulse that drives the gate of transistor M1. This strobe provides a sharp falling edge sufficient to kick-start the inductive boost converter 103 and transfer energy to the output capacitor $C_{INT}$.

As soon as the energy transfer starts, a low-voltage thyristor-based ring oscillator (TRO) 103b starts up to run the primary boost converter 103. Once the voltage across $C_{INT}$ crosses the threshold of the voltage detector 103, the final output $V_{OUT}$ is enabled. The combined architecture enables low-voltage cold start and fast handover to the higher-efficiency inductive boost converter, thereby minimizing the energy consumed from the source for cold-start.

Fully integrated electrical cold start at low input voltage is challenging due to the high threshold voltage of transistors in sub-micrometer CMOS processes. In some embodiments, the integrated start-up mechanism 103 applies a one-shot pulse that triggers the inductive converter 103 to start operation.

In some embodiments, start-up voltage multiplier based CP 106 is used that enables an efficient voltage multiplication of the small input voltage by means of a high-gate-boosting scheme, implemented using cross-coupled complementary charge pumps 106a and 106b. The output of the cross-coupled complementary charge pumps 106a and 106b is received by a linear CP 106, which helps in the generation of the start-up pulse. The final boosted output of CP 106 acts as an internal supply $V_{CP}$ for powering the SGU 108 to generate the start-up pulse $V_{ST}$. The multiplier operates with a start-up clock generated by on-chip ring oscillator 105 using a unique stacked-inverter delay element for ultra-low-voltage operation. In this example, the start-up mechanism 102 is implemented in a 0.18-μm CMOS process and achieves the cold start of an inductive boost converter at an input voltage as low as 57 mV, which is the lowest cold-start voltage reported to date using a fully integrated electrical circuit.

Limited on-chip capacitance constrained by silicon area and low input voltage reduce charge transfer (Q=CV) through a charge-pump-based voltage multiplier. This is exacerbated by the low start-up clock frequency at low supply voltage, which results in low output current. As such, charging a large storage capacitor with the diminished output power of a charge pump is not prudent for low-voltage cold start. However, while a TEG provides low output voltage, it can provide a moderate amount of current due to its low source impedance (typically a few ohms); charging an inductor with this current can generate higher energy per cycle. To exploit this, rather than relying solely on a start-up charge pump, power transfer is quickly handed over to the inductive converter to achieve a low-voltage and fast cold-start operation.

A start up voltage multiplier 106 initially boosts the input voltage $V_{IN}$ to power strobe generation unit (SGU) 108. The voltage boosting ability of the multiplier 106 is improved by using the cross-coupled complementary charge pumps (e.g., 106a/b) to enhance the gate drive of the charge transfer switches. A strobe signal $V_{ST}$ from the SGU 108 turns on an auxiliary low-side (LS) switch $M_1$ (e.g., n-type transistor) and charges the inductor L with current from TEG 101.

In some embodiments, thyristor-based ring oscillator (TRO) 103b to start oscillation with low supply (e.g., 400 mV) is powered by $V_{INT}$ and takes over control to operate inductive converter 103. A wider low-side switch LS switch $M_2$ is now used to charge the inductor L with a higher current per cycle. $V_{INT}$ is not connected to the output $V_{OUT}$ until it crosses a voltage threshold detected by the voltage detector D1 103c, This ensures that all inductor energy is used to start TRO 103b during start-up. Transistor $M_1$ is disabled during primary operation as $V_{ST}$ goes low.

The start-up scheme of various embodiments reduces the power burden on the voltage multiplier 106 and achieves low-voltage start-up. In addition, the one-shot kick-start mechanism by SGU 108 quickly hands over the power transfer process to a more efficient current-mode inductive boost converter 103 and, thereby, speeds up the start-up process.

Figure 2A:
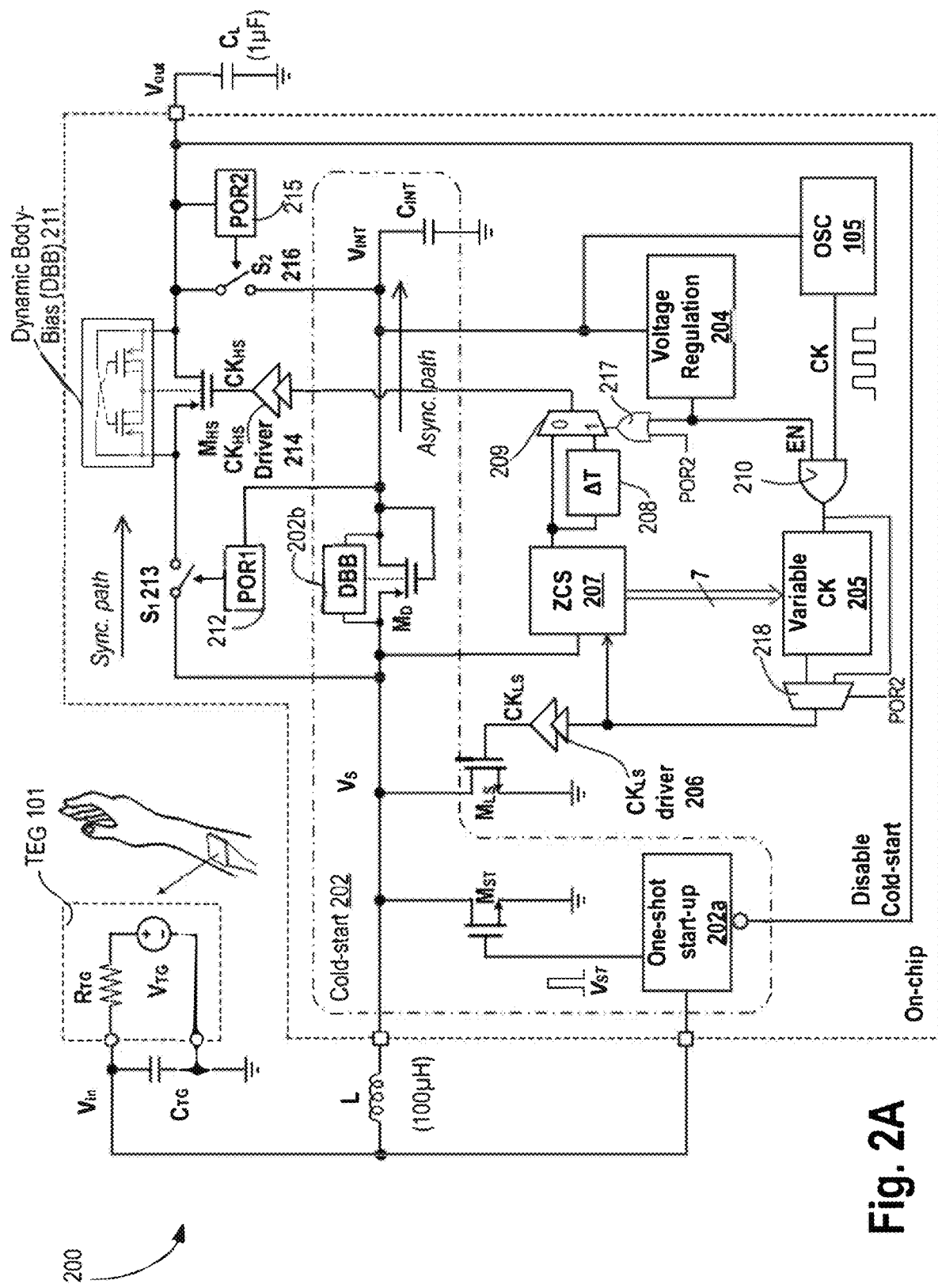
FIG. 2A illustrates a harvester including a DC-DC boost converter with low-voltage integrated cold-start for thermal energy harvesting from skin using TEG, in accordance with some embodiments.

FIG. 2A illustrates another architecture 200 (also referred to as harvester 200) of a DC-DC boost converter with low-voltage integrated cold-start for thermal energy harvesting from skin using TEG, in accordance with some embodiments. In some embodiments, architecture 200 comprises a single-inductor L coupled to TEG 101, input capacitor $C_{TG}$, cold start circuitry 202, voltage regulation circuitry 204, oscillator 105, variable clock pulse generator 205, clock driver $CK_{LS}$ 206 for low-side switch $M_{LS}$, zero current sensing (ZCS) circuitry 207, delay circuitry 208, multiplexer 209, AND gate 210, dynamic body bias (DBB) circuitry 211, first power-on reset (POR) circuitry 212, first switch $S_1$ 213, high-side switch $M_{HS}$, clock driver $CK_{HS}$ 214 for the high-side switch $M_{HS}$, second POR 215, second switch $S_2$ 216, OR gate 217, multiplexer 218 coupled as shown. In some embodiments, cold-start circuitry 202 comprises one-shot start-up circuitry 202a, start-up switch $M_{ST}$, DBB 202b, switch $M_O$, and integrating capacitor $C_{INT}$ coupled as shown.

Converter 200 comprises asynchronous (Async.) and synchronous (Sync.) boost converter paths utilizing the same inductor. The asynchronous path speeds up the start-up process, and the synchronous path provides high-efficiency energy conversion during normal operation. The asynchronous path is enabled by a one-shot start-up mechanism 202. This is done by turning on a start-up switch, $M_{ST}$, for a short duration (e.g., 50 ms) using a one-shot pulse from one-shot start-up 202a. Once the n-type transistor $M_{ST}$ turns off, voltage overshoot at $V_S$ power supply rail turns on p-type diode-connected device, $M_D$. Here, node names and signal names are interchangeably used. For example, $V_{out}$ may refer to output power supply rail $V_{out}$ or $V_{out}$ voltage on the power supply rail, depending on the context of the sentence.

The inductor current through inductor L immediately charges a small on-chip capacitor, $C_{INT}$ (e.g., 200 pF), which generates sufficient voltage (e.g., $V_{INT}$>500 mV) to start internal oscillator, OSC 105. Energy transfer is now enhanced by charging the inductor L through a wider low-side switch, $M_{LS}$, continuing to boost the voltage $V_{INT}$. During this time, the boosted voltage from the charge pump (part of 202a) is used to keep the synchronous path inactive (e.g., $S_1$ is OFF). In some embodiments, except for the voltage regulation block 204, none of control circuits are powered until $V_{INT}$ crosses a threshold voltage (e.g., 1 V), when the synchronous path is activated (e.g., $S_1$ is ON) by a power-on-reset circuit (POR1) 212.

The synchronous path uses a p-type high-side switch, $M_{HS}$, which is operated in discontinuous conduction mode (DCM) due to low input power. The on-time ($t_{HS}$) of high-side switch $M_{HS}$ is adjusted by means of zero current sensing (ZCS) 207 through the inductor L. While this high-efficiency path charges the large off-chip load capacitor, CL (e.g., 1 µF), the asynchronous path provides power to control circuits. In some embodiments, voltage regulator 204 monitors energy need in the asynchronous path, as needed. Energy transfer is time-multiplexed between the two paths by activating a dead time (Δt) between the low-side pulse, $CK_{LS}$, and the high-side pulse, $CK_{HS}$. The dead time briefly reroutes the inductor current through the asynchronous path to recharge $C_{INT}$ before it reverts to the synchronous path at the falling edge of $CK_{HS}$. As $V_{OUT}$ cross a threshold, e.g., 0.7V, the capacitors $C_{INT}$ and $C_L$ are shorted ($S_2$ 216 is ON) by POR2 215 and the asynchronous path is completely deactivated. In some embodiments, an on-off regulation scheme tracks the output voltage $V_{OUT}$ and activates or deactivates the switching clock based on comparison of $V_{OUT}$ against two on-chip reference voltages. The start-up clock of the charge pump is disabled by rising $V_{OUT}$, eliminating unnecessary power consumption.

The one-shot cold-start technique of various embodiments demonstrates fast and low-voltage cold-start of a boost converter. However, asynchronous mode of operation of the implemented converter and lack of MPPT (maximum power point tracking) at input results in inefficient power transfer at the output. In this work we adopted the one-shot cold-start technique, but utilized a dual path architecture to self-start a highly efficient DC-DC boost converter without using additional inductors.

Figure 2B:
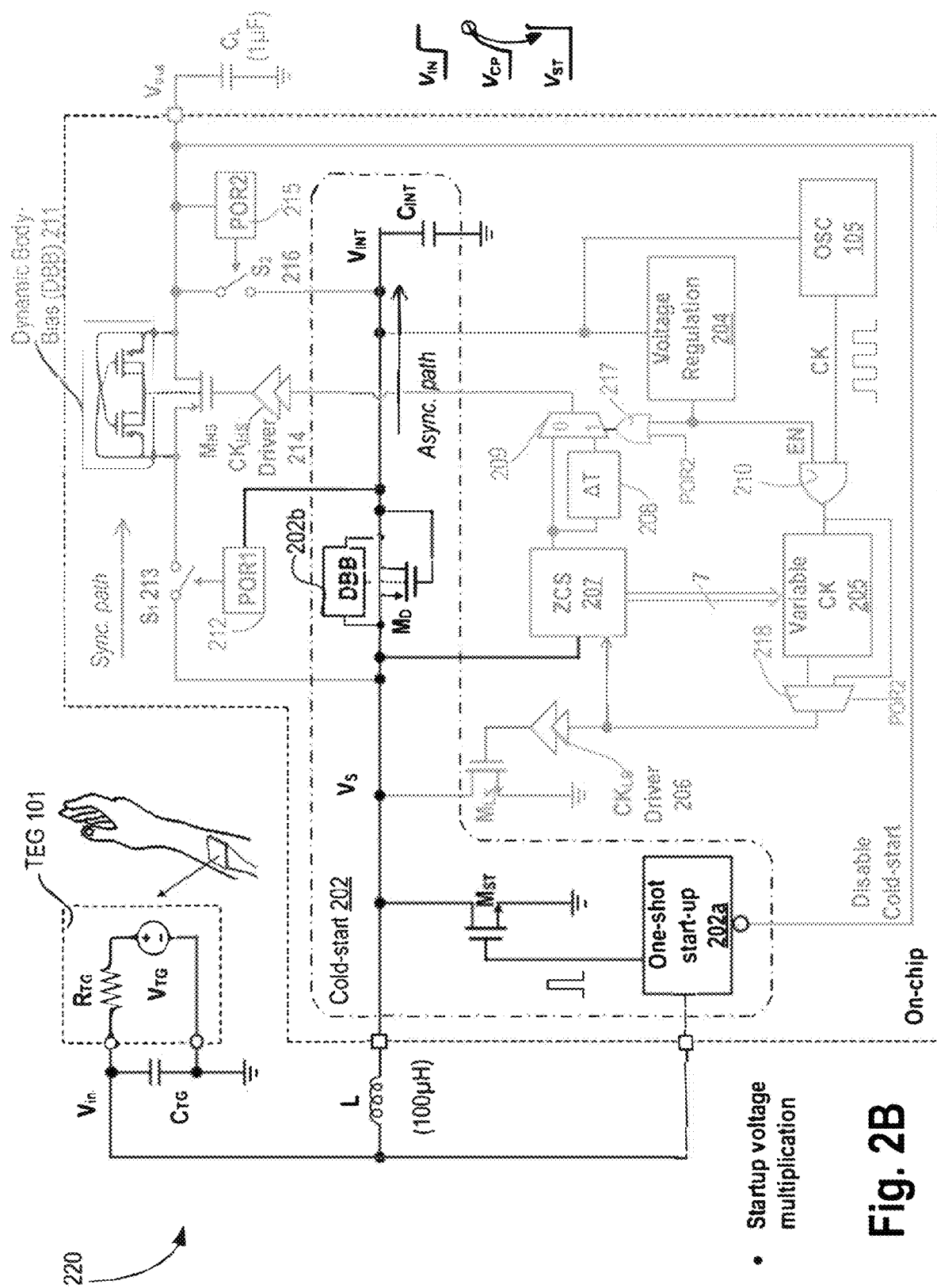
FIGS. 2B-E illustrate different phases of operation of the harvester of FIG. 2A, in accordance with some embodiments.

FIGS. 2B-E illustrate different phases 220, 230, 240, and 250, respectively, of operation of the harvester of FIG. 2A, in accordance with some embodiments. During cold-start phase 220, as shown in FIG. 2B, a charge-pump-based on-chip voltage multiplier with the aid of clocks from a low-voltage ring oscillator boosts the input voltage $V_{IN}$. The boosted output of the charge pump, $V_{CP}$, is utilized to generate a start-up strobe pulse, $V_{ST}$. This pulse turns on the start-up low side switch $M_{ST}$ for a small duration and charges the inductor L with current from TEG 101. With the falling edge of $V_{ST}$, inductive overshoot at $V_S$ turns on the p-type diode, $M_D$ asynchronously and the inductor current charges the on-chip storage capacitor, $C_{INT}$. This intermediate storage capacitor is chosen small enough (e.g., 200 pF) so that the inductor energy accumulated during the strobe cycle can charge it to generate a voltage, $V_{INT}$ above, for example, 500 mV momentarily following the falling edge of $V_{ST}$.

Figure 2C:
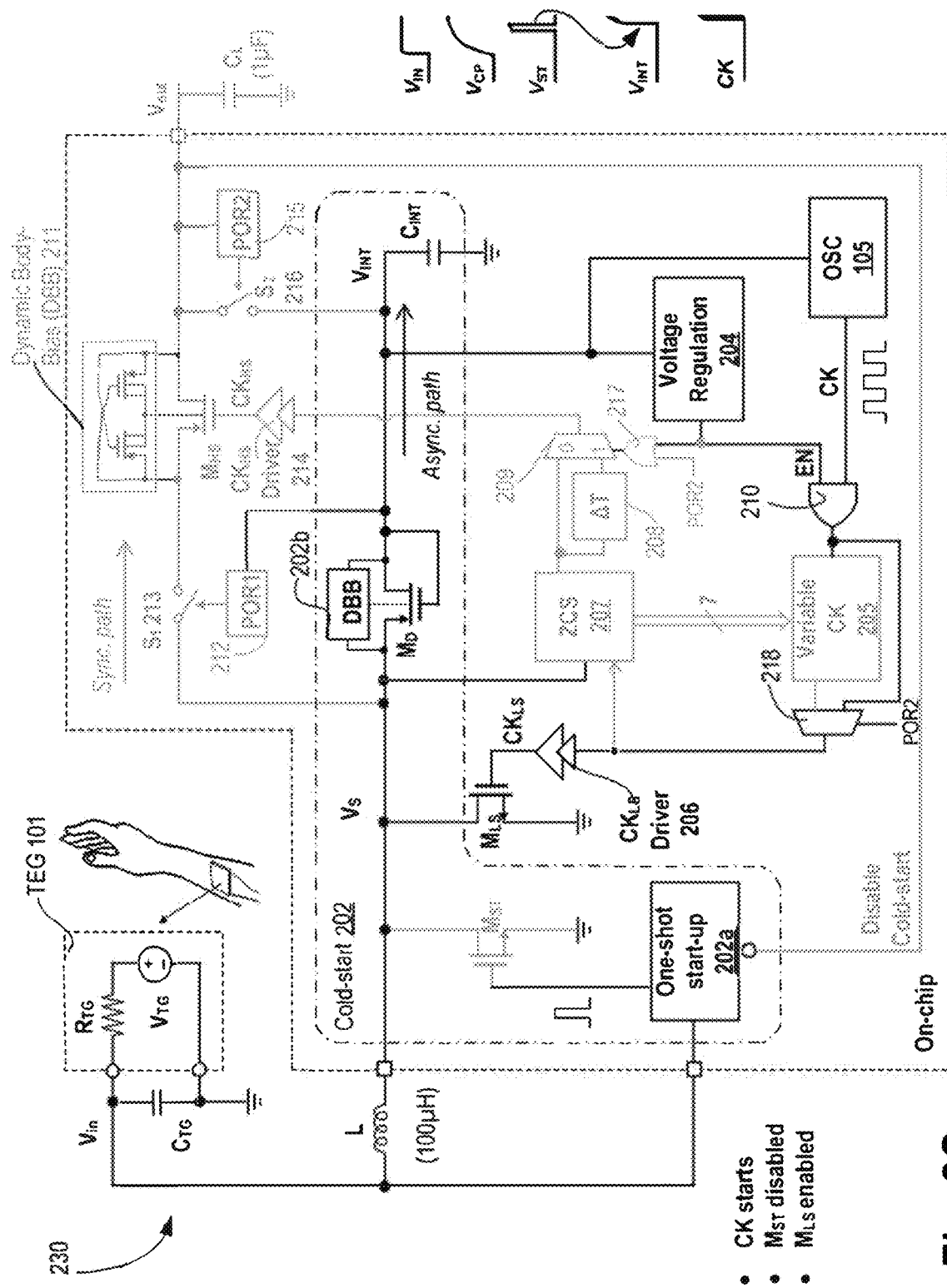

The secondary oscillator (OSC) 105, powered by $V_{INT}$ starts operation and generates switching clock, CK to continue operation of the inductive boost converter. Now the inductor is energized with more current every CK cycle using a wider low-side switch, $M_{LS}$, as shown in FIG. 2C and energy is transferred to $C_{INT}$ by asynchronous mode of operation. FIG. 2C illustrates the asynchronous operation phase 230. Voltage regulation block 204 is also activated in this phase to track $V_{INT}$, whose utility will be elaborated in the subsequent details. Output second power-on-reset (POR2) circuit 215 causes multiplexer 218 to select switching clock, CK from AND gate 210. This switching clock CK is driven by block buffers $CK_{LS}$ 206 to control the low-side switch $M_{LS}$.

Figure 2D:
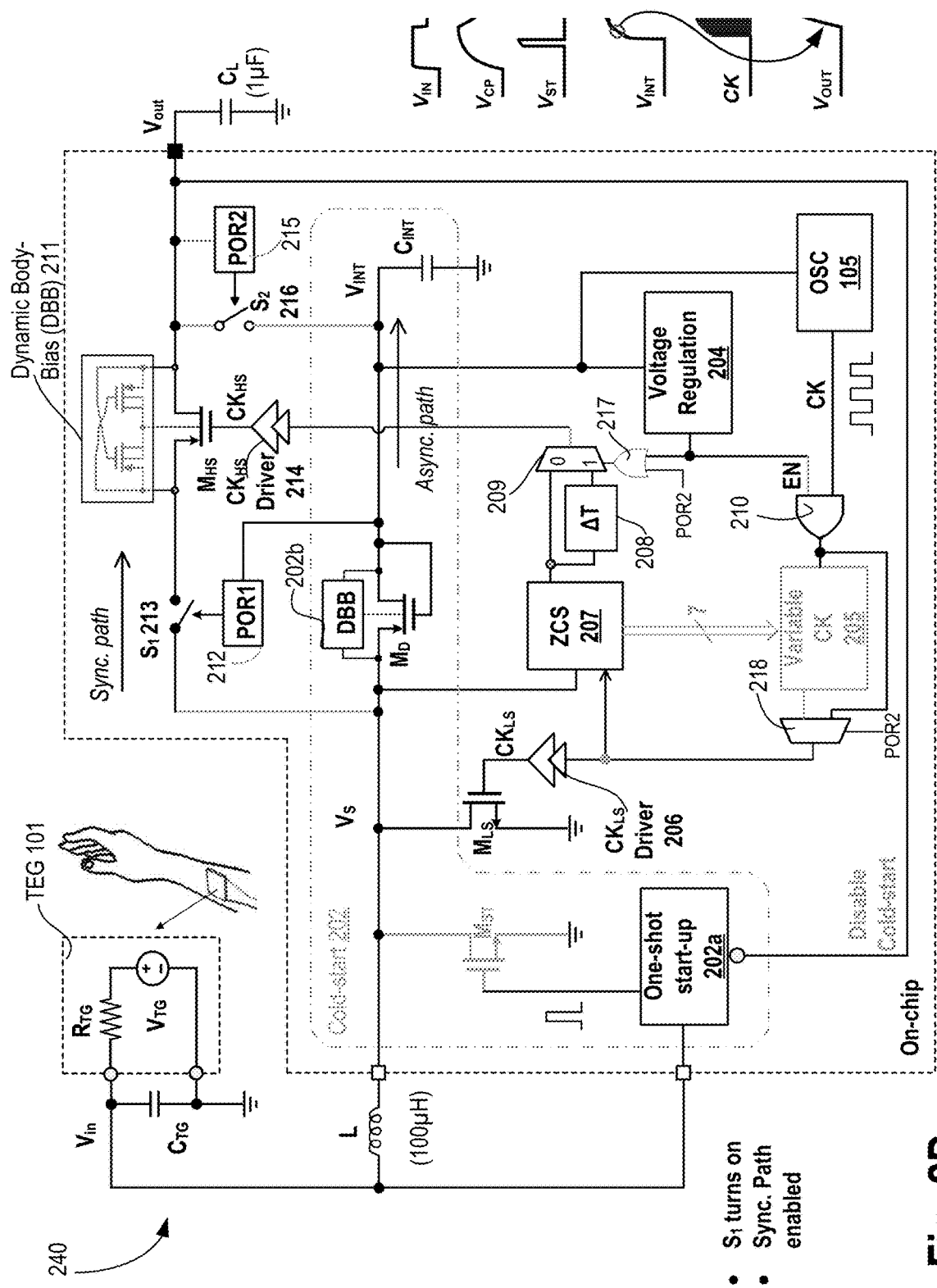

First power-on-reset (POR1) circuit 212, as shown in FIG. 2D, senses the rise of $v_{INT}$ and turns on the switch, $S_1$ as soon as $V_{INT}$ crosses a threshold, e.g., 1 V. FIG. 2D illustrates the dual operation handover phase 240. This activates a secondary path of inductor energy transfer, which operates synchronously using a high-side p-type switch, $M_{HS}$, and powers the final output, $V_{OUT}$, as illustrated with FIG. 2D. The n-well of the high-side switch $M_{HS}$ (as well as of $M_D$) is biased to the highest potential by means of dynamic body biasing (DBB) 211 as shown in FIG. 2A to avoid inefficient body-current.

In some embodiments, switch $S_1$, implemented with a p-type transistor, is kept off in the previous phases utilizing the charge pump output, $V_{CP}$. Available power from TEG 101 being low, a discontinuous conduction mode (DCM) of operation is chosen for the synchronous boost conversion and is implemented by a zero current sensing (ZCS) block 207 to adjust the on-time ($t_{HS}$) of $M_{HS}$, in accordance with some embodiments. During this phase, while the high efficiency synchronous path charges the output capacitor, $C_{OUT}$ (e.g., 1 µF) the asynchronous path provides power to the control circuits as shown in FIG. 2D. The dual path is operated in a time-multiplexed way by means of a deadtime, Δt 208 between $t_{LS}$ and $t_{HS}$. Output (EN) of the voltage regulation block 204, monitoring $V_{INT}$ is utilized to activate Δt 208 (via multiplexers 209 and 218) which forces transistor $M_D$ to turn on briefly. The inductor current is rerouted to the asynchronous (Async.) path during this dead time and recharges capacitor $C_{INT}$. With the falling edge of $CK_{HS}$ as high-side transistor $M_{HS}$ is turned on, the inductor current reverts back to the synchronous (Sync.) path to charge output capacitor $C_{OUT}$ (or $C_L$).

Figure 2E:
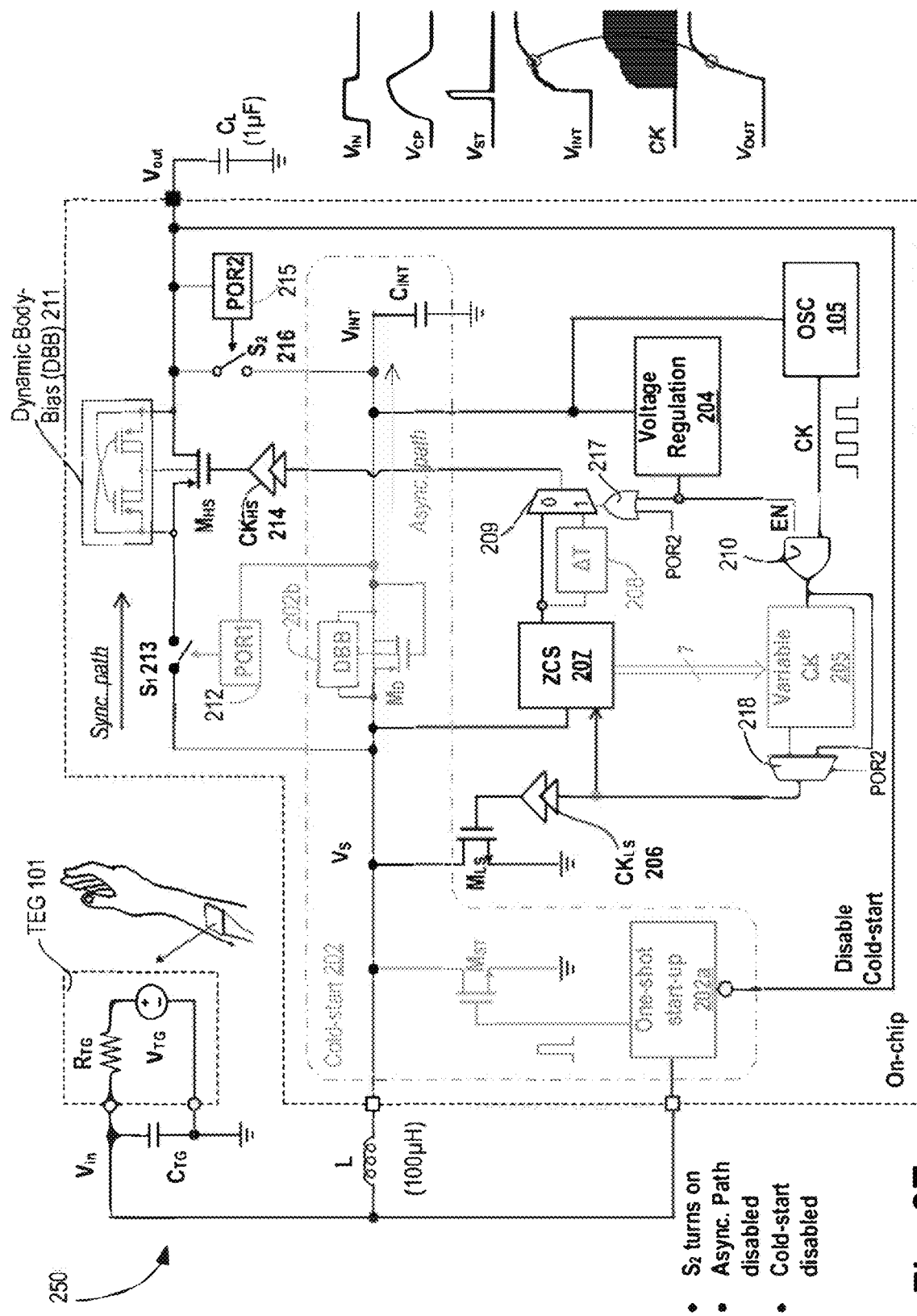

As $V_{OUT}$ crosses a threshold, e.g., 0.7 V detected by POR2 215, the power switch $S_2$ is turned on shorting nodes $V_{OUT}$ and $V_{INT}$ and Δt is deactivated with the help of a multiplexer 209 as shown in FIG. 2E. FIG. 2E illustrates the synchronous operation phase 250, which is the primary boost conversion phase. In this phase, the boost converter enters into exclusively synchronous mode and operates efficiently to provide control power as well as output power. The rising $V_{OUT}$ disables the start-up clock and turns off the start-up voltage multiplication 202a to avoid unnecessary power consumption during normal operation of the boost converter. The same voltage regulation block 204 now regulates $V_{OUT}$ by means of an on-off hysteretic control. The dual-path architecture 200 utilizes the asynchronous path to speed up the start-up process leveraging the one-shot coldstart mechanism 202 and finally starts a high-efficiency synchronous boost converter at low voltage without using an additional inductor.

Figure 3:
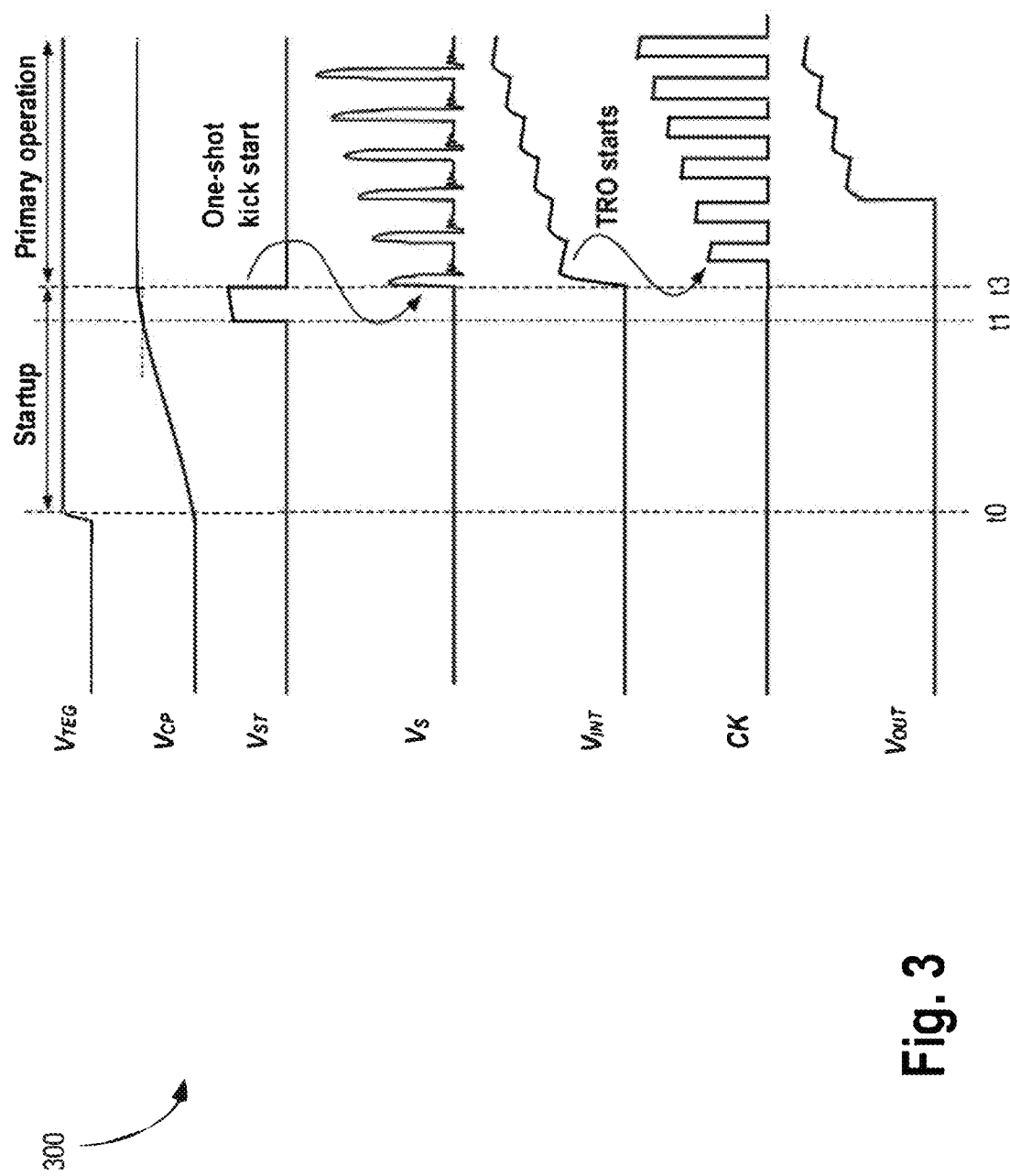
FIG. 3 illustrates a plot showing timing diagram of the cold-start sequence that uses a fast-falling edge of a strobe pulse for quick triggering of the primary inductive boost converter of FIGS. 1-2, in accordance with some embodiments.

FIG. 3 illustrates plot 300 showing timing diagram of the cold-start sequence of FIG. 1 that uses a fast-falling edge of a strobe pulse for quick triggering of the primary inductive boost converter of FIGS. 1-2, in accordance with some embodiments. The small voltage $V_{TEG}$ at time t0 is boosted by the charge-pump (106 of architecture 100 or CP in 202a of architecture 200). The amplified voltage is a slow ramping voltage $V_{CP}$ and indicated by time duration t0 through t1. Once $V_{CP}$ reaches a threshold level (e.g., threshold of an n-type transistor), one-shot kick start pulse is generated (between times t1 and t3). As shown in plot 300, a sharp falling edge of the one-shot pulse $V_{ST}$ forces the voltage $V_S$ to rise and forward-bias an active diode. The inductor current immediately charges a small on-chip storage capacitor $C_{INT}$ (e.g., 350 pF) to a voltage $V_{INT}$ (e.g., greater than 400 mV) in the strobe-cycle itself.

Figure 4:
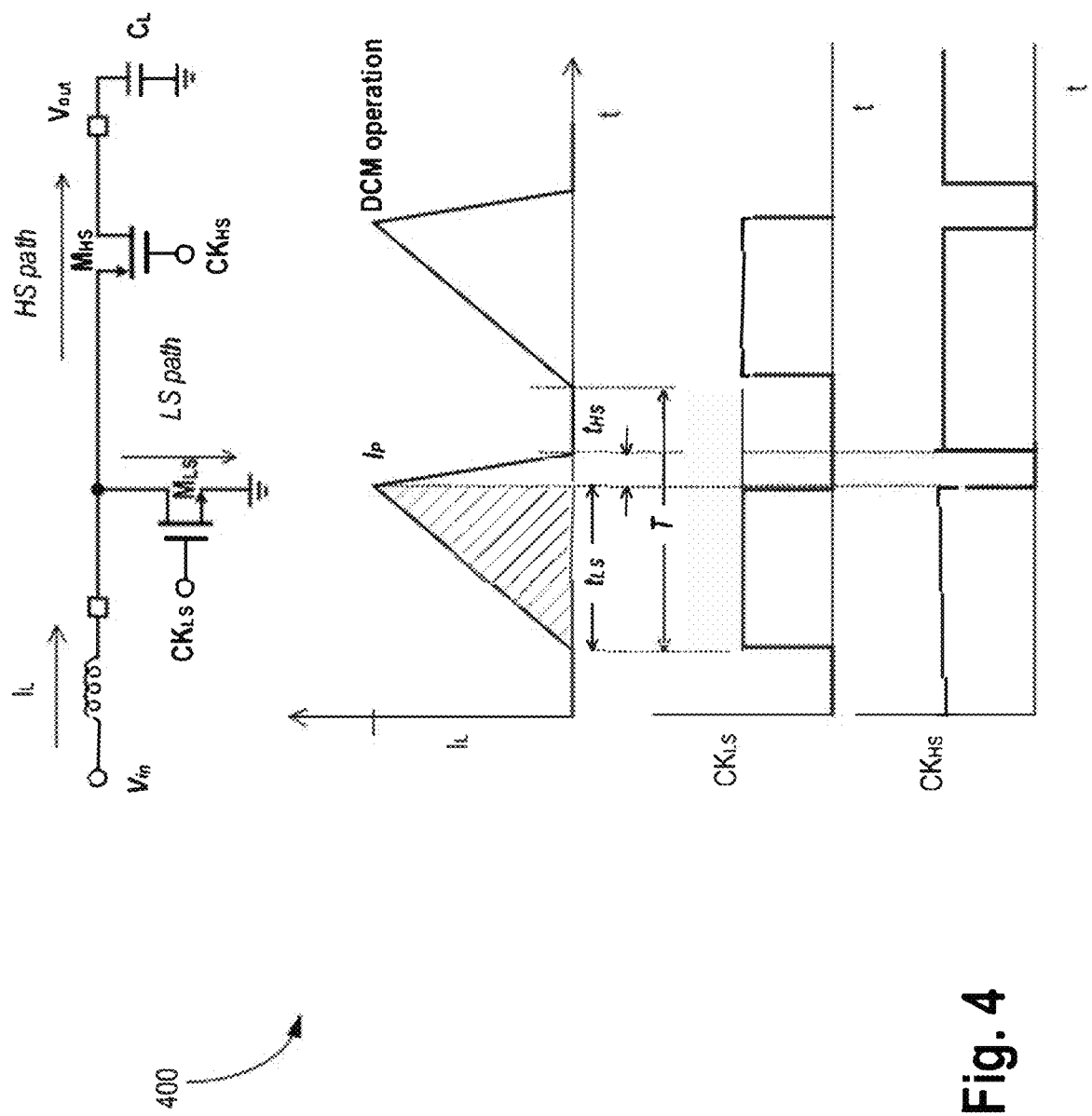
FIG. 4 illustrates a plot showing conduction losses of a boost converter.
Figure 5:
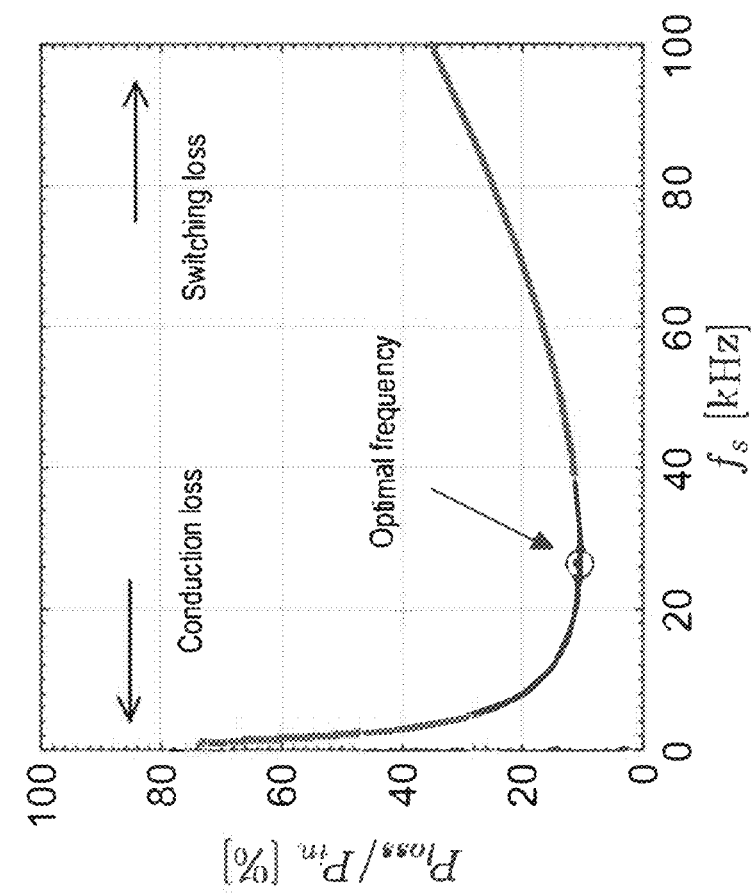
FIG. 5 illustrates a plot showing total losses normalized to input power vs. change in switching frequency.

FIG. 4 illustrates plot 400 showing conduction losses of a boost converter. FIG. 5 illustrates plot 500 showing total losses normalized to input power vs. change in switching frequency. End-to-end power efficiency of the harvester (e.g., 100 or 200) depends on power transfer efficiency from source ($V_{TEG}$) to input ($V_{IN}$) of the boost converter, as well as power efficiency of the converter from $V_{IN}$ to $V_{OUT}$. Both are optimized simultaneously to maximize output power of the harvester.

While harvesting human body heat, the available power from TEG 101 at small ΔT being low, the DC-DC converter should transfer most of it to the output to provide usable power to the load electronics. Final extracted output power of the harvester depends on (a) efficiency of the boost converter as well as (b) impedance matching at the input of the converter for MPT (maximum power transfer).

In a synchronous inductive boost converter of FIG. 4, the inductor L is energized with current, $I_L$ from the source by turning ON a low-side (LS) switch, $M_{LS}$ in one phase, $t_{LS}$. In the other phase, $t_{HS}$, the high-side (HS) switch, $M_{HS}$ is turned ON synchronously to transfer energy from the inductor to the output and charge the load capacitor, $C_L$. In DCM operation, the inductor energy stored in $t_{LS}$ phase is completely transferred to the output during the $t_{LS}$ phase every CK cycle. To avoid reverse flow of energy from the output back to the inductor, $t_{HS}$ is properly timed to keep $M_{HS}$ ON only until $I_L$ remains above zero. Converter efficiency depends on losses, which primarily comprise conduction and switching losses. The conversion gain (K) of the boost converter can be formulated as:

$$K = \frac{V_{OUT}}{V_{IN}} = \left(1 + \frac{t_{LS}}{t_{HS}}\right) \qquad (1)$$

$$V_{out} = V_{in}\left(1 + \frac{t_{LS}}{t_{HS}}\right)$$

where $t_{LS}$ is the on-time of the low-side switch $M_{LS}$ and $t_{HS}$ is the on-time of the high-side switch $M_{HS}$. At a small $V_{in}$, the required conversion ratio K is high to achieve $V_{out}$ above 1 V. As such, conduction loss during $t_{HS}$ is negligible compared to that during $t_{LS}$ as shown in FIG. 5, hence, on-resistance of the low-side path dominates the condition loss $P_{cn}$. For example, for applications with small $V_{IN}$, required K is high and thereby, $t_{LS}/t_{HS}$. The current, $I_L$ is assumed to be linearly changing with time during $t_{LS}$ and $t_{HS}$ and hence peak inductor current, $I_P=V_{IN}t_{LS}/L$. The linearity holds true as long as $t_{LS}$ L/$R_{LS}$, where $R_{LS}$ represents the on-resistance of $M_{LS}$. The amount of input power, $P_{IN}$ that flows into the converter during this process can be calculated as:

$$P_{IN} = \frac{1}{T} \cdot \frac{1}{2} \cdot V_{IN} I_P (t_{LS} + t_{HS}) \approx \frac{1}{2} \cdot \frac{V_{IN}^2 t_{LS}^2}{LT} \qquad (2)$$

where T is the time period of the switching clock.

At the same time, a considerable amount of power, $P_C$ is lost due to the conduction through the on-resistance of $M_{LS}$ while energizing the inductor in $t_{LS}$, and through that of $M_{HS}$ during charging $C_L$ in $t_{HS}$ which can be derived as follows:

$$P_C = \qquad (3)$$
$$P_{C,LS} + P_{C,HS} = \frac{1}{T}\int_0^{t_{LS}}\left(\frac{I_P t}{t_{LS}}\right)^2 R_{LS} dt + \frac{1}{T}\int_0^{t_{HS}}\left(I_P + \frac{I_P t}{t_{HS}}\right)^2 R_{HS} dt =$$
$$\frac{1}{3}\frac{I_P^2}{T}(R_{LS}t_{LS} + R_{HS}t_{HS})$$

Expressing $t_{HS}$ and $I_P$ in (3) in terms of $t_{LS}$, the following is derived:

$$P_C = \frac{1}{3} \cdot \frac{V_{IN}^2 t_{LS}^3 R_C}{L^2 T} \qquad (4)$$

where $R_C=(R_{LS}+R_{HS}/K)$ represents the cumulative conduction resistance contributed by LS (low-side) and HS (high-side) switches. It should be noted here that the DC resistance of the inductor being in the conduction path also contributes to $P_C$, and can be considered as a part of $R_C$ but is usually small. It is evident that for high values of K, conduction loss contributed by the LS path dominates over that of the HS path as depicted by the hashed area in FIG. 4.

The control circuits being powered by the converter, consume a portion of the output power and appear as control losses. A majority of this is the switching loss of the drivers for the large LS and HS switches. Other quiescent power consumption due to leakage currents is small and can be neglected for simplicity. If the total lumped switch gate capacitance of the control circuit is $C_{SW}$, the switching loss, $P_{SW}$, of the control circuits is:

$$P_{SW} = C_S V_{OUT}^2 f_s = C_S K^2 V_{IN}^2 f_s \qquad (5)$$

where $f_s=1/T$ is the switching frequency

Apart from these two primary losses, there exists other losses like synchronization losses and losses due to parasitics. The synchronization losses are incurred due to the timing errors of the switching clocks, $CK_{LS}$ and $CK_{HS}$, during transitions. Whereas, charging and discharging of the parasitic capacitors of the switches at node $V_S$ every cycle result in parasitic losses. But these losses are significantly small compared to the two primary losses explained earlier.

Switching losses, $P_{SW}$, result from charging of gate capacitances of control circuits each cycle. Lowering conduction losses demands low-resistance paths, resulting in wider LS (low-side) and HS (high-side) switches with significantly higher gate capacitances than other control circuit transistors. Hence, switching power of LS and HS switch drivers dominates $P_{SW}$. Apart from these losses, there exists some static current consumption, such as for reference voltage generation, which is comparatively small and can be neglected. Total power loss, $P_{loss}$, in the converter can there be expressed as:

$$P_{loss} = P_C + P_{sw} \quad (6)$$
$$P_{loss} = P_{cn} + P_{sw}$$
$$P_{loss} = \frac{1}{3}\frac{V_{in}^2 R_{LS} D^3}{L^2}\frac{1}{f_s^2} + CV_{out}^2 \cdot f_x$$

where $D=t_{LS}/f_s$ is the duty cycle of the switching clock with frequency $f_s$, $R_{LS}$ comprises DC resistance of inductor L and on-resistance of $M_{LS}$, and C is the total gate capacitance of the switches. Simulated variation of these losses with $f_s$ in FIG. 5 roughly follows equation (6) and indicates an optimal frequency where efficiency of the converter is maximized. It should be noted that for higher $V_{in}$ (e.g., greater than 50 mV), $t_{HS}$ continues to increase equation (1) and adds additional conduction loss to the high-side path.

Equation 6 indicates the concave nature of the loss of the converter with respect to $f_S$, where conduction loss dominates at lower $f_S$ and switching loss dominates at higher $f_S$, as evident in the simulated plot 500 in FIG. 5. Hence, there exists an optimal $f_S$ at which $P_{LOSS}/P_{IN}$ is minimum for a fixed conversion ratio, duty-cycle, switch resistance and inductor value. Minimum normalized loss maximizes the efficiency of the DC-DC converter ($\eta_{DCDC}$) as, $$\eta_{DCDC} = \frac{P_{IN}-P_{LOSS}}{P_{IN}} = 1 - \frac{P_{LOSS}}{P_{IN}} \quad (7)$$

Figures 6A, 6B:
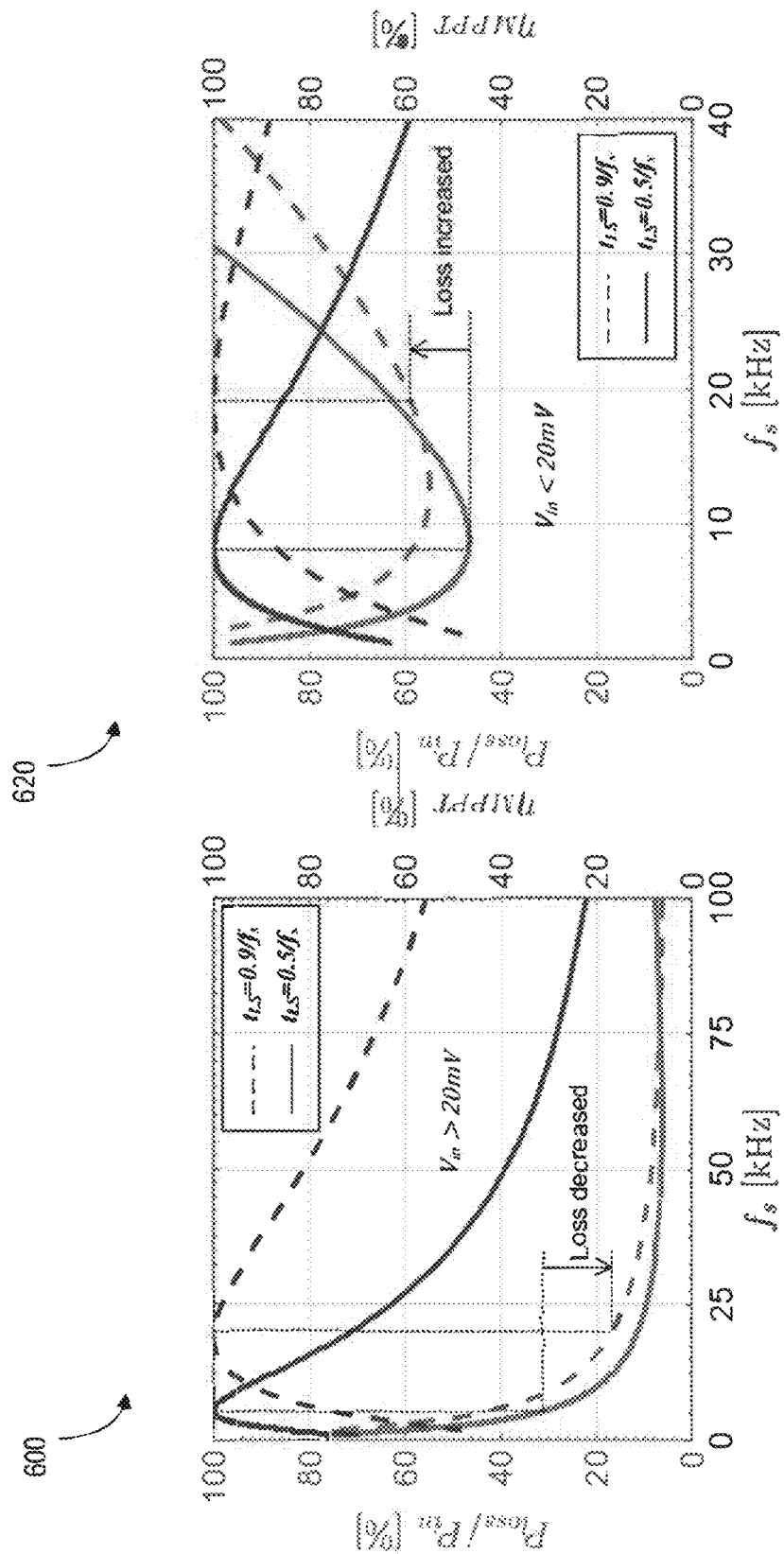
FIG. 6A illustrates plots showing loss-optimization ensuring MPPT where for higher voltage (e.g., Vin>20 mV), conduction loss dominates.
FIG. 6B illustrates plots showing loss-optimization ensuring MPPT where for ultra-low voltage (e.g., Vin<20 mV), switching loss is comparable to input power.

FIG. 6A illustrates plot 600 showing loss-optimization ensuring MPPT where higher voltage (e.g., $V_{in}$ greater than 20 mV), conduction loss dominates. FIG. 6B illustrates plot 620 showing loss-optimization ensuring MPPT where ultra-low voltage (e.g., $V_{in}$ less than 20 mV), switching loss is comparable to input power.

To maximize power transfer from $V_{TG}$ to $V_{in}$, the input resistance, $R_{in}$, of the converter is matched (or substantially matched) to the source resistance, $R_{TG}$, which can be done by tracking the input voltage of the converter using active sensing circuits. However, as TEGs have a nearly constant source resistance across the temperature range required for body heat energy harvesting, tuning $R_{in}=R_{TG}$ once can achieve MPPT across the voltage range without burning additional power for continuous MPPT operation. The equivalent $R_{in}$ of the boost converter depends on D and $f_s$ and can be expressed as:

$$R_{in} = \frac{2Lf_s}{D^2} \quad (8)$$

For a chosen L, input matching can be achieved by changing both $f_s$ and D. Fixing D to a single value may result in an $f_s$ that deviates from the optimal point of equation (2), resulting in lower efficiency of the converter. Hence, while one-dimensional MPPT can assure maximum power transfer at the input, it may not maximize converter output power.

TEGs have low source resistance, $R_{TG}$, typically a few ohms. For moderate value of D (0.5) in equation (8), this results in a low $f_s$ for MPPT. Consequently, this leads to higher conduction time, $t_{LS}$, increasing conduction losses and reducing converter efficiency. As D is increased, required $f_s$ for MPPT increases in squared proportion, which effectively decreases $t_{LS}$ and reduces conduction losses, as shown in FIG. 6A. Hence, a lower $t_{LS}$ and higher $f_s$ is optimal when conduction loss dominates. However, the same pair of $t_{LS}$, $f_s$ may degrade the efficiency of the converter at very low input voltage. As $V_{in}$ lowers, rapidly decreasing input power makes switching losses at this frequency significant and degrades the efficiency of the converter, which restricts converter operation at very low input voltage. In this case, lower $f_s$ can improve converter efficiency by reducing the switching losses, as shown in FIG. 6B. While the required D for MPPT results in higher $t_{LS}$, the increase in $P_{cn}$ is not significant due to low $V_{in}$, described by equation (6). Hence, using different pairs of $t_{LS}$, $f_s$ at higher and lower input voltage, can improve converter efficiency while achieving MPPT across a wide input voltage range.

FIGS. 7A-B illustrate two operating conditions 700 and 720 of an inverter with low output voltage rail at low power supply, respectively. Inverter 700 comprises p-type transistor MP1 coupled in series with an n-type transistor MN1. Transistor MP1 is coupled to supply $V_{DD}$ while transistor MN1 is coupled to ground. Here, capacitor C is the load capacitor on the output node $V_{OUT}$.

At very low supply voltage, CMOS inverters suffer from low DC gain due to the significant deterioration of transconductance of the transistors. In one example, a minimum supply required for an inverter in a 0.18-μm bulk CMOS process to achieve DC gain greater than unity is 48 mV at 300° K. Hence, this sets the theoretical limiting supply voltage for the operation of a CMOS inverter-based ring oscillator. Low supply voltage also degrades the output voltage rails of an inverter. As shown in FIGS. 7A-B, during an output transition, the difference current ($I_{ON}-I_{OFF}$) between the active and inactive transistors charges or discharges the output. As $V_{OUT}$ changes, $V_{DS}$ of the active transistor decreases and $I_{ON}$ falls, whereas $V_{DS}$ of the inactive transistor increases.

Finally, $V_{OUT}$ settles to $V_H$ or $V_L$ when $I_{ON}=I_{OFF}$. For a transistor in sub-threshold operation with device width W and length L, drain current $I_D$ is given by:

$$I_D = I_O \cdot \frac{W}{L} \cdot e\left(\frac{|V_{GS}|-|V_{th}|}{\eta V_T}\right) \cdot \left(1 - e^{-\frac{|V_{DS}|}{V_T}}\right) \quad (9)$$

where $I_0$ ($=\mu_0 \cdot C_{ox} \cdot (\eta-1) \cdot V_T^2$), is constant, the sub-threshold swing factor, $V_{th}$ is the threshold voltage, and $V_T$ is the thermal voltage. At very low supply, when $V_{GS}<<V_{th}$ and $V_{DS}$ is approximately equal to $V_T$, $I_D$ strongly depends on $V_{DS}$. Thus, an increase in $V_{DS}$ of the inactive transistor during $V_{OUT}$ transition results in a significant increase of $I_{OFF}$. Thereby, the difference current vanishes well before $V_{OUT}$ reaches the supply rail ($V_{DD}$ or GND) and reduces the output voltage rail ($V_H-V_L$) of the inverter. In this example, the simulated output rail is 20% lower than supply rail (50 mV) in 0.1.8-μm CMOS. As a consequence, the output clock of a CMOS inverter-based ring oscillator exhibits degraded voltage swing at low supply.

Figure 8:
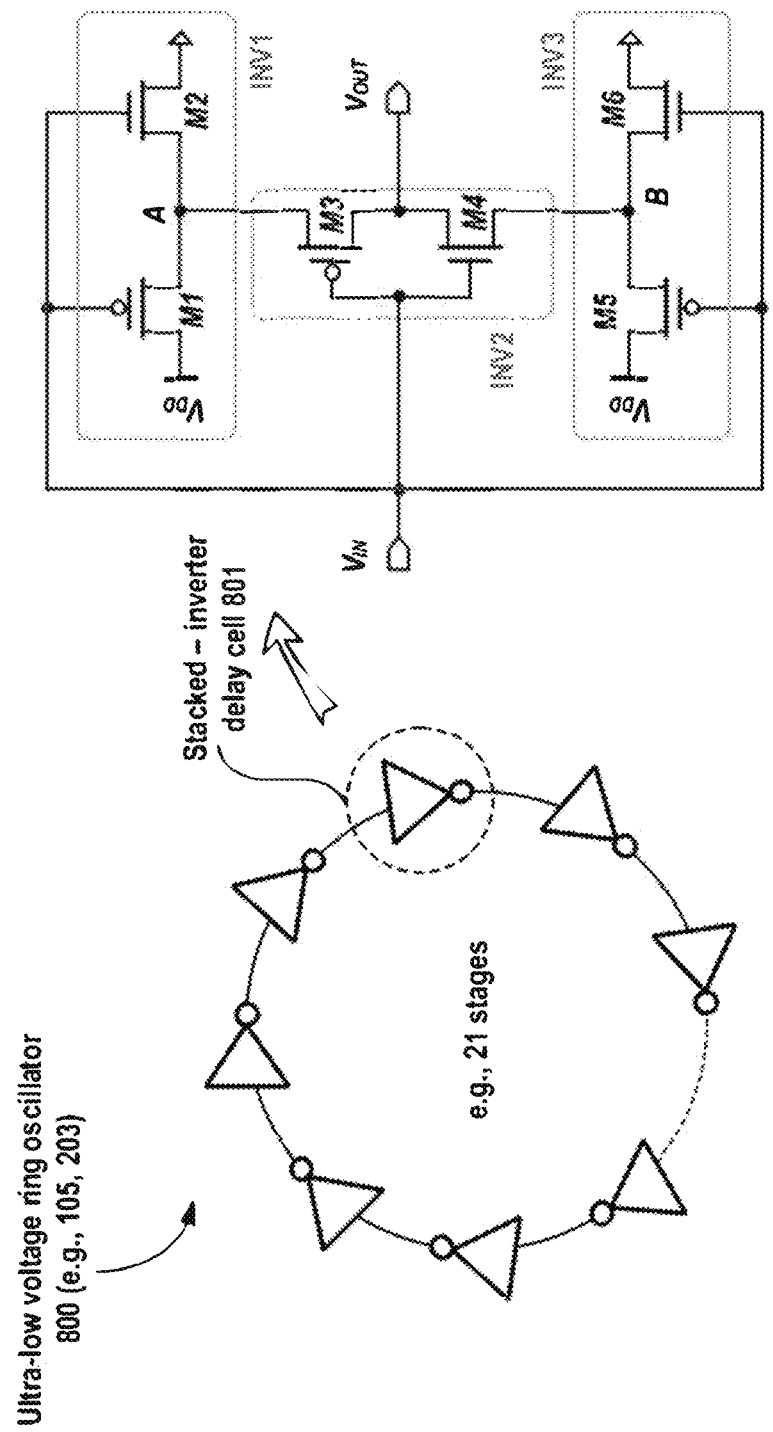
FIG. 8 illustrates an ultra-low voltage ring oscillator comprising stacked-inverter based delay cells, in accordance with some embodiments.

FIG. 8 illustrates an ultra-low voltage ring oscillator 800 comprising stacked-inverters based delay cells, in accordance with some embodiments. In various embodiments, oscillator 105 is used for the operation of the start-up voltage multiplier 106. Ring oscillators comprising a series of delay stages in a closed loop are easy to integrate and have been used to generate start-up clocks. To create sustained oscillation, required gain (A) of each delay stage and total number of stages (n) can be derived from the Barkhausen criteria for oscillation as follows:

$$A \geq \sqrt{1+\left(\frac{\omega_o}{\omega_p}\right)^2} \text{ and}$$

$$n = \pi \Big/ \tan^{-1}\left(\frac{\omega_o}{\omega_p}\right) \tag{10}$$

where $\omega_0$ is the frequency of oscillation and $\omega_p$ is the pole frequency contributed by each delay stage. As such, a smaller gain (A) requires a higher number of delay stages (n) for oscillation and results in a low output frequency ($\omega_0$) of the ring oscillator.

Dynamic reduction of the leakage current $I_{OFF}$ can improve output voltage swing at low supply. To achieve this, a delay element 801 is used which comprises of three inverters, arranged as shown. The outputs of inverters INV1 and INV3 are connected to the sources of p-type and n-type transistors of inverter INV2, respectively.

Figures 9A, 9B:
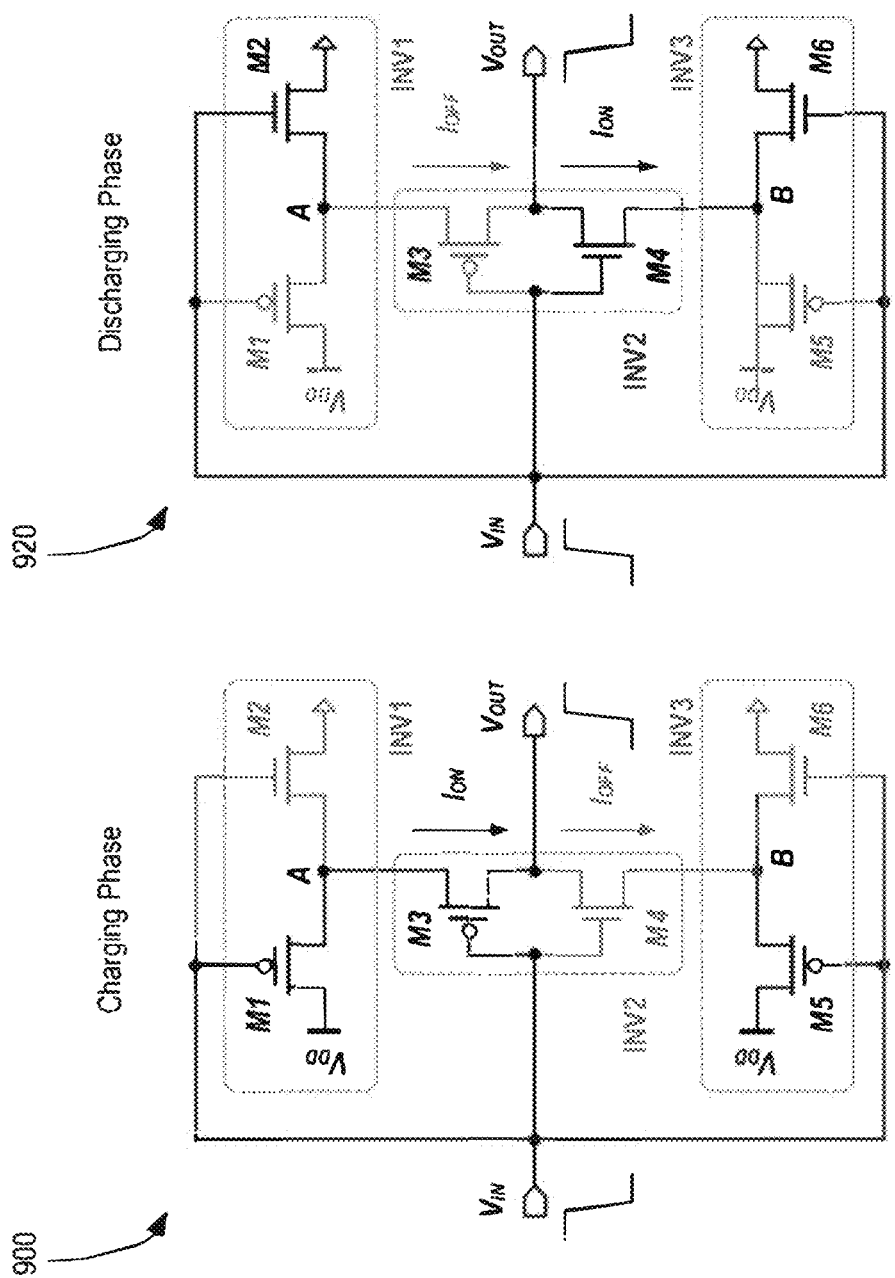
FIGS. 9A-B illustrate leakage current suppression in the delay cell in charging and discharging phases, respectively, in accordance with some embodiments.

During the charging phase, a high-to-low transition of VLSI causes INV3 to pull node B to $V_{DD}$, as shown in FIGS. 9A-B. FIGS. 9A-B illustrate leakage current suppression in delay cell 801 in charging phase 900 and discharging phase 920, respectively, in accordance with some embodiments. As mentioned here, the high-to-low transition of $V_{IN}$ causes inverter INV3 in the charging phase 900 to pull node B to $V_{DD}$, and this reduces $V_{DS}$ and $V_{GS}$ across the n-type transistor M4 of inverter INV2 and suppresses the leakage current $I_{OFF}$. During the discharging phase 920, as $V_{IN}$ transitions from low to high, inverter INV1 pulls node A down to ground (GND) and suppresses $I_{OFF}$ through the p-type transistor M3 of inverter INV2 by reducing both $V_{SD}$ and $V_{SG}$ across it. However, $|V_{DS}|$ drop across transistors M1 or M6 in the path of $I_{ON}$ will reduce effective $V_{GS}$ across the active transistors, M3 and M4, respectively, in corresponding phases. This may reduce effective $I_{ON}$ and nullify the effect of lowering $I_{OFF}$. To alleviate, transistors M1 and M6 are sized substantially three times the width of M3 and M4, respectively, while M2 and M5 are substantially same dimensions as M4 and M3, for example.

Compared with other leakage suppression techniques, such as Schmitt trigger logic, the stacked-inverter delay cell 801 provides more effective leakage current bypassing at low supply by applying maximum $V_{GS}$ to M5 and M2 in the respective phases. It also yields faster pull-up and pull-down actions of M5 and M2; with the transition of $V_{IN}$, $I_{OFF}$ is blocked at the onset of the $V_{OUT}$ transition. Note that, although the leakage current $I_{OFF}$ is suppressed from the output in both the phases, additional leakage currents through the bypass transistors, M2 and M5, increases total current consumption of the delay block compared with a simple CMOS inverter. However, the increase in power consumption is negligible compared with other blocks when used in a complete energy harvester architecture.

Figure 10:
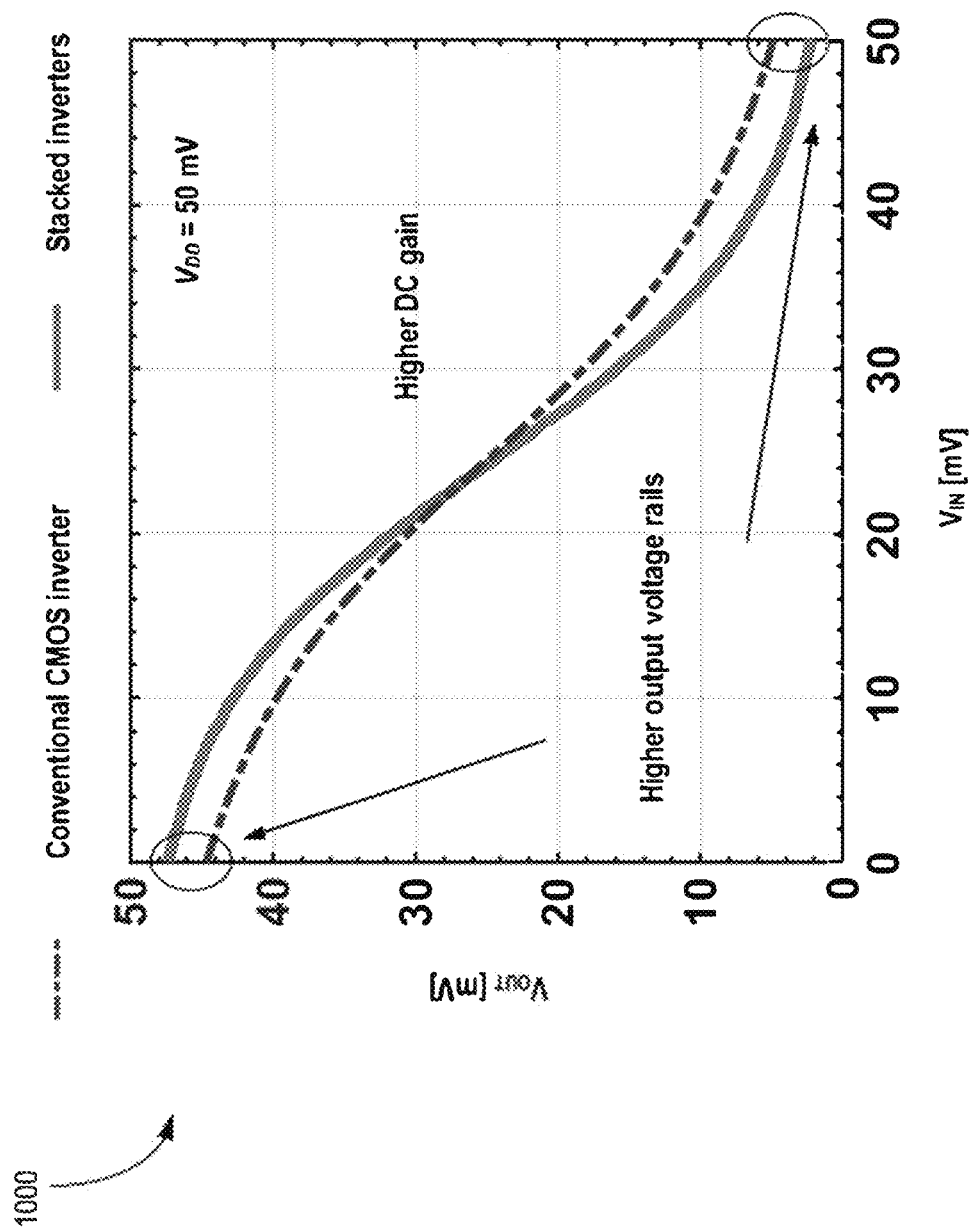
FIG. 10 illustrates a plot showing simulated VTC of the delay cell of FIG. 8, in accordance with some embodiments.

Low-$V_{th}$ transistors are used to increase conduction at the low supply voltage. FIG. 10 illustrates plot 1000 showing simulated voltage transfer characteristic (VTC) of the delay cell 801 of FIG. 8, in accordance with some embodiments. The simulated VTC of the stacked-inverter delay block 801 in a 0.18-μm CMOS process is shown in plot 1000, which demonstrates a 13.3% improvement in output voltage rails and 32.5% higher DC gain compared with those of a CMOS inverter (INV2 alone) at a supply of 50 mV. The enhanced gain is due to the higher output impedance $R_o$ at the final output of the delay element, which can be expressed as:

$$R_o = [r_{o3} + (1 + g_{m3}r_{o3})R_{o1}] \| [r_{o4} + (1 + g_{m4}r_{o4})R_{o3}] \tag{11}$$

where $R_{o1}$ and $R_{o3}$ are the output impedances of inverters INV1 and INV3, respectively, at the DC operating point. Referring back to FIGS. 9A-B, while the cascading effects of transistors M3 and M4 are small due to the small intrinsic gains, $g_{m3}r_{o3}$ and $g_{m4}r_{o4}$, at the low supply voltage, $R_o$ of the stacked-inverter delay cell is still higher than the output impedance $(r_{o3}\|r_{o4})$ of inverter INV2 alone. The $g_m$ of transistors M1-M6 together contributes to the delay cell trans-conductance, Referring back to FIG. 8, ring oscillator 800 is illustrated using 21 stages of the stacked inverter delay element to generate the start-up clock. However, any odd number of stages can be used. At a supply of 50 mV, the simulated frequency of the clock is 9.4 kHz at the typical corner; the frequency ranges between 2 kHz and 38 kHz across process corners.

Figure 11:
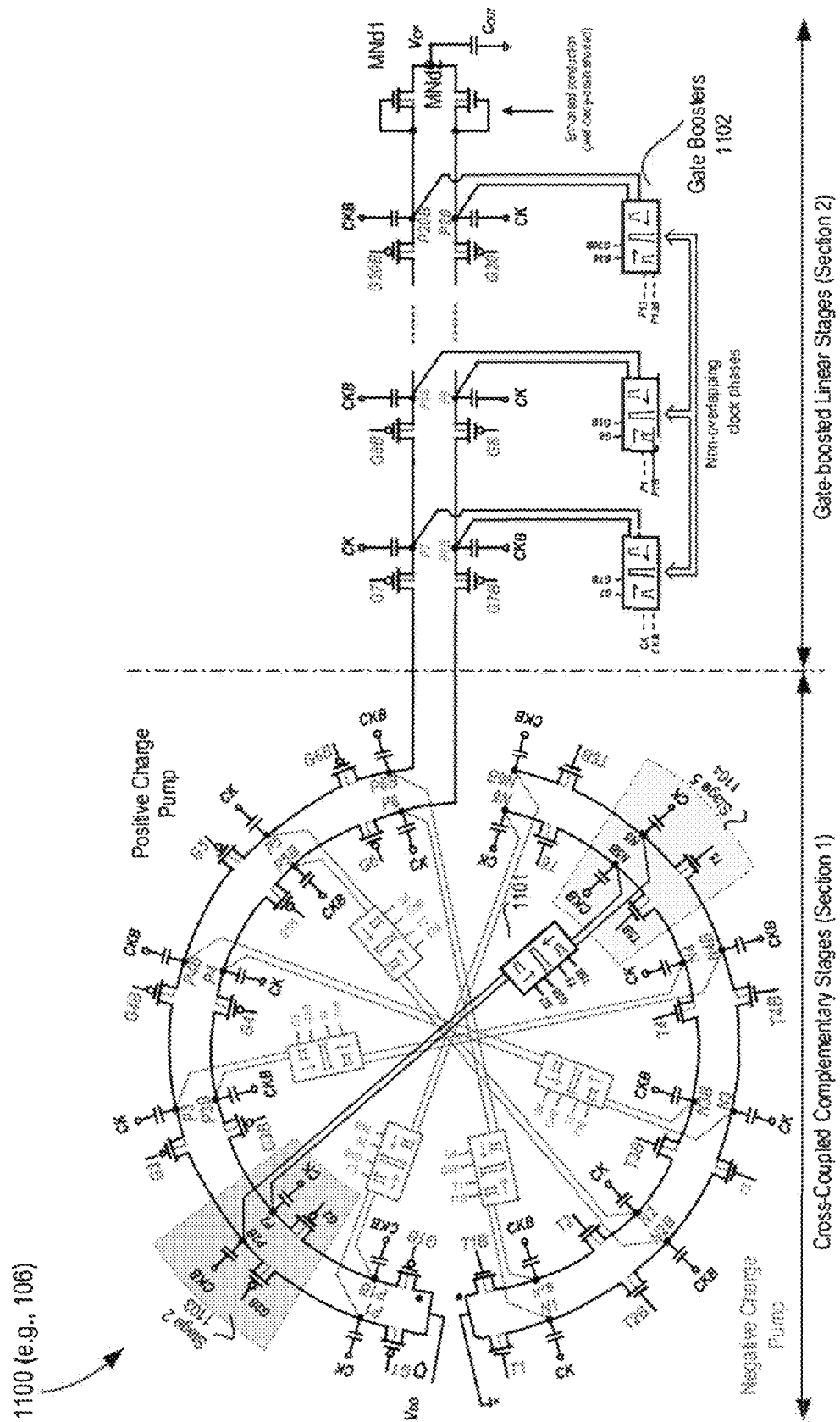
FIG. 11 illustrates a start-up voltage multiplier with cross-coupled complementary charge pumps for high gate-boosting and low voltage operation, in accordance with some embodiments.

FIG. 11 illustrates start-up voltage multiplier 1100 (e.g., 106) with cross-coupled complementary charge pumps for high gate-boosting and low voltage operation, in accordance with some embodiments. A voltage multiplier 106 is used during start-up to boost the input voltage and power the cold-start control circuits. Low swing and low frequency of the pumping clock make designing such a multiplier especially challenging at low voltage. There are two sections of start-up voltage multiplier 1100. The first section comprises the cross-coupled complementary stages, while the second section is the gate-boosted (GB) linear section. In this example, the first section start-up charge pump comprises a six-stage positive charge pump (CP+) 106*b* and a six-stage negative charge pump (CP−) 106*a*, each operating in dual phases. The supply voltage $V_{DD}$ is applied to the CP+ input, and the input of the CP− is connected to GND. P-type switches are used as charge transfer switches (CTSs) in CP+ 106*b* whereas the isolated deep-n-well n-type switches are used as CTSs in CP− 106*a*. The complementary charge pumps mutually boost the gate drive of their CTSs. Dual-phase voltages from later stages of CP− 106*a* are borrowed to generate CTS gate docks for earlier stages of CP+ 106*b*.

Figure 12:
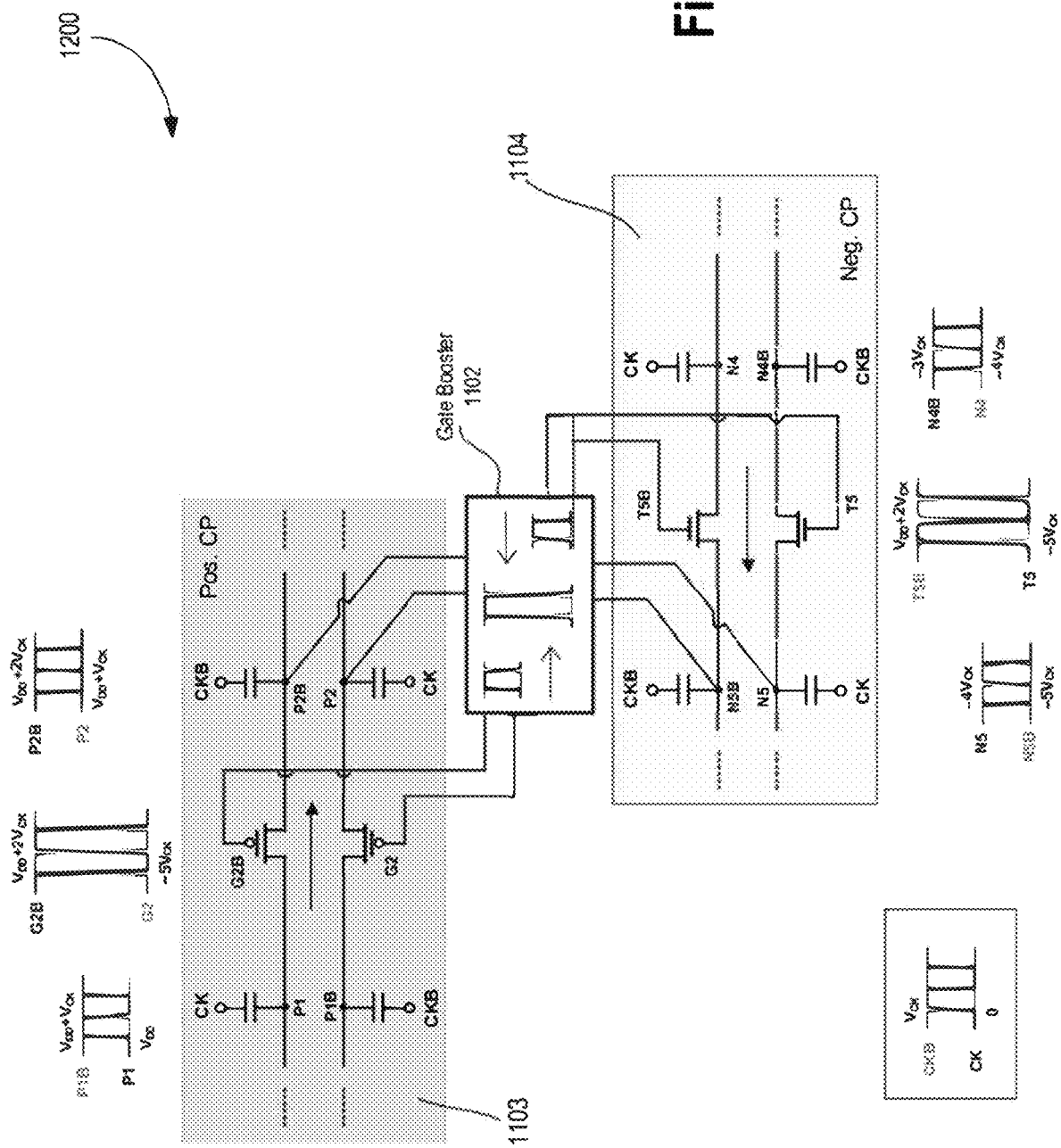
FIG. 12 illustrates a circuit for a mutual voltage boosting of gate clocks borrowing dual phased outputs of complementary charge pumps, in accordance with some embodiments.

As shown in FIG. 12, which illustrates circuit 1200 for a mutual voltage boosting of gate clocks borrowing dual phased outputs of complementary charge pumps, in accordance with some embodiments, negative dual-phase voltages N5 and N5B from the fifth stage of CP− 106*a* (1104) and positive dual-phase voltages P2 and P2B from the second stage of CP+ 106*b* (1103) are used to generate gate clocks G2 and G2B that swing between a higher voltage level of P2-P2B and a lower voltage level of N5-N5B for the p-type switches of the second stage of CP+ using a gate-boost (GB) circuit 1102. The high negative-voltage swing of the gate dock boosts the gate drive, $V_{SG}$ of the p-type switch to $V_{DD}+6V_{CK}$ in the charge transfer phase while ensuring $V_{SG}=0$ in the non-conduction phase.

However, as CP− 106*a* also exhibits poor CTS conductance at low voltage, negative voltage rail of the gate clocks will be affected, thereby lowering the effective $V_{SG}$ value of the CTSs in CP+ 106*b*. A fully complementary structure of the charge pumps addresses this problem, where the dual-phase voltage outputs of the complementary charge pump CP+ 106*b* are utilized to improve the CTS conductance of CP− 106*a*. With the drain and source of the n-type switch of CP− 106*a* connected to the boosted negative voltages, the positive voltage of gate clocks T5 and T5B utilizing a higher voltage level P2-P2B from CP+ 106*b* will increase the gate drive $V_{GS}$ of n-type switches of the fifth stage of $CP^-$ 106a to $V_{DD}+6V_{CK}$ during the change transfer phase enhancing conduction. In a similar fashion, complementary outputs of the first $CP^+$ stage and sixth $CP^-$ stage, third $CP^+$ stage and fourth $CP^-$ stage, and so on generate CTS gate clocks of respective stages with the help of GBs. This complementary gate boosting action improves the pumping efficiency of both charge pumps.

As shown in FIG. 11, the final 14 stages of the start-up charge pump further boost the output of $CP^+$ 106b using p-type switches whose gate clocks are generated borrowing lower voltages from earlier stages. The final stage of the charge pump uses the diode-connected deep-n-well n-type devices to prevent reverse charge flow during output voltage droop due to load transients. It is important to note that, although the gate boosting of the negative charge pump causes additional loading, the voltage drop in the load path from this effect is small ($I_{GB}.[1+2+\ldots+6]R_o=21I_{GB}R_o$), as voltages are borrowed from the initial six stages.

Low-$V_{th}$ devices are used for CTSs to improve charge transfer. While these exhibit higher leakage current compared with regular-$V_{th}$ devices, enhanced conductivity with boosted gate drive makes reverse leakage negligible. The deep-n-well of the isolated NMOS devices in $CP^-$ 106a is shortened to GND, whereas the local body is shortened to the source and connected to the nearest minimum voltage terminal. This allows the NMOS switches to handle negative voltages without forward biasing the deep-n-well junction and without $V_{th}$ degradation due to body bias. High-density MOS capacitors, each 20 pF, are used as pumping capacitors, optimizing switching resistance $1/(Cf_{CK})$ while ensuring slow switching limit operation by keeping charging time constant (C $R_{ON}\ll 1/f_{CK}$). In one example, a 120-pF decoupling capacitor $C_{OUT}$ is added to the final output $V_{CP}$ using MOS capacitors.

Figure 13A:
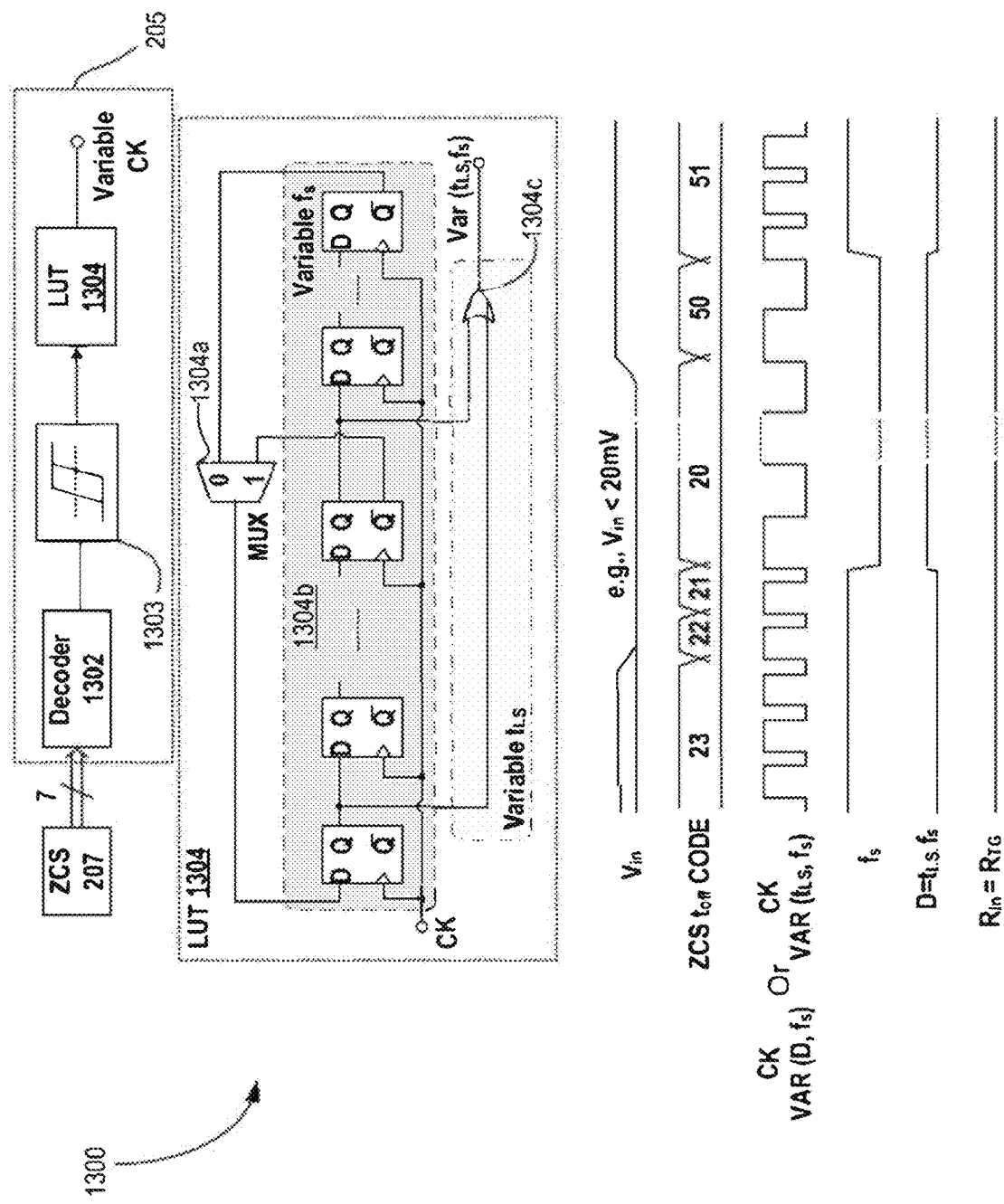
FIG. 13A illustrates a circuit to generate variable clock, in accordance with some embodiments.

FIG. 13A illustrates circuit 1300 to generate variable clock, in accordance with some embodiments. Circuit 1300 comprises zero current sensing (ZCS) circuitry 207 and variable clock circuit 205. In some embodiments, variable clock circuit 205 comprises decoder 1302, comparator 1303 with hysteresis, and lookup table (LUT) 1304. LUT 1304 comprises multiplexer (MUX) 1304a, chain of flip-flips 1304b, and OR gate 1303c coupled as shown.

As discussed with reference to FIGS. 6A-B, while the required D for MPPT results in higher $t_{LS}$, the increase in $P_{cn}$ is not significant due to low $V_{in}$, described by (2). Hence, using different pairs of $t_{LS}$, $f_s$ at higher and lower input voltage can improve converter efficiency while achieving MPPT across a wide input voltage range. Circuit 1300 shows an adaptive on-time and frequency pair $t_{LS}$, $f_s$ which implemented using a digital look-up table (LUT) 1304, which comprises of a programmable clock-divider having a chain of flip-flops 1304b and combinatorial logic OR gate 1304c. Information about the input voltage level is extracted from the existing control blocks. For a fixed $V_{out}$ and $t_{LS}$ equation (1) reveals $V_{in}$ is proportional to ties. As ZCS block 207 increments or decrements a counter to adjust $t_{HS}$ for the desired conversion ratio, the counter value is reused to choose the right $t_{LS}$, $f_s$ pair. A digital hysteresis 1303 is added to account for a change in $t_{HS}$ with a change in $t_{LS}$. The delay elements in the ZCS block 207 are also selectively powered at the onset of each cycle to scale the switching loss with $V_{in}$.

Figure 13B:
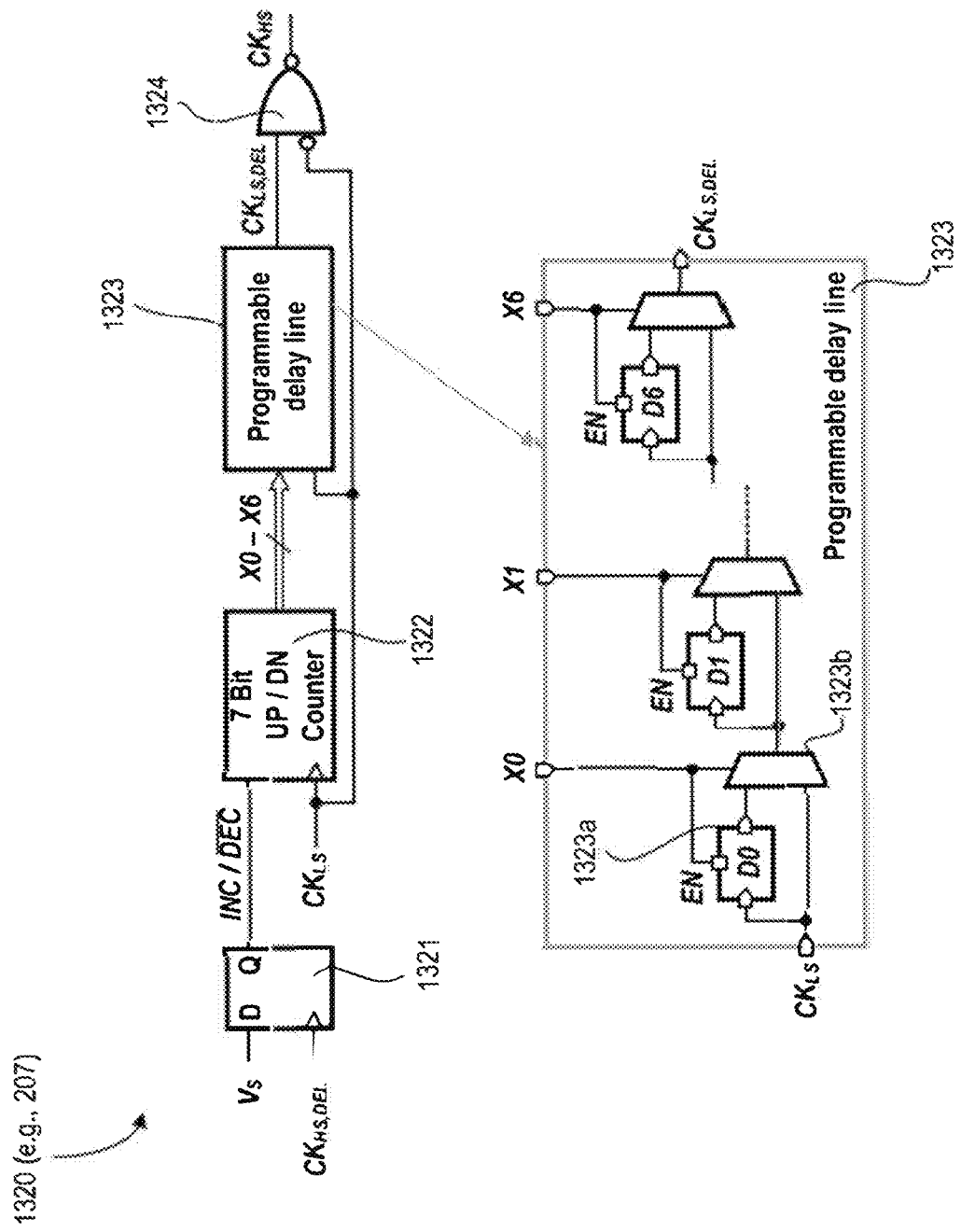
FIG. 13B illustrates a zero current sensing (ZCS) circuit, in accordance with some embodiments.

FIG. 13B illustrates a zero current sensing (ZCS) circuit 1320 (e.g., 207), in accordance with some embodiments. ZCS circuit 1320 comprises flip-flop 1321, up/down counter 1322, programmable delay line 1323, and logic gate 1324 coupled as shown. The synchronous boost converter is operated in DCM mode favorable for low power operations. In this mode of operation the inductor is disconnected from the output once the current, $I_L$ reaches the zero point to avoid reverse flow of current from output to the inductor. Instead of analog sensing a digital flip-flop based zero current sensing is adopted to save power, in accordance with various embodiments.

Flip-flop 1321 of ZCS circuit block 1320 tracks the zero point of $I_L$ by sensing the voltage, $V_S$. The flip-flop is triggered with the rising edge of $CK_{HS,DEL}$, a delayed version of the HS switch clock, $C_{HS}$ to sense $V_S$ at the data input of the flop. Note that the delay in $CK_{HS}$ has a role in sensing the overshoot or undershoot of $V_s$. The rising edge of $CK_{HS,DEL}$ will sense a high $V_s$ at the flop input when the inductor energy is not fully transferred to the output and $I_L$ is approaching the zero value. The resulting output (INC/DEC) increments a counter and creates a longer delay between the falling edges of $CK_{LS}$ and $CK_{LS,DEL}$ with programmable delay block 1323. It helps in generating a wider low phase of $CK_{HS}$ in the next cycle and hence improves the inductor energy transfer with a longer on-time of the HS switch. A low in the INC/DEC signal indicates that inductor energy has already transferred to the output and reverse current has started to flow from the output capacitor to the input. This directs counter 1322 to decrement its current value and hence the delay is reduced to generate a smaller on-time of the HS switch in the following cycle. At steady state, the counter value switches to and fro between two adjacent values in consecutive clock cycles. This kind of digital sensing avoids static current flow and reduces the power consumption significantly. However, to accommodate a wide range of input voltage, the programmable delay block 1323 is capable of generating very small delay to large delay for high to low conversion ratios respectively.

Figure 13C:
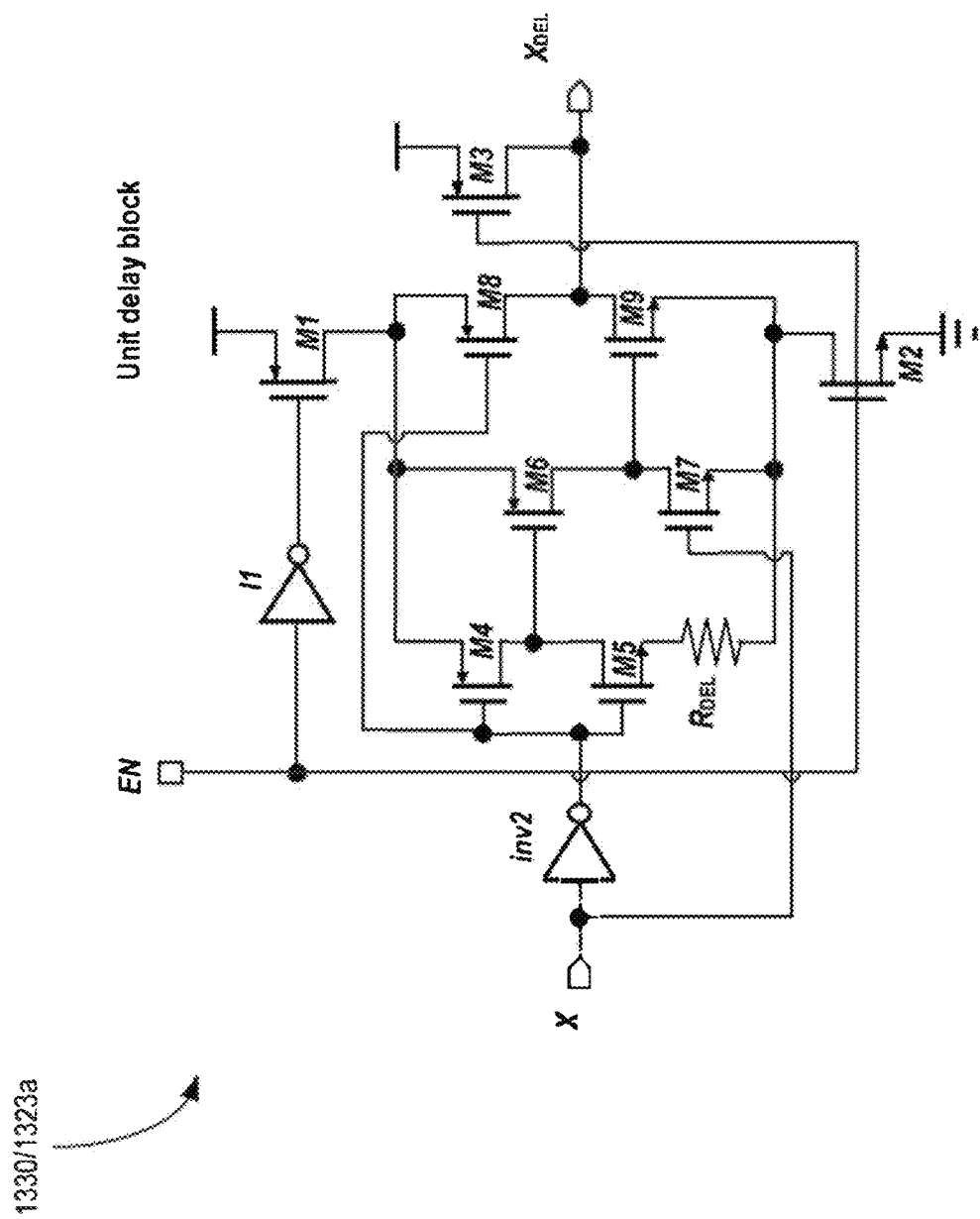
FIG. 13C illustrates a unit delay circuit of a programmable delay circuit of the ZCS circuit of FIG. 13B, in accordance with some embodiments.

In some embodiments, the programmable delay line 1323 comprises delay cells 1323a (e.g., D0, D1, . . . ) and multiplexer 1323b coupled as shown. FIG. 13C illustrates another unit delay circuit 1330 (e.g., 1323a) of a programmable delay circuit of ZCS circuit 1320 of FIG. 13B, in accordance with some embodiments. Delay circuit 1330 comprises inverters i1 and inv2, p-type transistors M1, M3, M4, M6, and M8, n-type transistors M2, M7, and M9, and resistive discharge $R_{DEL}$ coupled as shown. The resistive discharge $R_{DEL}$ may be parasitic resistance, in accordance with some embodiments.

Implementation of delay blocks with capacitive elements not only incurs high switching power consumption (f $CV_{DD}^2$) but also results in high crowbar current due to slow transitions. To avoid that, a programmable delay line is designed utilizing a low power unit delay block as shown in FIG. 13B and FIG. 13C.

Figure 13D:
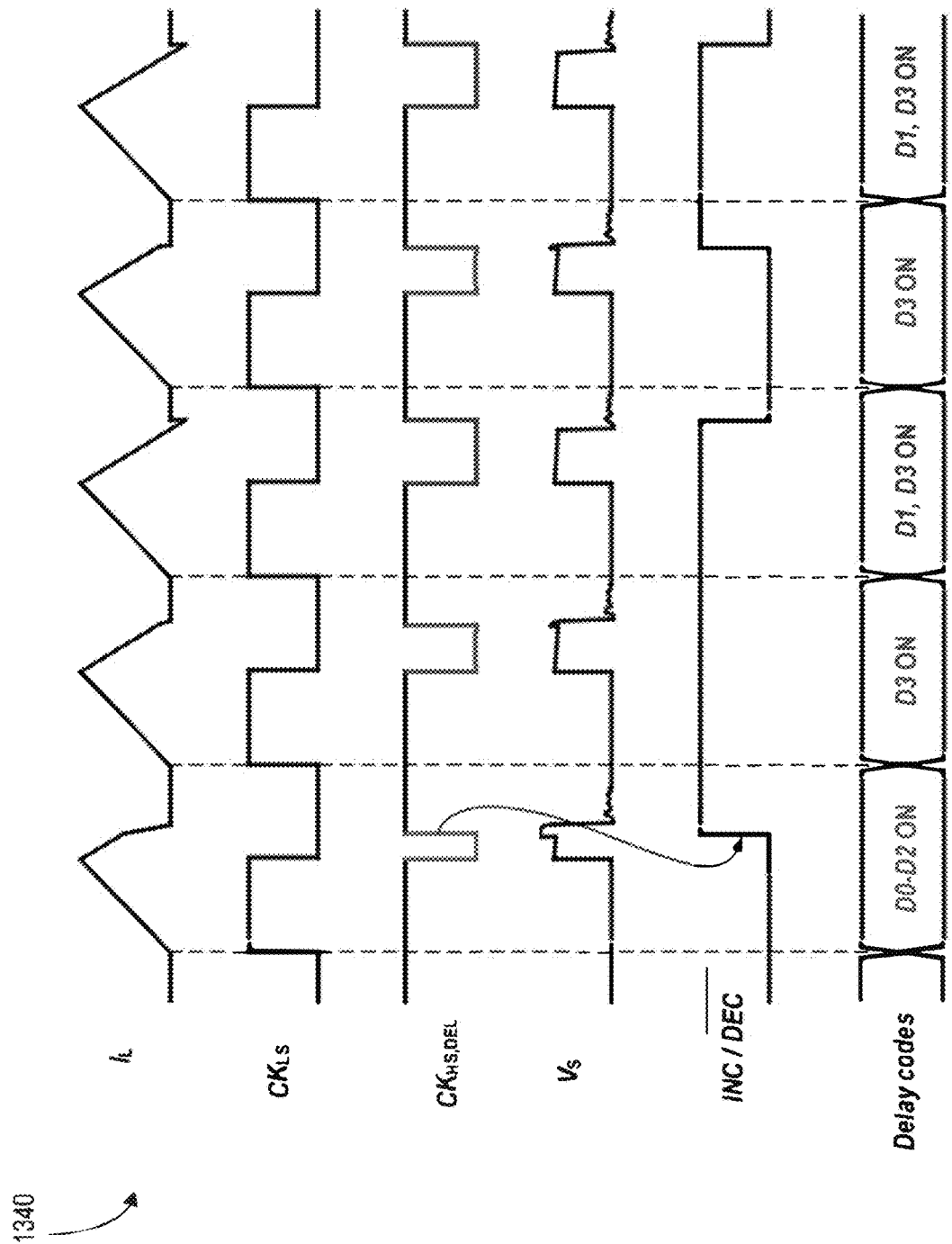
FIG. 13D illustrates a timing diagram showing operation of the ZCS circuit, in accordance with some embodiments.

Resistive discharge path is used to create a delay in the falling edge of the input pulse only. The pull-up and pull-down paths of intermediate inverters are controlled in a way to reduce the crowbar current during the delay time. Also, the delay blocks are enabled when needed, saving a lot of power at low input voltages. FIG. 13D illustrates timing diagram 1340 showing operation of the ZCS circuit, in accordance with some embodiments. The timing diagram shows how the delay blocks are enabled and disabled selectively based on the sensing outcome of flip-flop 1321.

Referring back to FIG. 13A, the proposed LO-MPPT (loss-optimized maximum power point tracking) scheme uses sensing of the input voltage, $V_{IN}$ in order to vary the duty-cycle, D and frequency, $f_s$ of the switching clock. Instead of spending additional power in sensing $V_{IN}$ with a separate block, some embodiments reutilize ZCS circuit 207 to achieve a comprehensive tracking of $V_{IN}$. As long as the output voltage $V_{OUT}$, and ON-time of the LS switch, $t_{ls}$ is fixed, the ON-time of the HS switch, $t_{HS}$ is directly proportional to $V_{IN}$ as evident from (1). Hence, the current value of $t_{HS}$ can be used to track the changes in $V_{IN}$.

The output counter 1322 of ZCS circuit 1320 is proportional to $t_{HS}$ and is used to decode $V_{IN}$ as shown in FIG. 13A. When $V_{IN}$ goes below a threshold (e.g., 20 mV), a switching clock with a lower $f_s$ and a lower D is used to optimize the loss of the converter. Whereas, for higher $V_{IN}$, the $f_s$ and D of the clock is increased. The (D, $f_s$) pair of the clock are generated with the help of the digital circuit of FIG. 13A comprising series of flip-flops to generated different $f_s$. A combinational logic utilizing the internal signals generates two different D's of the output clock.

To avoid to and fro of the switching clock between the two pairs of (D, $f_s$) at a particular $V_{IN}$, a digital hysteresis is incorporated. It uses decoding logic and an SR latch to switch the (D, $f_s$) pair of the clock to the lower values once the ZCS count value falls lower than a threshold indicating a $V_{IN}$ below 20 mV and does not reset back to the previous (D, $f_s$) pair until $V_{IN}$ goes above 30 mV. The timing diagram in FIG. 13A illustrates the operation of the LO-MPPT circuit. As shown, a sudden change in $V_{IN}$ results in a change of the ZCS code and the switching clock adapts to a new (D, $f_s$) pair to optimize the efficiency of the boost converter while keeping the input impedance of the converter matched to the source.

Choosing the right values for D and $f_s$ depends on multiple factors like source resistance, inductance and input voltage. Self-starting the harvester by means of the fast one-shot cold-start mechanism uses the inductance to be large enough to store the start-up energy (minimum energy needed to start OSC 105) during the strobe cycle. In this example, a 100 µH external inductor is chosen and OSC 105 is designed to generate a 100 kHz clock to initiate the asynchronous operation the boost converter. Once $V_{OUT}$ crosses a threshold, the adaptive clock, CK with variable D and $f_s$ is enabled for efficient operation of the synchronous boost converter. In one example, for $V_{IN}$ higher than 25 mV the adaptive switching clock runs at a frequency of 25 kHz with a duty cycle of 0.85 and as $V_{IN}$ goes below 20 mV, the frequency and duty cycle of CK is switched to 8 kHz and 0.55 respectively.

Figure 14:
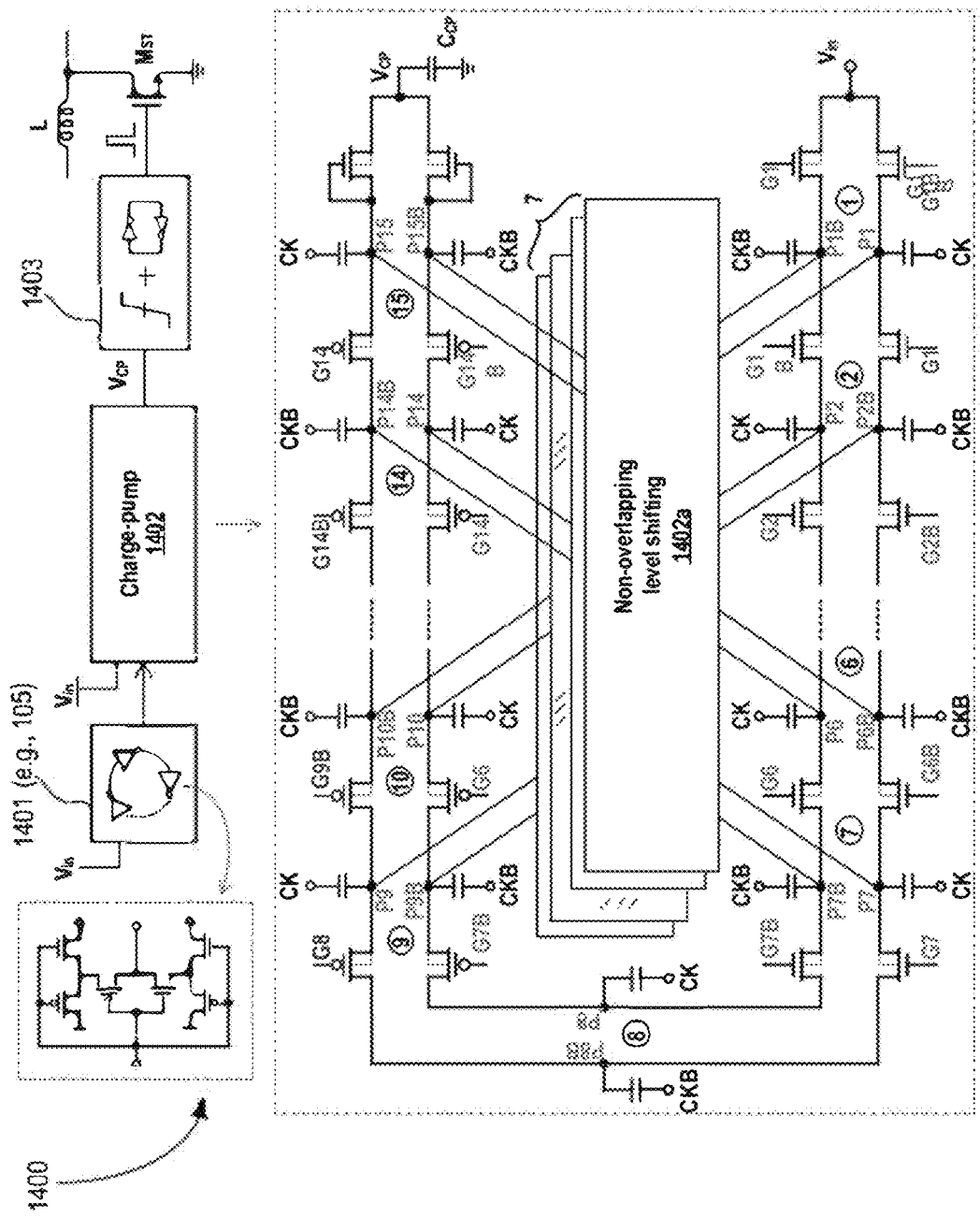
FIG. 14 illustrates a one-shot base start-up of the boost converter using an integrated cross-coupled linear charge pump, in accordance with some embodiments.

FIG. 14 illustrates a one-shot based start-up 1400 of the boost converter using an integrated cross-coupled linear charge pump, in accordance with some embodiments. One-shot based start-up 1400 is another example of a start-up mechanism that uses one type of charge pump, positive or negative charge pump. It comprises a ring-oscillator 1401 (e.g., 105), cross-coupled linear charge pump 1402, pulse generation or strobe generation circuit 1403, and transistor $M_{ST}$. In some embodiments, cross-coupled linear charge pump 1402 includes transistors coupled in a manner similar to those described with reference to FIG. 11, and non-overlapping level-shifting circuit 1402a.

A one-shot cold-start mechanism is implemented on-chip s'ng a low-voltage charge pump (CP) and low-power pulse generator, as shown in FIG. 14. During start-up, the CP boosts $V_{in}$ and powers the pulse generator, which comprises a threshold detector and thyristor-based delay latch to generate a one-shot pulse. In this example, a 15-stage, dual-phase CP is implemented that boosts the gate overdrive of each switch using internal node voltages only, as shown in FIG. 14. The first eight CP stages use n-type switches, and p-type switches are used in the last seven stages. Non-overlapping level shifters use pairs of dual-phased node voltages from earlier and later stages (P7-P7B and P15-P15B) to generate gate drive signals (G7-G7B and G14-G14B) that swing between higher (P15) and lower voltage levels (P7) of internal nodes, greatly enhancing n-type and p-type switch conductivity. This internally cross-coupled gate boosting eliminates the need for additional CP stages and reduces output impedance. A decoupling capacitor, $C_{CP}$ (e.g., 150 pF), is added at the CP output to mitigate voltage droop during the one-shot operation.

Figure 15:
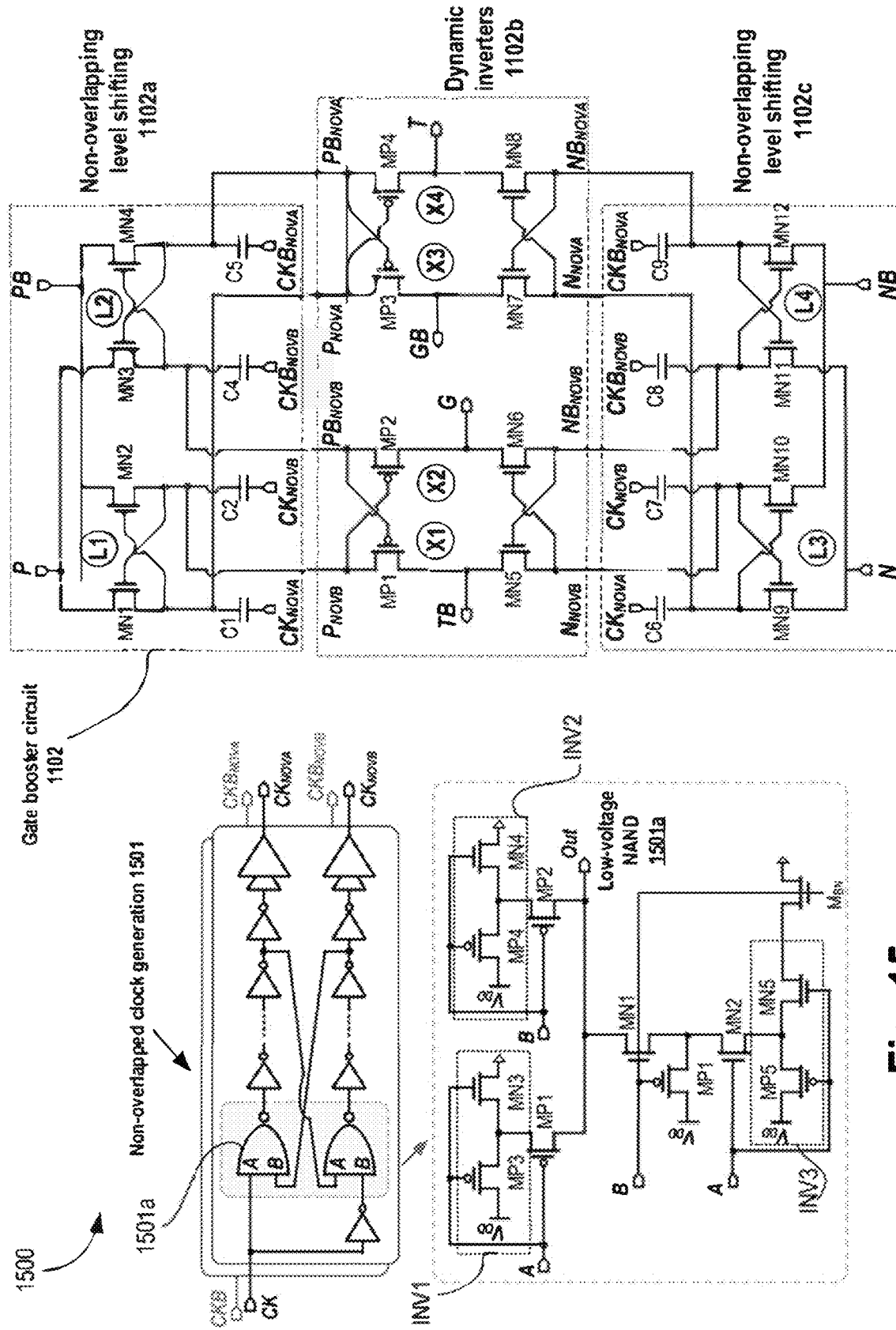
FIG. 15 illustrates a circuit for generating non-overlapping gate clocks with boosted voltage swing, in accordance with some embodiments.

FIG. 15 illustrates circuit 1500 for generating non-overlapping gate clocks with boosted voltage swing, in accordance with some embodiments. Circuit 1500 comprises a non-overlapping clock circuit 1501 that includes cross-coupled NAND gates 1501a, inverters and drivers. In some embodiments, the NAND gate use similar design architecture as the ring oscillator inverter. In some embodiments, the low-voltage NAND gate comprises n-type transistors MN1, MN2, MN3, MN4, MN5, $M_{BN}$; and p-type transistors MP1, MP2, MP3, MP4, and MP5 coupled as shown.

FIG. 15 also illustrates a gate booster circuit 1102, which includes first non-overlapping level-shifter 1102a, dynamic inverters 1102b, and second non-overlapping level-shifter 1102c. In some embodiments, first non-overlapping level-shifter 1102a comprises n-type transistors MN1, MN2, MN3, and MN4, and capacitors (or capacitive devices) C1, C2, C4, and C5 coupled as shown. In some embodiments, dynamic inverters 1102b comprise p-type transistors MP1, MP2, MP3, and MP4, and n-type transistors MN5, MN6, MN7, and MN8 coupled as shown. In some embodiments, second non-overlapping level-shifter 1102c includes n-type transistors MN9, MN10, MN11, and MN12, and capacitors (or capacitive devices) C6, C7, C8, and C9 coupled as shown.

Figure 16:
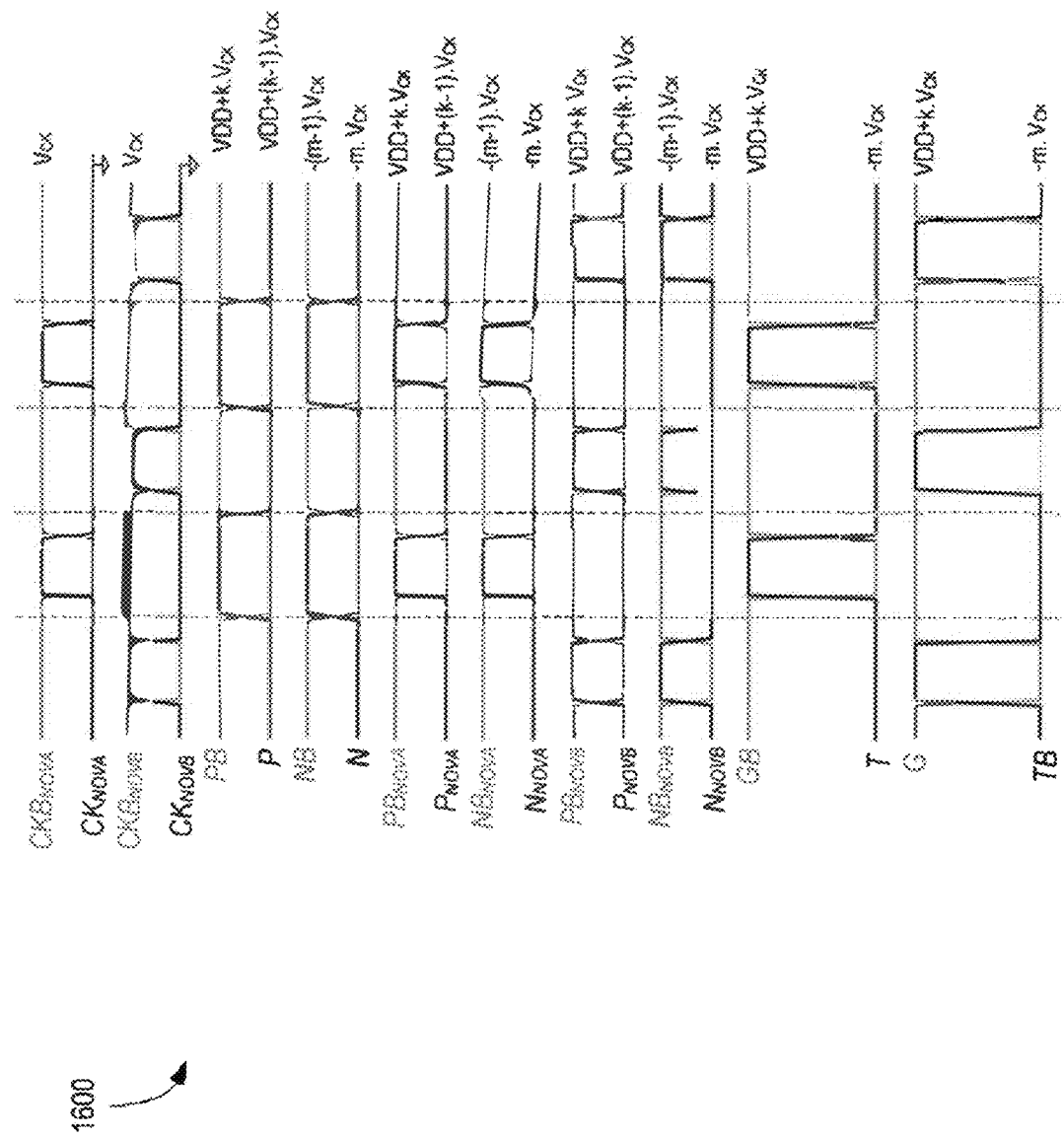
FIG. 16 illustrates a plot showing timing diagram for gate clock generation, in accordance with some embodiments.

Gate clocks of the CTSs are generated using the GB circuit 1102. The boosted gate clocks are non-overlapping with the pumping clocks to avoid reverse charge flow in the non-charge-transfer phase. The level shifters L1, L2 1102a and L3, L4 1102c take dual-phase outputs of the charge pump (P-PB and N-NB) and generate corresponding non-overlapped phases using clocks $CK_{NOVA}$, $CK_{NOVB}$, $CKB_{NOVA}$, and $CKB_{NOVB}$, as shown in the timing diagram in FIG. 16. FIG. 16 illustrates plot 1600 showing timing diagram for gate clock generation, in accordance with some embodiments.

Referring back to FIG. 15, these clock phases are generated using low-voltage NAND logic 1501a, implemented with a similar leakage suppression technique. As shown in FIG. 15, INV1 and INV2 suppress leakage currents of the pull-up transistors; INV3, $M_{BN}$, and MP1 suppress leakage currents of the pull-down transistors. The capacitors C1, C2, C4, C5, C6, C7, C8, and C9 can be metal capacitors, MOS capacitors, or a combination of them. In this example, MOS capacitors, each 2 pF, are used in the non-overlapping level-shifters 1102a/c.

Outputs of the level-shifters $P_{NOVB}$, $PB_{NOVB}$, $N_{NOVB}$, and $NB_{NOVB}$ are fed to the dynamic inverter X1 1102b to generate gate clock TB that swings between the higher positive voltage levels of PB and the lower negative voltage levels of N-NB, as shown in FIG. 16. Similarly, gate clocks G, GB, and T are generated using dynamic inverters X2-X4 1102b. For the final 14 stages of the voltage multiplier 1100, the same GB circuit 1102 is used, where N-NB are replaced by the positive voltage outputs of lower stages.

Poor gate drive of transistors in dynamic inverters X1-X4 1102b causes slow transition of the boosted gate clocks; to ensure non-overlap of the final gate clocks with the pumping clocks, the delay between the falling edges of $CK_{NOVA}$ and CK is designed to be larger than the delay between their rising edges. Timing of other phases is set accordingly. The clocks are driven by higher strength stacked-inverter cells to drive long routing paths. In some embodiments, routing is laid out symmetrically to ensure correct phases and minimal skew at the final destinations.

Figure 17A:
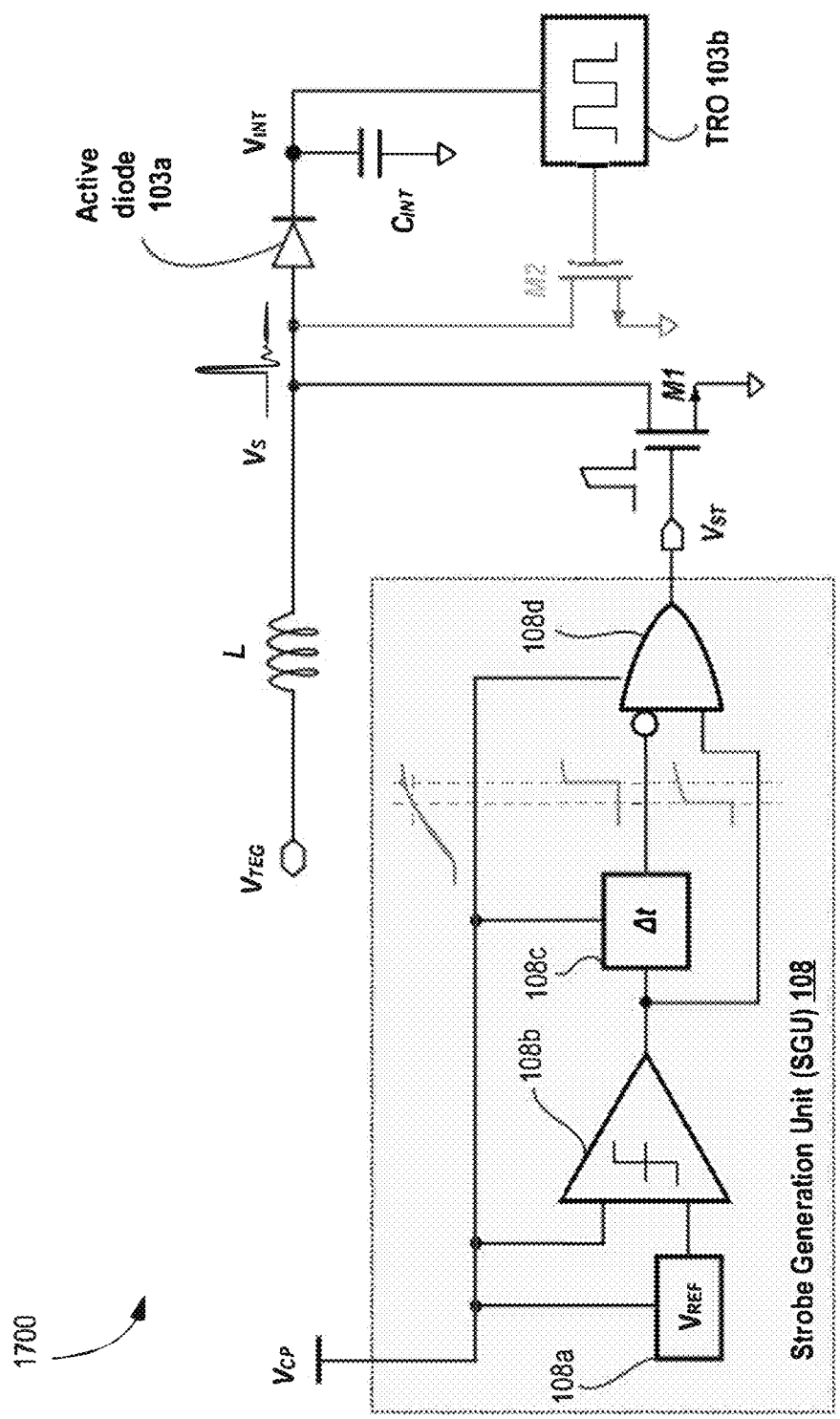
FIG. 17A illustrates a high-level architecture of a strobe generation unit (SGU), in accordance with some embodiments.

FIG. 17A illustrates a high-level circuit of a strobe generation unit (SGU) 1700, (e.g., 108) in accordance with some embodiments. The high-level circuit of SGU 1700 comprises the SGU core 108 coupled to startup transistor M1 (or $M_{ST}$), which in turn is coupled to the inductor L, transistor M2 and active diode 103a. SGU core 108 comprises a reference generator 108a, comparator 108b, delay circuitry 108c, and AND gate 108d coupled as shown. The input to SGU core 108 is $V_{CP}$ and the output is the startup pulse $V_{ST}$.

Figure 17B:
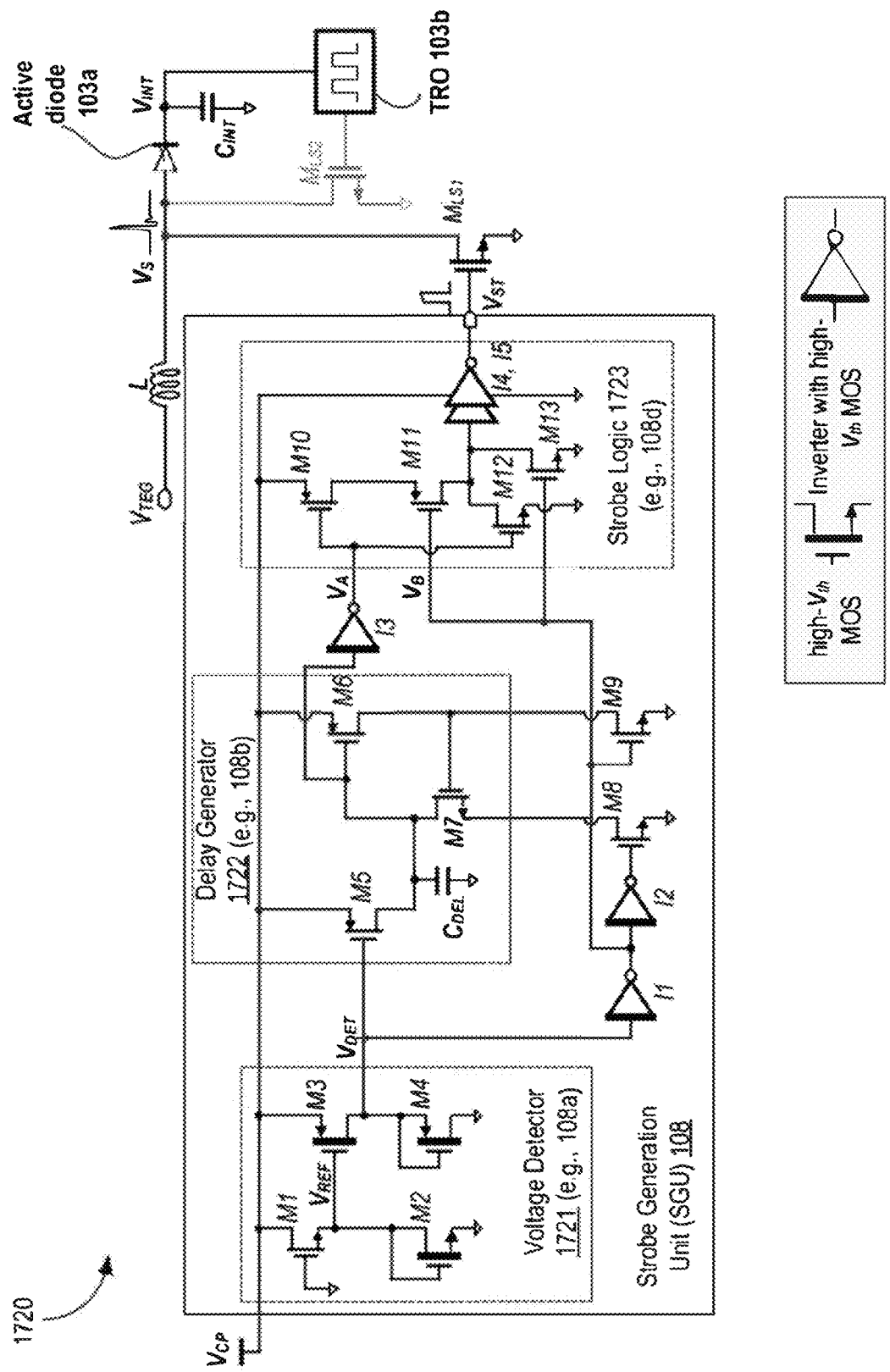
FIG. 17B illustrates a schematic of a strobe generation unit (SGU), in accordance with some embodiments.

FIG. 17B illustrates a schematic 1720 of the SGU, in accordance with some embodiments. Schematic 1720 illustrates the implementation of SGU core 108, in accordance with some embodiments. SGU 108 is powered by the output of the start-up voltage multiplier $V_{CP}$ to generate the control pulse $V_{ST}$ required to kick-start the inductive boost converter. SGU 108 comprises a voltage detector 1721 (e.g., 108a), a delay generator 1722 (e.g., 1081)), and a strobe logic circuit 1723 (e.g., 108d). As the output power of the charge pump is low, SGU 108 operates with a very small quiescent current.

Figure 19:
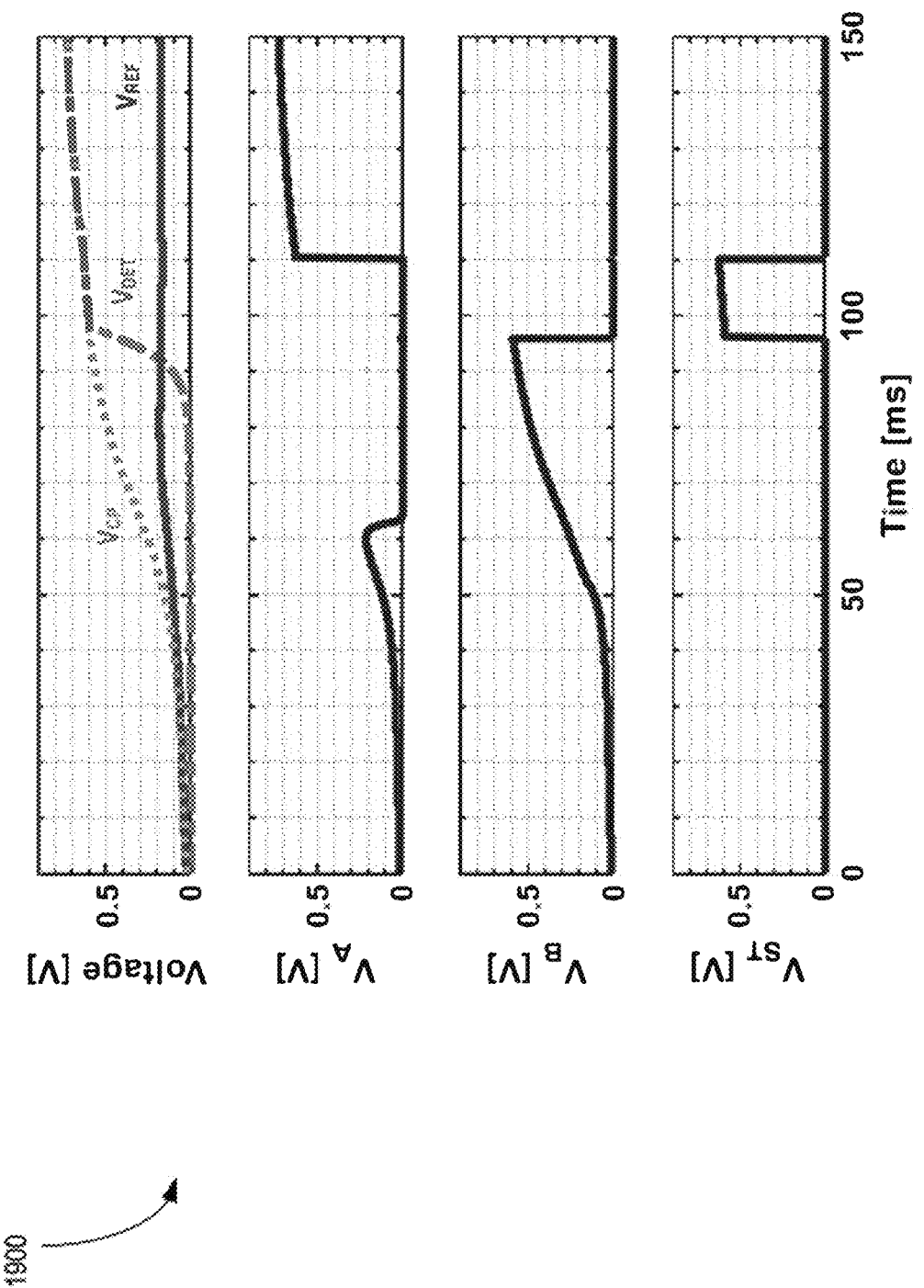
FIG. 19 illustrates a plot showing simulated waveforms showing functionality of the SGU.

The voltage detector output $V_{DET}$ asserts $V_{ST}$ once $V_{CP}$ crosses a threshold sufficiently higher than the $V_{th}$ value of transistor $M_{LS1}$ to energize the inductor with required start-up current. A low-power reference generator is implemented using low-$V_{th}$ and high-$V_{th}$ transistors, M1 and M2, respectively. Static current is minimized by using long-channel (e.g., 10 μm) devices for M1 and M2; settling of $V_{REF}$ is still fast compared to slow ruse of $V_{CP}$, as shown in FIG. 19. FIG. 19 illustrates plot 1900 showing simulated waveforms showing functionality of the SGU. Referring back to FIG. 17B, voltage detector 1721 comprises high-Vth p-type transistors M3 and M4. Current through transistor M3 is compared against leakage current through transistor M4 (gate-source shorted); with the ruse of $V_{CP}$, $V_{SG}$ of transistor M3 increases, and as current through transistor M3 goes above leakage current of transistor M4, the output $V_{DET}$ starts rising and follows $V_{CP}$. The width of transistor M4 is set 10 times the width of transistor M3 for higher effective threshold, $V_{REF}+V_{GS,M3}$. Transistor $M_{LS1}$ is sized to energize inductor with required start-up current without slowing falling transition of $V_{ST}$ due to larger gate capacitance.

$V_{DET}$ is delayed to generate $V_A$ using a thyristor-based latch formed by the transistors M6 and M7. The capacitor $C_{DEL}$ is precharged to $V_{CP}$ by transistor M5 before $V_{DET}$ rises. Once M5 turns off, the latch is enabled by turning transistor M8 on and transistor M9 off using $V_{DET}$. As $C_{DEL}$ is discharged by the leakage current while $V_{CP}$ rises, $V_{SG}$ of transistor M6 increases, which charges the gate of transistor M7; the transistors M6 and M7 regenerative feedback quickly discharges $C_{DEL}$. The thyristor latch avoids crowbar current during voltage transitions and minimizes power consumption. $V_{ST}$ is finally generated from $V_A$ and $V_B$ using NOR logic (M10-M13) and buffered to the gate of transistor $M_{LS1}$. All internal buffers (I1-I3) are designed with high-$V_{th}$ transistors to reduce leakage current. Simulated current consumption of the sub-blocks of SGU 1700/1800/108 is shown in FIG. 19.

Referring back to FIG. 17B, an active diode with low static current consumption is used to reduce voltage drop in the current path from the inductor to the capacitor $C_{INT}$. An energy-efficient TRO is designed to oscillate at a supply voltage as low as, for example, 400 mV. This enables the clock CK immediately following the strobe cycle, and it takes over control of the inductive boost converter. As TRO 103b takes control, the inductor is energized using a wider LS switch $M_{LS2}$. Following a cold start, the inductive boost converter is operated in a discontinuous conduction mode (DCM), favorable for the low-power level of the application. In some embodiments, even when CK has a non-50% duty cycle (e.g., 66.67%), it still ensures operation of the boost converter in DCM due to the high conversion ratio $T_{OFF} \ll T_{ON}$.

Figure 18:
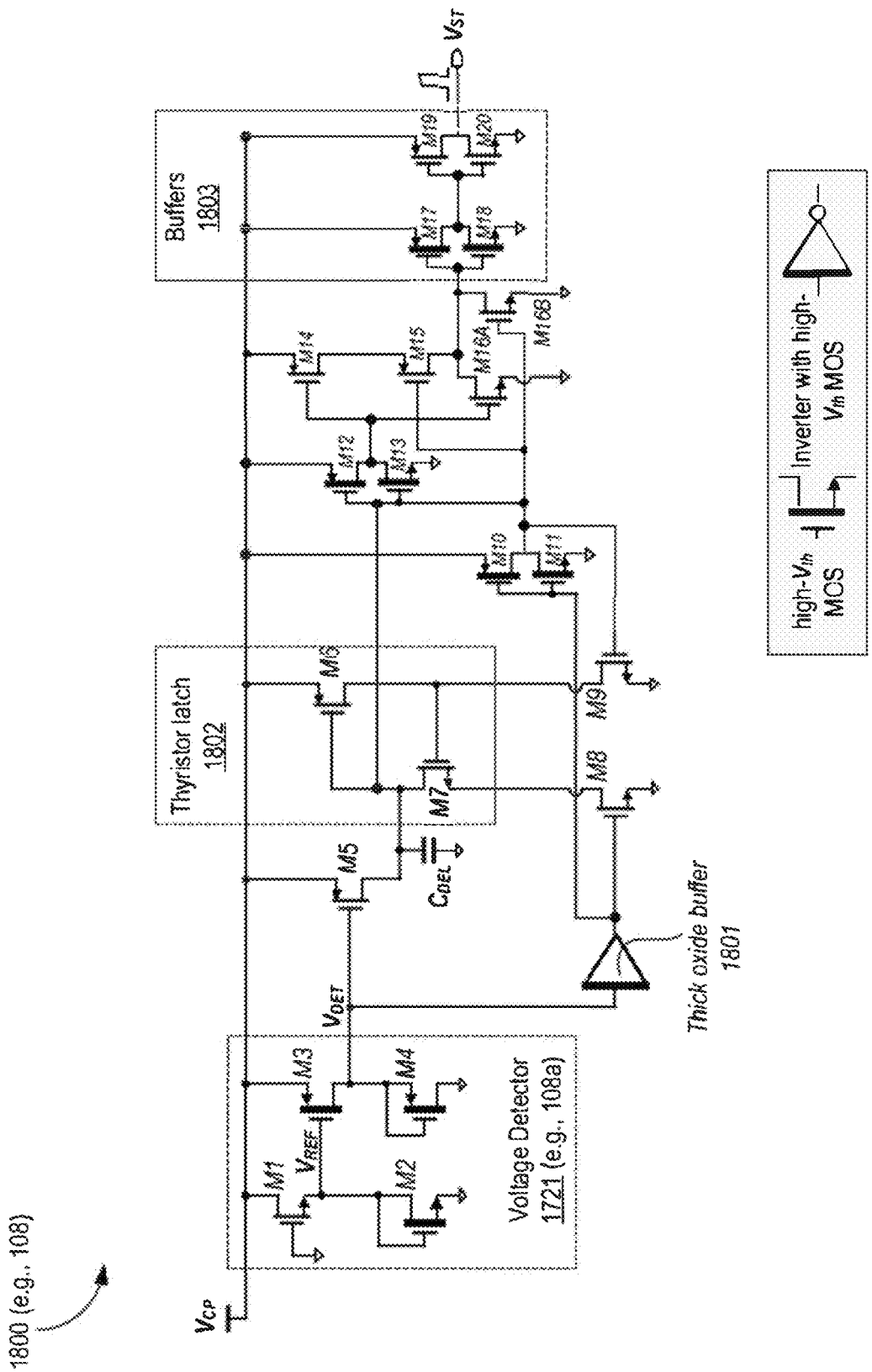
FIG. 18 illustrates a low-power, fast switching strobe generation circuit to start up the primary boost converter, in accordance with some embodiments.

FIG. 18 illustrates a low-power, fast switching strobe generation circuit 1800 (e.g., SGU 108) to start up the primary boost converter, in accordance with some embodiments. SGU 1800 comprises voltage detector 1721, thick oxide buffer 1801, thyristor latch 1802, buffers 1803, capacitor CDEL, p-type transistors M5 MP6, M10, M12, M14, and M15, and n-type transistors M7, M8, M9, M11, M13, M16A, and M16B coupled as shown. Thyristor latch 1802 comprises p-type transistor M6 and n-type transistor M7 coupled as shown. SGU 1800 starts the primary boost converter. The falling edge of the strobe VST is sharp enough to create sufficient inductive overshoot to turn on the active diode. Large inverters have high crowbar current that consume most of the output power of the charge pump. Instead, a thyristor-based latch circuit 1802 generates a pre-defined pulse width from the strobe VST. An ultra-low powered threshold detector 1721 triggers the falling edge. Thick-oxide devices are used in intermediate buffers 1803 to minimize crossbar current, and final strobe pulse is driven with a regular-Vt inverter.

Figure 20:
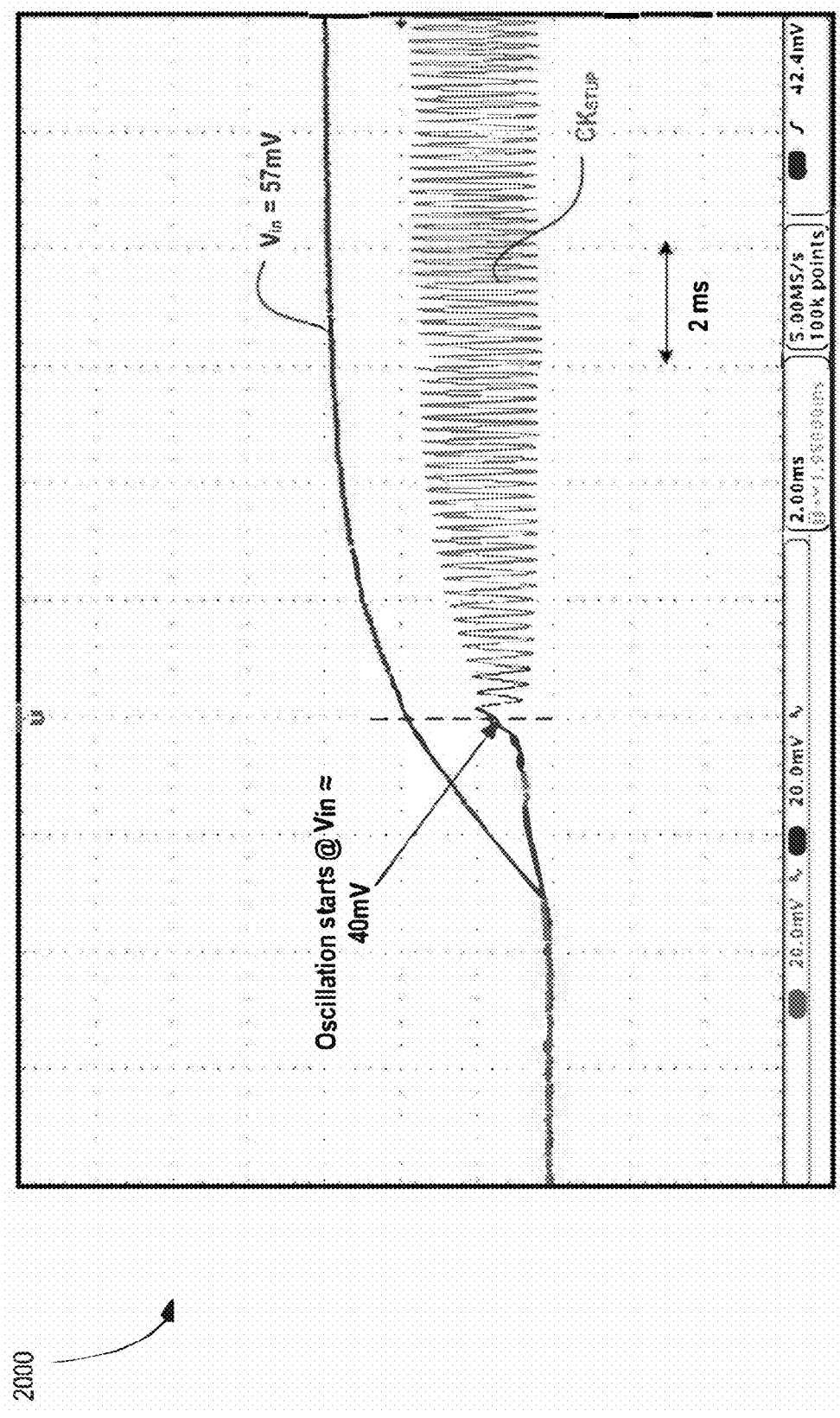
FIG. 20 illustrate a plot showing measured start-up clock generated by the ultra-low voltage ring oscillation, in accordance with some embodiments.

FIG. 20 illustrates plot 2000 showing measured start-up clock generated by the ultra-low voltage ring oscillation, in accordance with some embodiments. Output transient of the start-up clock shows that oscillation starts at an input supply voltage as low as 40 mV, which demonstrates effective leakage suppression using the proposed stacked-inverter delay cells. The measured voltage swing of the clock is lower than the internal clock swing due to the loading of the low-voltage test buffers by the pad and probe parasitics.

Figure 21:
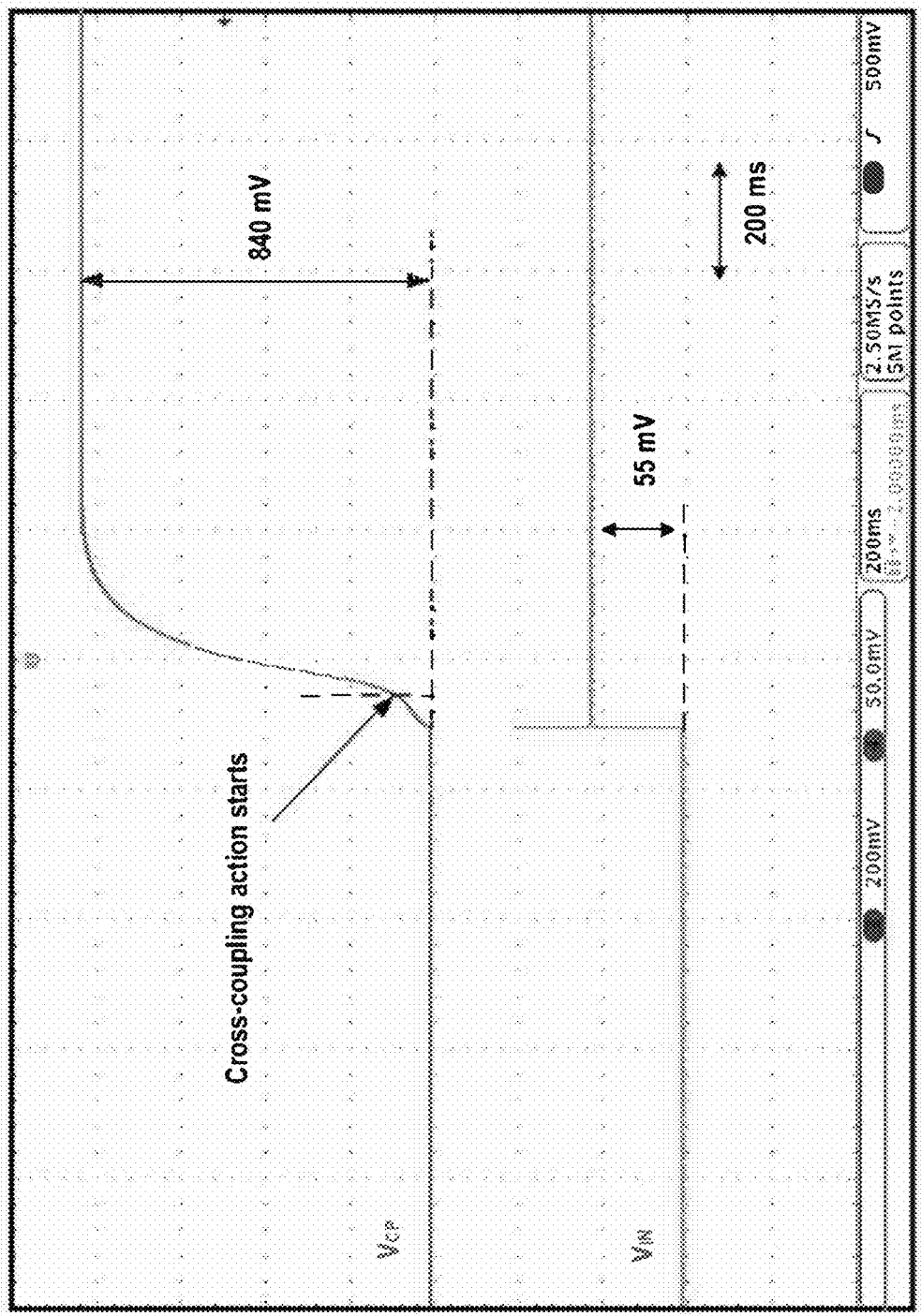
FIG. 21 illustrates a plot showing measured transient waveform of VCP (buffered off-chip) with an input supply of 55 mV.

FIG. 21 illustrates plot 2100 showing measured transient waveform of $V_{CP}$ (buffered off-chip) with an input supply of 55 mV. A test output of the start-up voltage multiplier is buffered using an off-chip buffer to minimize probe loading during characterization. Measured output transient in FIG. 21 shows that an input voltage of 55 mV is boosted by the multiplier 1100 to an output of 840 mV, with an estimated load current of hundreds of pico-amps due to the finite input impedance of the off-chip buffer. Boosted gate clocks cannot be measured at minimum input supply due to low drivability.

Figure 22:
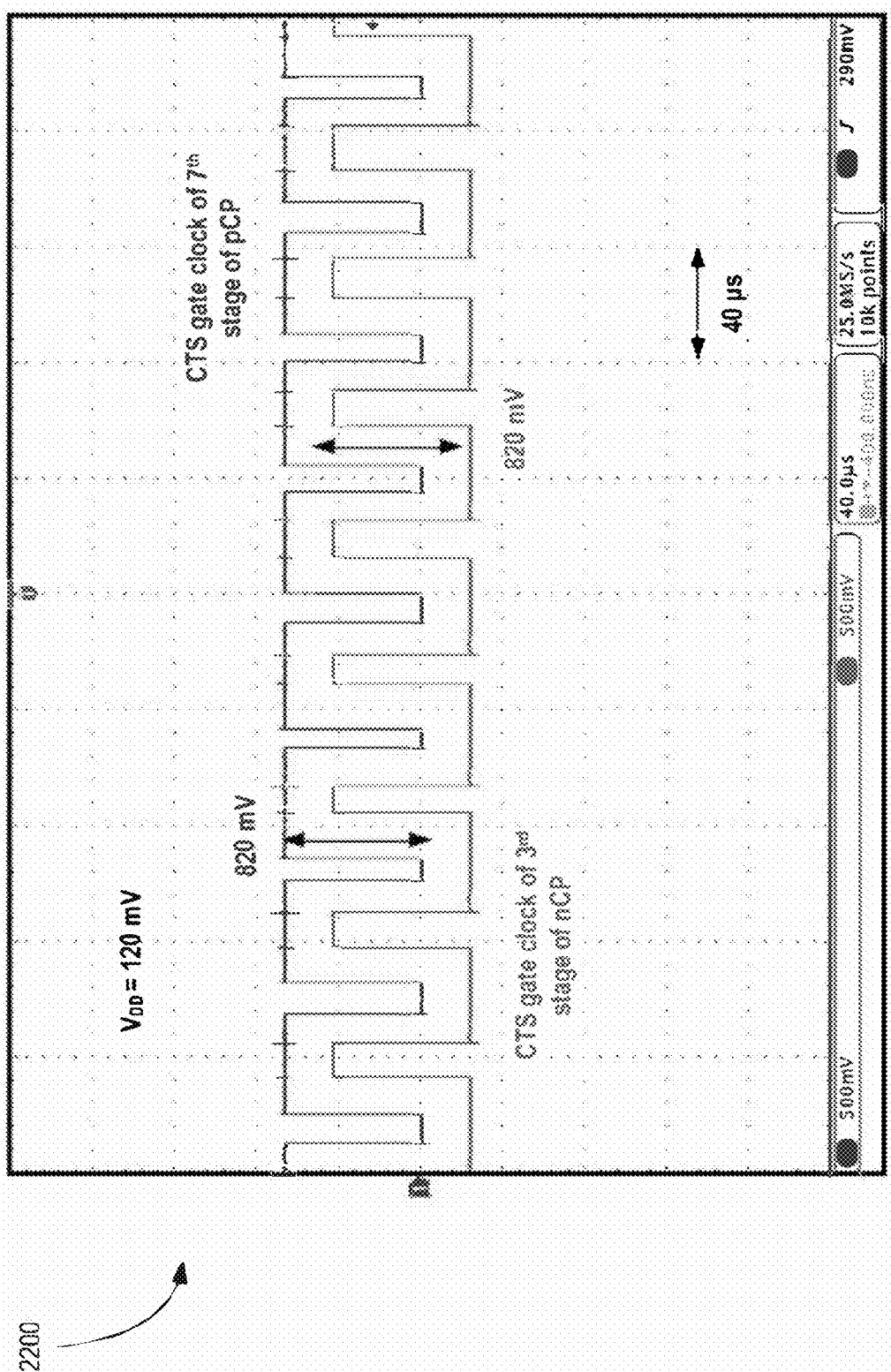
FIG. 22 illustrates non-overlapping gate clocks with boosted voltage swing, in accordance with some embodiments.

FIG. 22 illustrates plot 2200 showing non-overlapping gate clocks with boosted voltage swing, in accordance with some embodiments. Boosted gate clocks of the seventh stage of CP$^+$ and the third stage of CP$^-$ are shown in plot 2200 using an input supply of 120 mV.

Figure 23:
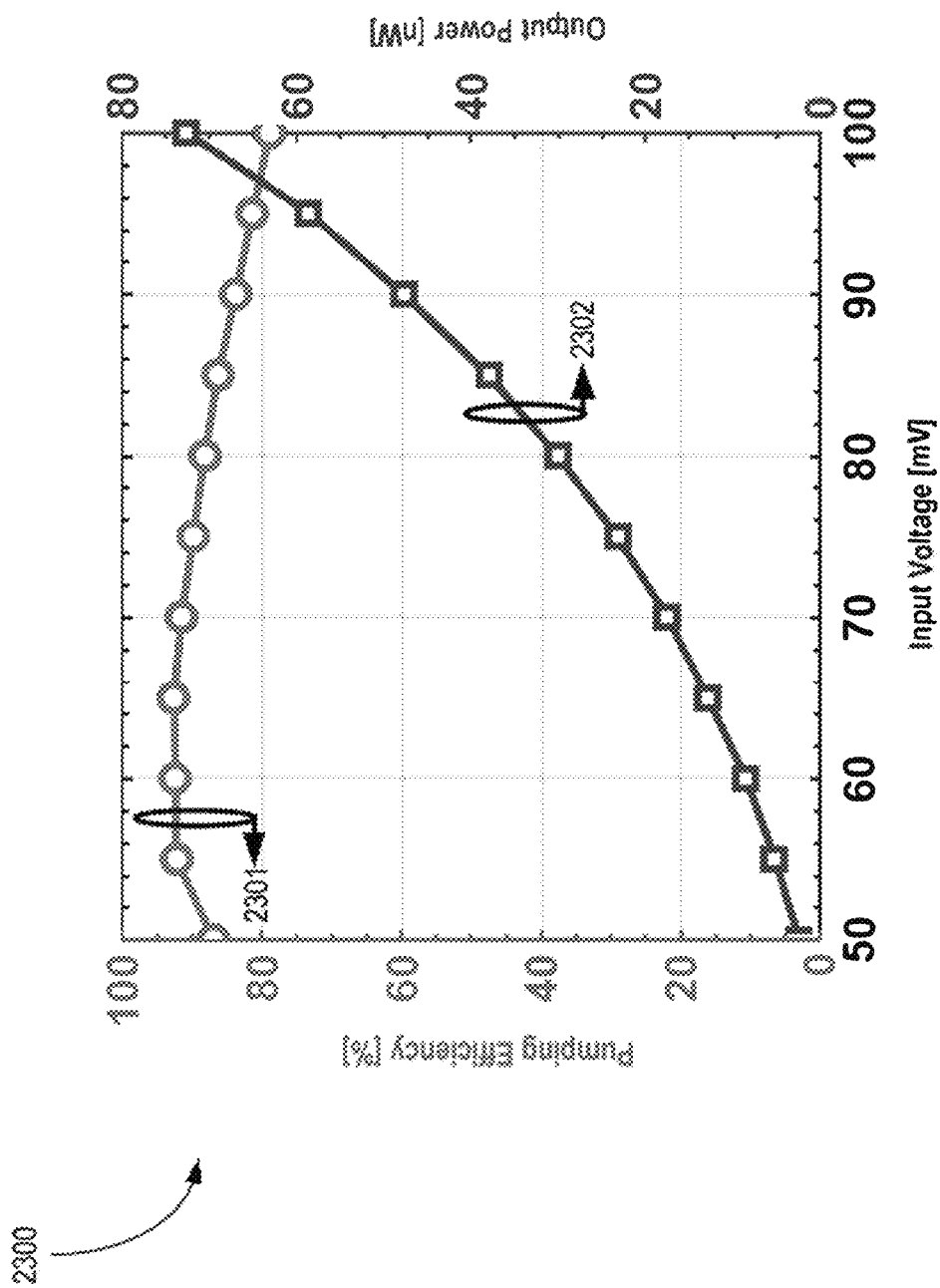
FIG. 23 illustrates a plot showing measured pumping efficiency and output power of the charge-pump based voltage multiplier across input voltages, in accordance with some embodiments.

FIG. 23 illustrates plot 2300 showing measured pumping efficiency and output power of the charge-pump based voltage multiplier across input voltages, in accordance with some embodiments. Pumping efficiency of the charge-pump-based voltage multiplier 1100 is measured across varying input voltage using a digital multi-meter with an input impedance of greater than 1 GΩ in to measure the output voltage. The output power is measured using a source meter (e.g., Keithley 2450) as a current sink. The measurement is done for an input voltage range relevant for the target application, body-heat energy harvesting, where the coldstart block is exposed mostly to sub-100-mV TEG voltages due to the small OT value between the skin and the ambient environment. As shown in FIG. 23, the start-up voltage multiplier 1100 achieves a pumping efficiency higher than 78% across an input voltage range of 50-100 mV, with a peak value of 93% at an input voltage of 65 mV. Pumping efficiency of voltage multiplier 1100 is maximized at low input voltages to reduce the minimum cold-start voltage.

Figure 24A:
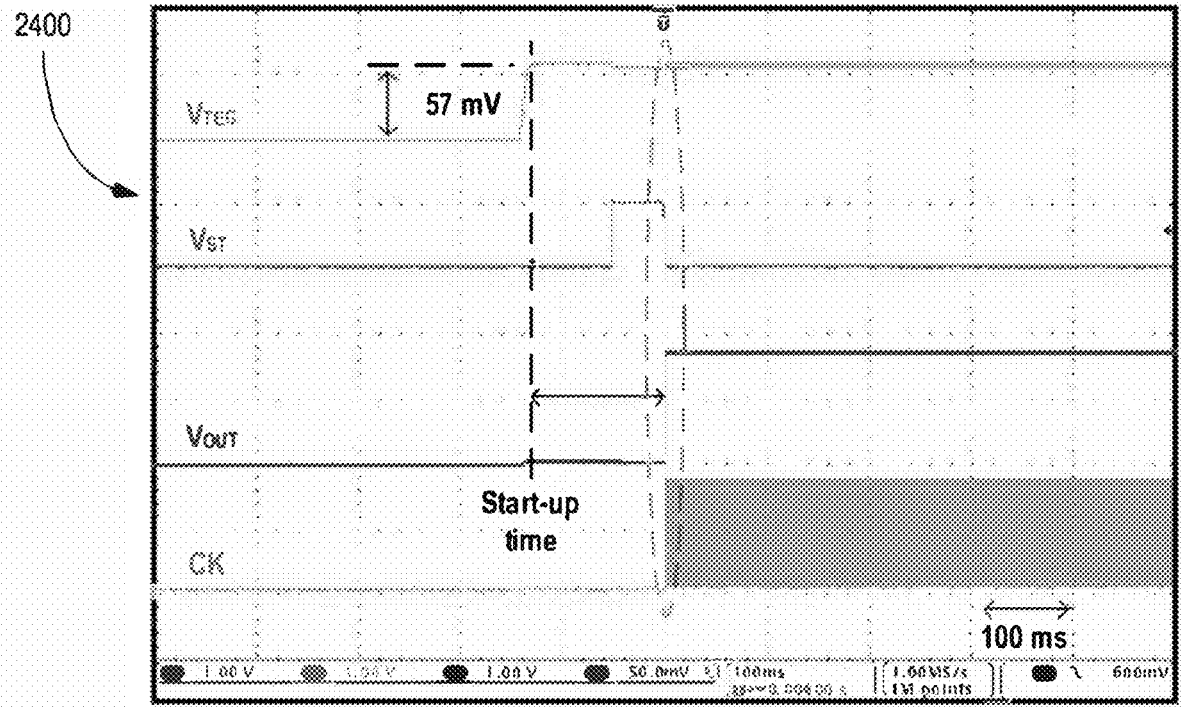
FIGS. 24A-B illustrate plots showing start-up transient of the cold-start architecture, in accordance with some embodiments.
Figure 24B:
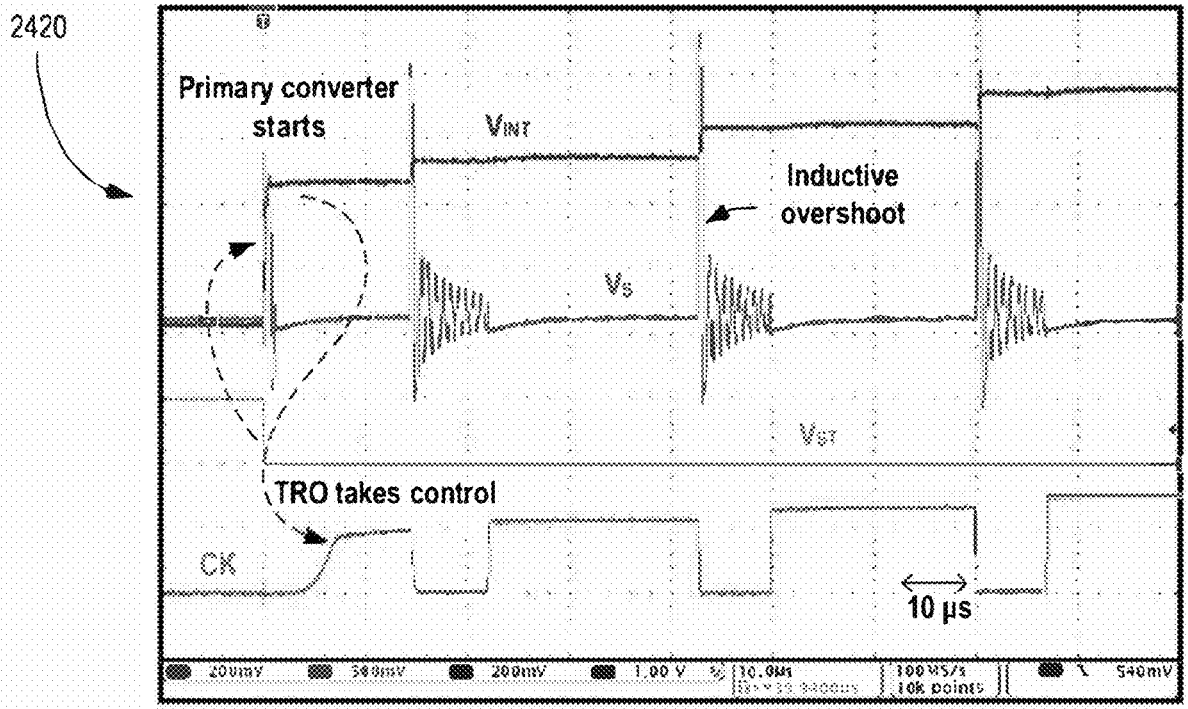

FIGS. 24A-B illustrate plots 2400 and 2430, respectively, showing start-up transient of the cold-start architecture, in accordance with some embodiments. The start-up performance of the proposed architecture is characterized using a bench-top power supply with added 5Ω series resistance to imitate a typical TEG source. A 220-µH off-chip inductor is used for the primary boost converter. The value of the inductor is chosen higher than the minimum required value to mitigate additional conduction losses due to inefficient routing. As shown in FIGS. 24A-B, the primary converter starts with a minimum source voltage of 57 mV. Although the stand-alone voltage multiplier operates at lower input voltage, a leakage current of SGU 108 loads the multiplier output and prevents start-up at a lower voltage. Due to the fast one-shot start-up mechanism it takes only 135 ms for cold start. The zoomed-in view of waveform in FIG. 15 shows inductive overshoot at $V_S$ with the falling edge of $V_{ST}$. A rise in $V_{INT}$ above 400 mV following the strobe-cycle starts TRO 103b immediately, and CK takes control of the inductive boost converter. Once started, the output voltage rises to an unregulated 1.8 V with no load. The measured efficiency of the boost converter is 20% at the 57 mV cold-start voltage, and the efficiency increases to 47% at an input voltage of 100 mV.

Figure 25:
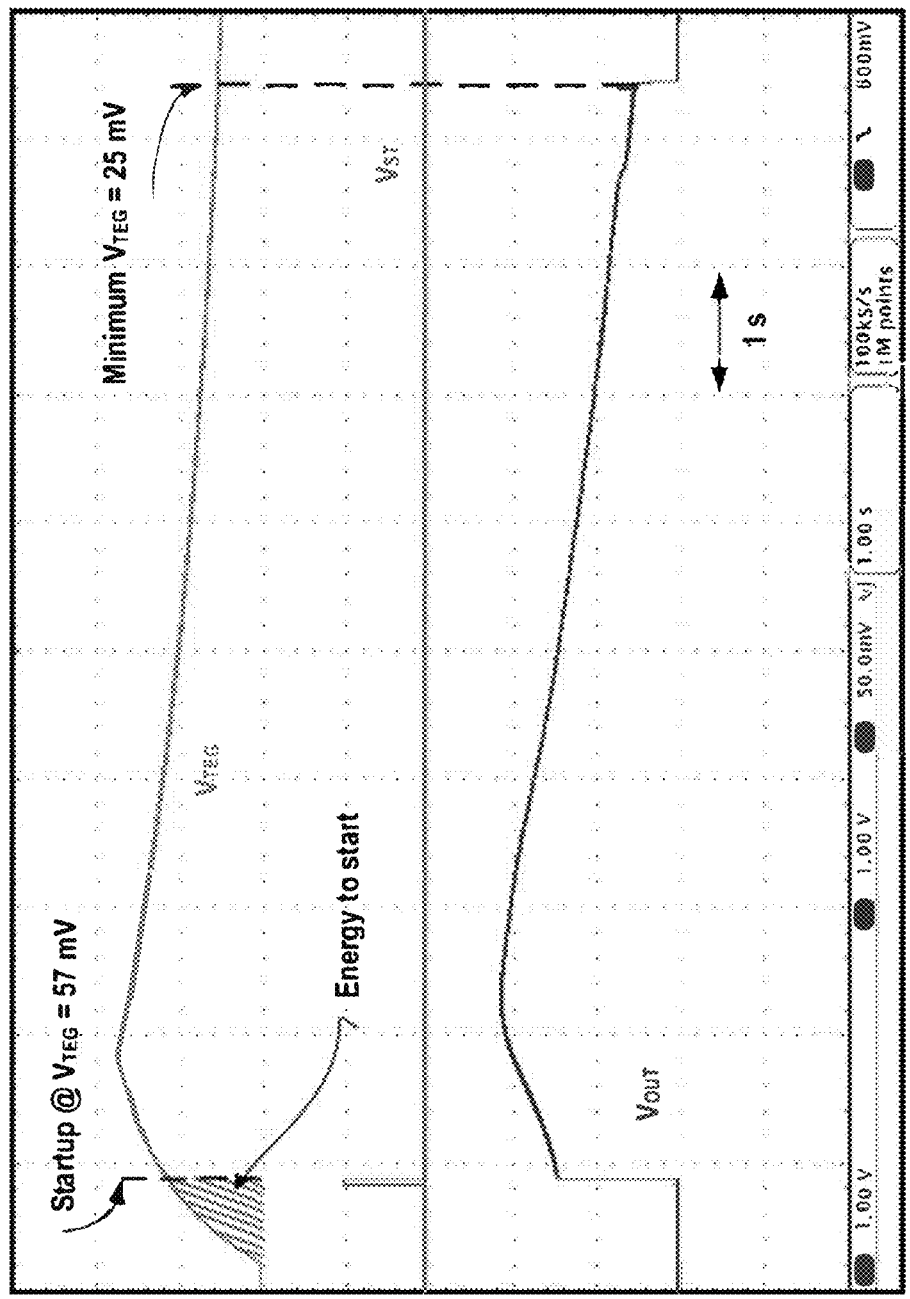
FIG. 25 illustrates a plot showing measured transient of the boost converter with a commercial TEG, in accordance with some embodiments.

FIG. 25 illustrates plot 2500 showing measured transient of the boost converter with a commercial TEG, in accordance with some embodiments. The measured input and output transient waveforms show that the boost converter starts at an input voltage of 57 mV, as expected, which corresponds to a temperature gradient of OT 1.6° C., and sustains operation until the input voltage falls below 25 mV (OT 0.8° C.). The total energy used from the TEG for the cold start is 90 nJ.

Figure 26:
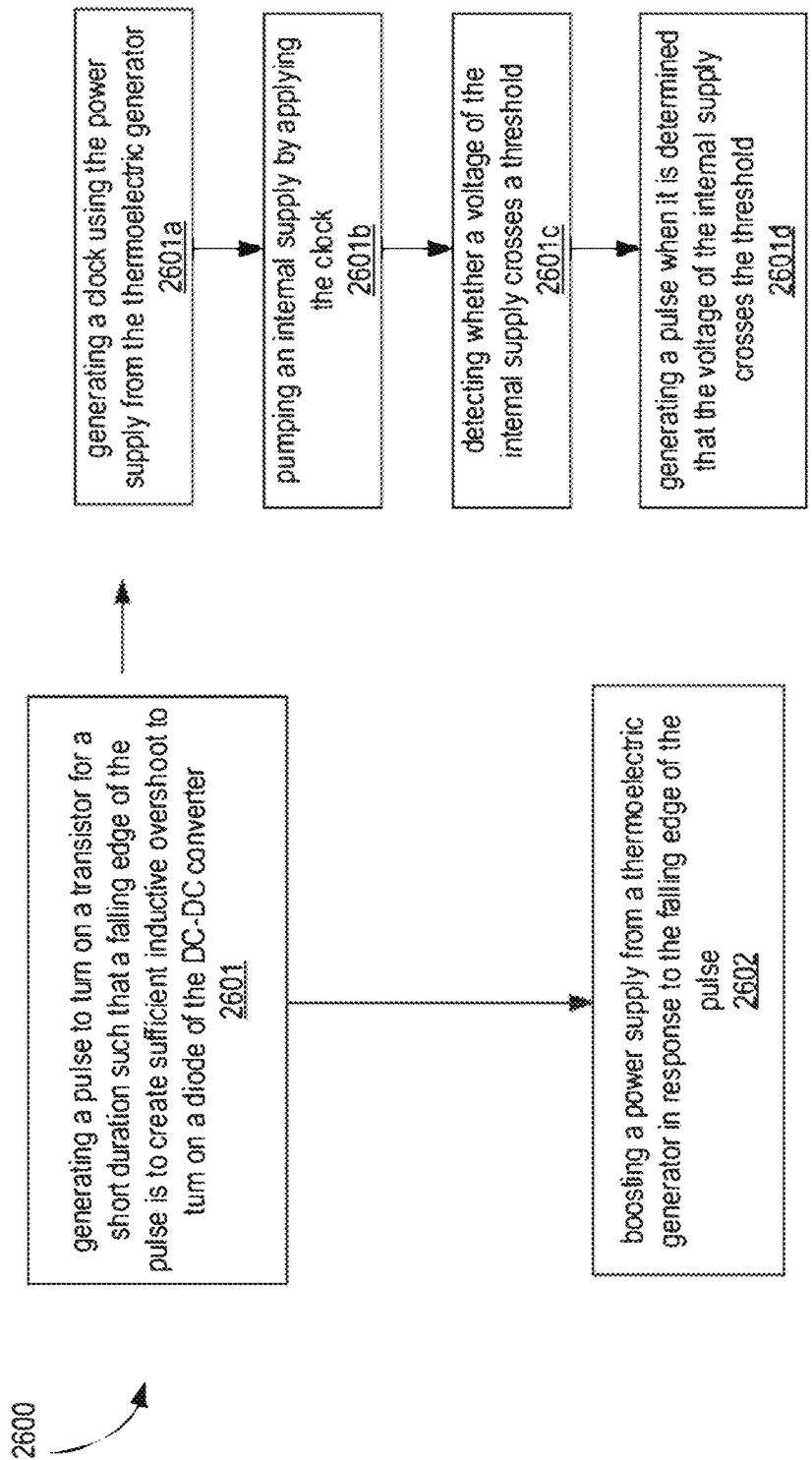
FIG. 26 illustrates a flowchart of a method of cold starting a DC-DC converter, in accordance with some embodiments.

FIG. 26 illustrates flowchart 2600 of a method of cold starting a DC-DC converter, in accordance with some embodiments. The operations of flowchart 2600 are illustrated by blocks. At block 2601, circuitry 102 (e.g., cold-start circuitry) generates a pulse ($V_{ST}$) to turn on a transistor M1 (or $M_{ST}$) for a short duration such that a falling edge of the pulse is to create sufficient inductive overshoot to turn on diode 103a of DC-DC converter 103. At block 2602, DC-DC converter 103 boosts a power supply $V_{TEG}$ from thermoelectric generator 101 in response to the falling edge of the pulse. In various embodiments, the operation of block 2601 comprises generating (by low-voltage startup oscillator 105) a clock using the power supply $V_{IN}$ from the thermoelectric generator 101, as indicated by block 2601a. At block 2601b, charge pump 106 pumps an internal supply $V_{CP}$ by applying the clock. At block 2601c, SGU 108 detects whether a voltage of the internal supply $V_{CP}$ crosses a threshold VREF (e.g., FIG. 17B). At block 2601d, SGU 108 generates the pulse when it is determined that the voltage of the internal supply crosses the threshold.

Figure 27:
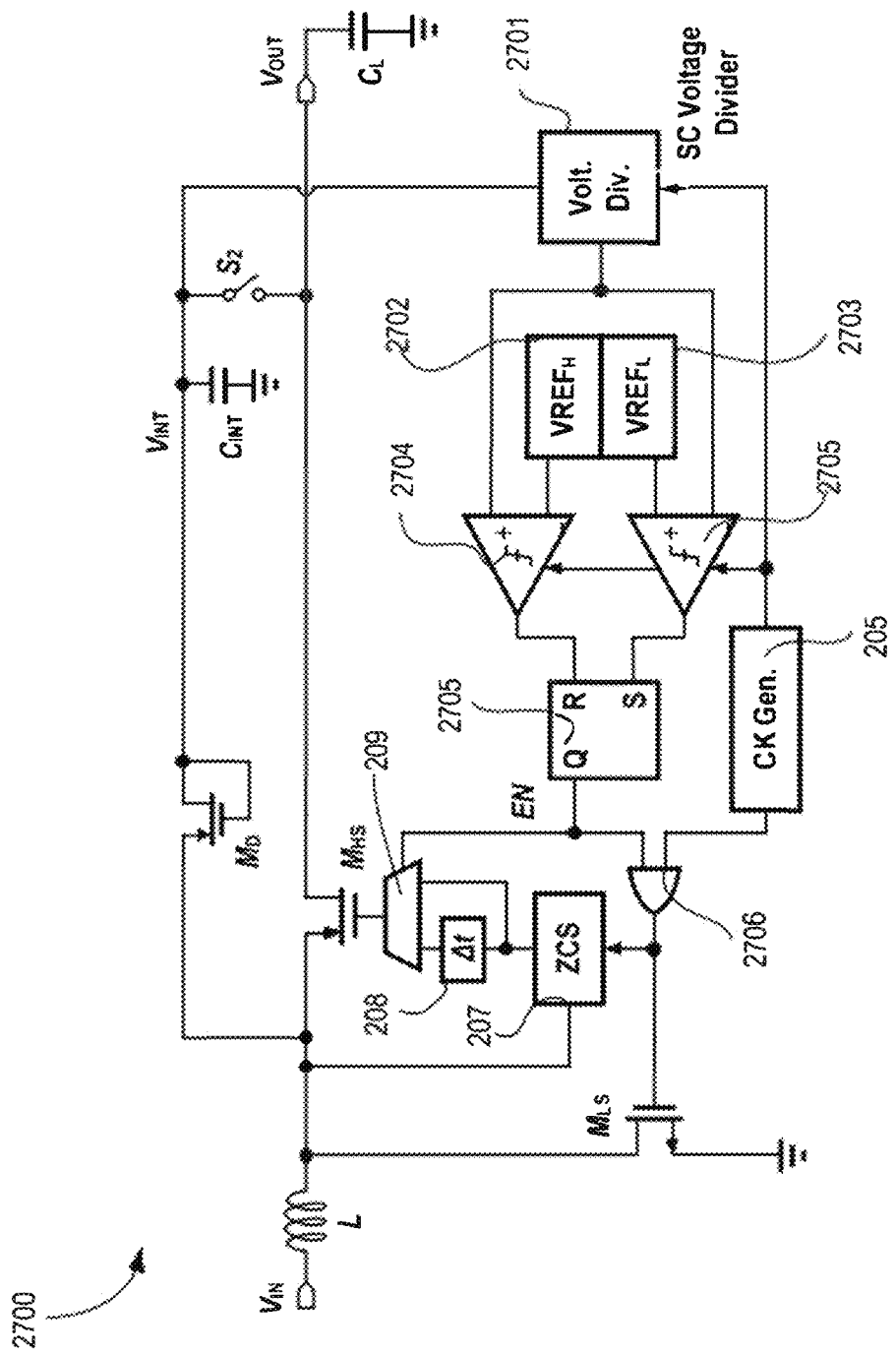
FIG. 27 illustrates a hysteretic on-off voltage regulation using two low-power on-chip voltage references, in accordance with some embodiments.
Figure 28:
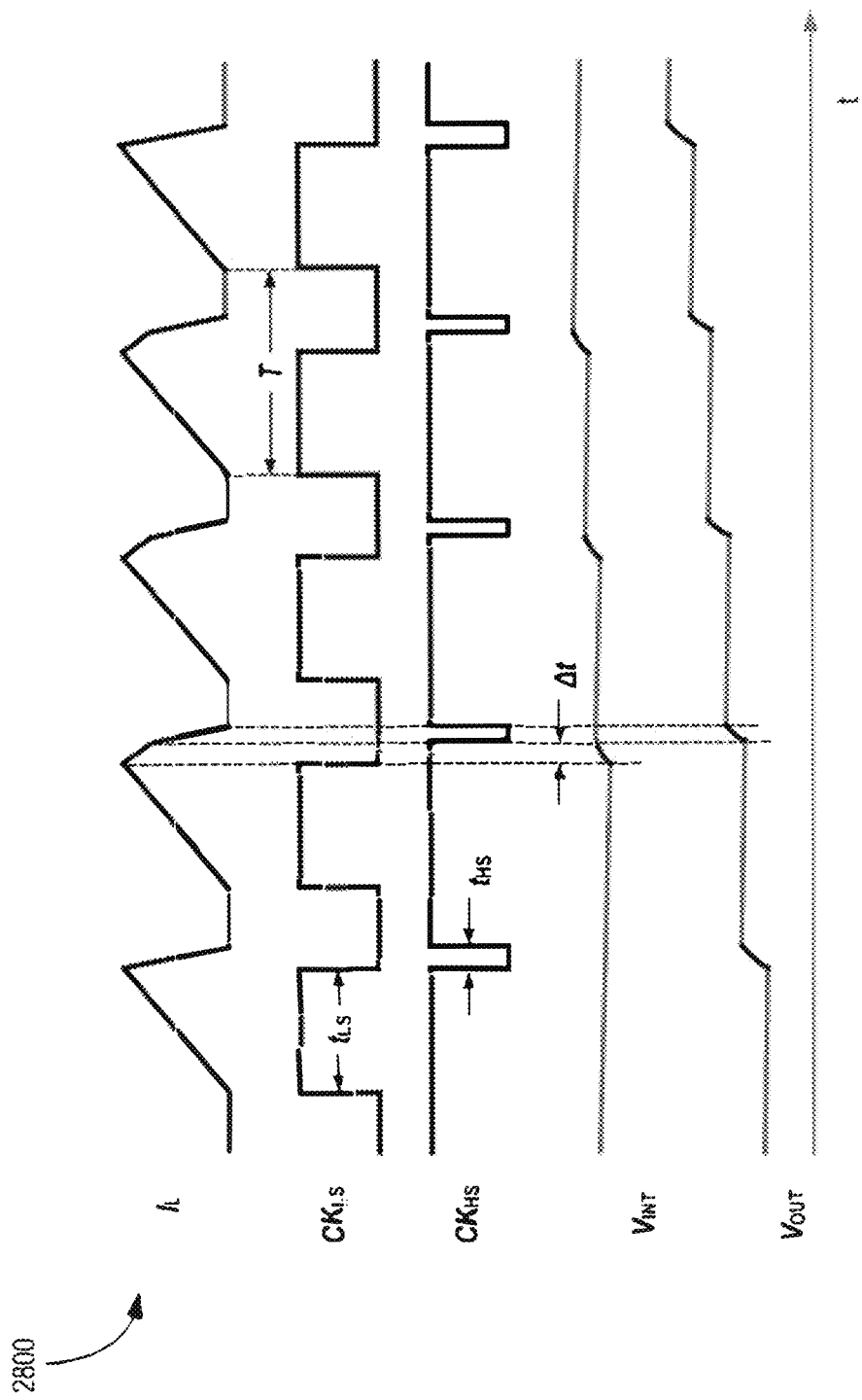
FIG. 28 illustrates a timing diagram of time multiplexed dual-path operation of the single-inductor DC-DC boost converter during start-up, in accordance with some embodiments.

FIG. 27 illustrates apparatus 2700 with hysteretic on-off voltage regulation using two low-power on-chip voltage references, in accordance with some embodiments. FIG. 28 illustrates timing diagram 2800 of time multiplexed dual-path operation of the single-inductor DC-DC boost converter during start-up, in accordance with some embodiments.

Apparatus 2700 elaborates voltage regulation block 204, and comprises voltage dividers 2701, high reference generator ($VREF_H$) 2702, low reference generator ($VREF_L$) 2703, first comparator 2704, second comparator 2705, flip-flop or latch 2705, and AND gate 2706 coupled as shown with other components described with reference to FIG. 2A.

The dual path converter architecture 200 achieves fast cold-start at small input voltage as well as high efficiency boost conversion during normal mode of operation utilizing the same off-chip inductor. To make sure the asynchronous path supplies the required control power with intermediate boosted voltage, $V_{INT}$ until $V_{OUT}$ reaches a stable voltage, the voltage regulation loop is activated right after the one-shot cold-start and starts monitoring $V_{INT}$.

In some embodiments, a capacitor (SC) voltage divider 2701 is used to sense the changes in $V_{INT}$ without consuming static power. The $V_{INT}/2$ is compared against two on-chip leakage based voltage references, $V_{REF,LO}$ and $V_{REF,HI}$. The reference voltages are generated using any suitable ultra-low power reference generators which reach the steady state at a decently fast time. The output of comparators 2704 and 2705 are fed to a RS latch 2705 to generate a signal EN that indicates whether the control circuits are running out of power as $V_{INT}$ falls below $V_{REF,LO}$.

During the start-up, this information is used to control the dead-time, ∆t between $CK_{LS}$ and $CK_{HS}$. The ∆t forces the inductor current to flow through the diode, $M_D$ for a short time and refills $V_{INT}$ as illustrated in timing diagram 2800 of FIG. 28 before the current is steered back to $V_{OUT}$. This process continues until $V_{OUT}$ crosses, for example, 1 V and get shorted with $V_{INT}$. The same voltage regulation loop now senses $V_{OUT}$ and uses its decision to enable or disable the whole converter by gating the switching clock resulting in an energy-efficient hysteretic mode of regulation. The $V_{OUT}$ ripple depends upon the separation between the two thresholds, $V_{REF,LO}$ and $V_{REF,HI}$ and the comparator offset.

A single inductor boost converter of various embodiments is capable of achieving high efficiency at small input voltages from a TEG attached to human body. Enhanced efficiency of the converter while ensuring maximum power transfer at the input enables the complete harvester to achieve high end-to-end efficiency across the input voltage range, thanks to the LO-MPPT scheme using variable switching clock with adaptive on-time and frequency. This not only helps to achieve the peak efficiency at lower input voltage but also to sustain operation at a voltage as low as, for example, 7 mV from TEG 101 which corresponds to a ∆T of 0.2° C. In some embodiments, one-shot integrated cold-start 202 with the aid of dual-path converter architecture (e.g., architecture 200) achieves low voltage cold-start and makes the harvester completely autonomous by removing the need of battery at any stage of operation. Cold-start of the proposed harvester with a minimum TEG voltage of, for example, 50 mV is the lowest startup-voltage reported to date with single inductor architecture. All these features together make the implemented TEG-based harvester ideal for powering energy-efficient wearables utilizing human body heat.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

The following examples are provided with reference to various embodiments. These examples can be combine din any suitable manner.

Example 1

A battery-less apparatus comprising: a transistor coupled to a first node which is coupled to first power supply rail, wherein the first power supply rail is to be coupled to a first terminal of an inductor; a second node to be coupled to a second terminal of the inductor, the second node coupled to a second power supply rail; a circuitry coupled to the second power supply rail, wherein the circuitry is to generate a pulse, wherein the transistor has a gate terminal that receives to the pulse, wherein the transistor is to turn on for a duration of the pulse; and a DC-DC converter coupled to the transistor, wherein the DC-DC converter is to generate an output power supply in response to the generation of the pulse by the circuitry.

Example 2

The battery-less apparatus of example 1, wherein the circuitry comprises an oscillator coupled to the second power supply rail, wherein the oscillator is to generate a clock.

Example 3

The apparatus of example 2, wherein the circuitry comprises a charge-pump coupled to the oscillator, wherein the charge pump includes a positive charge pump and a negative charge pump, wherein the positive charge pump and the negative charge pump are cross-coupled.

Example 4

The battery-less apparatus of example 3, wherein the charge pump is to boost a sub-100 mV input to an output voltage in a range of 800 mV to 1.8 V.

Example 5

The battery-less apparatus of example 2, wherein the oscillator comprises a plurality of delay stages, wherein an individual delay stage comprises three stacked inverters, wherein an input of each inverter is coupled to the second power supply rail.

Example 6

The battery-less apparatus of example 2, wherein the circuitry comprises a strobe generation circuit that receives an output of the charge pump and generates the pulse for the transistor when the output of the charge pump crosses a threshold.

Example 7a

The battery-less apparatus of claim 6, wherein the strobe generation circuit generates a falling edge of the pulse to create sufficient inductive overshoot to turn on a diode of the DC-DC converter.

Example 7b

The battery-less apparatus of claim 6, wherein the strobe generation circuit generates a falling edge of the pulse to create sufficient voltage rise from an inductor to turn on a diode of the DC-DC converter.

Example 8

The battery-less apparatus of example 1, wherein the second node has a voltage level in a range of 50 mV.

Example 9

The battery-less apparatus of example 1, wherein the inductor is coupled to a thermoelectric generator.

Example 10

The battery-less apparatus of example 1, wherein the first node and the second node have an impedance matched to an impedance of a thermoelectric generator.

Example 11

The battery-less apparatus of example 1, wherein the inductor is used for startup of the DC-DC converter and for boost conversion by the DC-DC converter.

Example 12

The battery-less apparatus of example 1, wherein the transistor is a first transistor, and wherein the DC-DC converter comprises: a diode coupled to the first power supply rail, a third power supply rail, and the first transistor; a second transistor coupled to the diode, the first power supply rail and the first transistor; and a ring oscillator coupled to the diode and a third power supply rail, wherein the ring oscillator is to generate a clock which is received at a gate of the second transistor.

Example 13

The battery-less apparatus of example 12, wherein the DC-DC converter comprises: a capacitor coupled to the third power supply rail; a voltage detector coupled to the third power supply rail; and a switch coupled to the third power supply rail and a fourth power supply rail, wherein the fourth power supply rail is to provide the output power supply, wherein the switch is controllable by the voltage detector.

Example 14

The battery-less apparatus of example 13, wherein the voltage detector has built-in hysteresis.

Example 15

A battery-less apparatus comprising: a first node which is coupled to first power supply rail, wherein the first power supply rail is to be coupled to a first terminal of an inductor; a second node to be coupled to a second terminal of the inductor, the second node coupled to a second power supply rail; and a DC-DC converter coupled to the first and second power supply rails, wherein the DC-DC converter comprises: an asynchronous circuitry to receive a power supply on the second power supply rail and to generate a pulse to turn on a first transistor for a duration of the pulse, wherein the transistor is coupled to the first power supply rail; and a synchronous circuitry to start operation in response to a falling edge of the pulse, wherein the synchronous circuitry includes a second transistor which is switchably coupled to the second power supply rail and a third power supply rail via at least two switches, wherein the second transistor is controllable by a clock.

Example 16

The battery-less apparatus of example 15, wherein the asynchronous circuitry comprises an oscillator coupled to the second power supply rail, wherein the oscillator is to generate a clock.

Example 17

The batter-less apparatus of example 16, wherein the asynchronous circuitry comprises a charge-pump coupled to the oscillator, wherein the oscillator comprises a plurality of delay stages, wherein an individual delay stage comprises three stacked inverters, wherein an input of each inverter is coupled to the second power supply rail.

Example 18

The battery-less apparatus of example 16, wherein the asynchronous circuitry comprises a strobe generation circuit that receives an output of the charge pump and generates the pulse for the transistor when the output of the charge pump crosses a threshold, wherein the strobe generation circuit generates a falling edge of the pulse to create sufficiency inductive overshoot to turn on a diode of the DC-DC converter.

Example 19

A battery-less method to cold-start a DC-DC converter, the DC-DC converter comprising: generating a pulse to turn on a transistor for a short duration such that a falling edge of the pulse is to create sufficient inductive overshoot to turn on a diode of the DC-DC converter; and boosting a power supply from a thermoelectric generator in response to the falling edge of the pulse.

Example 20

The method of example 19, wherein generating the pulse comprises: generating a clock using the power supply from the thermoelectric generator; pumping an internal supply by applying the clock; detecting whether a voltage of the internal supply crosses a threshold, and generating the pulse when it is determined that the voltage of the internal supply crosses the threshold.

Example 21

An apparatus comprising: a first inverter coupled to a first reference node and a second reference node, the first inverter to receive an input and to generate an output which is an inverse of the input; a second inverter coupled to a first supply node and a second supply node, wherein the second inverter is to receive the input and generate an output which is coupled to the first reference node; and a third inverter coupled to the first supply node and the second supply node, wherein the third inverter is to receive the input and generate an output which is coupled to the second reference node.

Example 22

The apparatus of example 21, wherein the first inverter comprises: a p-type transistor having a gate terminal coupled to the input, a source terminal coupled to the first reference node, and a drain terminal coupled to the output of the first inverter; and an n-type transistor having a gate terminal coupled to the input, a source terminal coupled to the second reference node, and a drain terminal coupled to the output of the first inverter.

Example 23

The apparatus of example 22, wherein the second inverter comprises: a p-type transistor having a gate terminal coupled to the input, a source terminal coupled to the first supply node, and a drain terminal coupled to the first reference node; and an n-type transistor having a gate terminal coupled to the input, a source terminal coupled to the second supply node, and a drain terminal coupled to the first reference node.

Example 24

The apparatus of example 23, wherein the third inverter comprises: a p-type transistor having a gate terminal coupled to the input, a source terminal coupled to the first supply node, and a drain terminal coupled to the second reference node; and an n-type transistor having a gate terminal coupled to the input, a source terminal coupled to the second supply node, and a drain terminal coupled to the second reference node.

Example 25

The apparatus of example 24, wherein widths of the p-type transistor of the second inverter and the n-type transistor of the third inverter are substantially three times widths of the p-type and n-type transistors of the first inverter, respectively.

Example 26

The apparatus of example 24, wherein widths of the n-type transistor of the second inverter and the p-type transistor of the third inverter are substantially same as widths of the n-type and p-type transistors of the first inverter, respectively.

Example 27

The apparatus of example 22, wherein the third inverter is to charge the second reference node to a voltage level of the first supply node when the input transitions from high to low such that a drain-to-source voltage and a gate-to-source voltage of the n-type transistor of the first inverter reduces to suppress leakage in the apparatus.

Example 28

The apparatus of example 22, wherein the third inverter is to discharge the first reference node to a voltage level of the second supply node when the input transitions from low to high such that a source-to-drain voltage and a source-to-gate voltage of the p-type transistor of the first inverter reduces to suppress leakage in the apparatus.

Example 29

The apparatus of example 21, wherein the first supply node is a power supply node while the second supply node is a ground supply node.

Example 30

The apparatus of example 21, wherein the input is a sub-100 mV voltage.

Example 31

The apparatus of example 21, wherein the input is less than 50 mV voltage.

Example 32

An apparatus comprising: a plurality of delay cells coupled in series and a ring formation such that a first delay cell of the plurality has an input coupled to an output of a last delay cell of the plurality, wherein an individual delay cell of the plurality includes: a first inverter to receive an input from a delay cell and to generate an output for a subsequent delay cell; a second inverter coupled to the first inverter; and a third inverter coupled to the first inverter, wherein outputs of the second and third inverters are coupled to source terminals of a p-type transistor and an n-type transistor of the first inverter, respectively.

Example 33

The apparatus of example 32, wherein widths of a p-type transistor of the second inverter and an n-type transistor of the third inverter are substantially three times widths of the p-type and n-type transistors of the first inverter, respectively.

Example 34

The apparatus of example 32, wherein widths of an n-type transistor of the second inverter and a p-type transistor of the third inverter are substantially same as widths of the n-type and p-type transistors of the first inverter, respectively.

Example 35

The apparatus of example 32, wherein the input is a sub-100 mV voltage.

Example 36

The apparatus of example 32, wherein the input is less than 50 mV voltage.

Example 37

An apparatus comprising: a first inverter coupled to a first input and to generate a first output; a second inverter coupled to a second input and to generate a second output; a third inverter coupled to the first input and to generate a third output; a first p-type transistor coupled to the first input and the first output; a second p-type transistor coupled to the second input and the second output; a first n-type transistor coupled to the first and second p-type transistors, and coupled to the second input; and a second n-type transistor coupled in series with the first n-type transistor, wherein the second n-type transistor is coupled to the first input and the third output.

Example 38

The apparatus of example 37 comprises a third p-type transistor having a gate terminal coupled to a gate terminal of the first n-type transistor and a drain terminal couple to the first and second n-type transistors.

Example 39

The apparatus of example 37 comprises a third n-type transistor coupled to the third inverter, wherein a gate terminal of the third n-type transistor is coupled to the second input.

Example 40

The apparatus of example 37, wherein drain terminals of the first and second p-type transistors and the first n-type transistor provide an output, wherein the output is a NAND logic function of the first and second inputs.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

We claim:
1. A battery-less apparatus comprising:
   a first transistor coupled to a first node which is coupled to first power supply rail, wherein the first power supply rail is to be coupled to a first terminal of an inductor;
   a second node to be coupled to a second terminal of the inductor, the second node coupled to a second power supply rail;
   a circuitry coupled to the second power supply rail, wherein the circuitry is to generate a pulse, wherein the first transistor has a gate terminal that receives the pulse, wherein the first transistor is to turn on for a duration of the pulse;

a DC-DC converter coupled to the first transistor, wherein the DC-DC converter is to generate an output power supply in response to the generation of the pulse by the circuitry;

a diode coupled to the first power supply rail, a third power supply rail, and the first transistor;

a second transistor coupled to the diode, the first power supply rail and the first transistor; and a ring oscillator coupled to the diode and the third power supply rail, wherein the ring oscillator is to generate a clock which is received at a gate of the second transistor, wherein the DC-DC converter comprises a voltage detector coupled to the third power supply rail.

2. The battery-less apparatus of claim 1, wherein the DC-DC converter is to receive an input that has a voltage level in a range of 50 mV.

3. The battery-less apparatus of claim 1, wherein the inductor is coupled to a thermoelectric generator.

4. The battery-less apparatus of claim 1, wherein the first node and the second node have an impedance matched to an impedance of a thermoelectric generator.

5. The battery-less apparatus of claim 1, wherein the inductor is used for startup of the DC-DC converter and for boost conversion by the DC-DC converter.

6. The battery-less apparatus of claim 1, wherein the DC-DC converter comprises:

a capacitor coupled to the third power supply rail; and a switch coupled to the third power supply rail and a fourth power supply rail, wherein the fourth power supply rail is to provide the output power supply, wherein the switch is controllable by the voltage detector.

7. The battery-less apparatus of claim 1, wherein the voltage detector has built-in hysteresis.

8. The battery-less apparatus of claim 1, wherein the circuitry comprises an oscillator coupled to the second power supply rail, wherein the oscillator is to generate a second clock.

9. The battery-less apparatus of claim 8, wherein the oscillator comprises a plurality of delay stages, wherein an individual delay stage comprises three stacked inverters, wherein an input of each inverter is coupled to the second power supply rail.

10. The battery-less apparatus of claim 8, wherein the circuitry comprises a charge-pump coupled to the oscillator, wherein the charge-pump includes a positive charge-pump and a negative charge-pump, wherein the positive charge-pump and the negative charge-pump are cross-coupled, wherein the positive charge-pump and the negative charge-pump are configured to operate mutually.

11. The battery-less apparatus of claim 10, wherein the charge-pump is to boost a sub-100 mV input to an output voltage in a range of 800 mV to 1.8 V.

12. The battery-less apparatus of claim 10, wherein the circuitry comprises a strobe generation circuit that receives an output of the charge-pump and generates the pulse for the first transistor when the output of the charge-pump crosses a threshold.

13. The battery-less apparatus of claim 12, wherein the strobe generation circuit generates a falling edge of the pulse to create sufficient inductive overshoot to turn on the diode.

14. The battery-less apparatus of claim 12, wherein the strobe generation circuit generates a falling edge of the pulse to create sufficient voltage rise from the inductor to turn on the diode.

15. A battery-less apparatus comprising:

a first node which is coupled to first power supply rail, wherein the first power supply rail is to be coupled to a first terminal of an inductor;

a second node to be coupled to a second terminal of the inductor, the second node coupled to a second power supply rail; and a DC-DC converter coupled to the first and second power supply rails, wherein the DC-DC converter comprises:

an asynchronous circuitry to receive a power supply on the second power supply rail and to generate a pulse to turn on a first transistor for a duration of the pulse, wherein the first transistor is coupled to the first power supply rail; and a synchronous circuitry to start operation in response to a falling edge of the pulse, wherein the synchronous circuitry includes a second transistor which is switchably coupled to the second power supply rail and a third power supply rail via at least two switches, wherein the second transistor is controllable by a clock.

16. The battery-less apparatus of claim 15, wherein the asynchronous circuitry comprises an oscillator coupled to the second power supply rail, wherein the oscillator is to generate a second clock.

17. The battery-less apparatus of claim 16, wherein the asynchronous circuitry comprises a charge-pump coupled to the oscillator, wherein the oscillator comprises a plurality of delay stages, wherein an individual delay stage comprises three stacked inverters, and wherein an input of each inverter is coupled to the second power supply rail.

18. The battery-less apparatus of claim 17, wherein the asynchronous circuitry comprises a strobe generation circuit that receives an output of the charge-pump and generates the pulse for the first transistor when the output of the charge-pump crosses a threshold, and wherein the strobe generation circuit generates a falling edge of the pulse to create sufficient inductive overshoot to turn on a diode of the DC-DC converter.

19. The battery-less apparatus of claim 15, wherein the DC-DC converter comprises a voltage detector coupled to the third power supply rail.

* * * * *